(12) United States Patent
Bruneel et al.

(10) Patent No.: US 12,032,878 B2
(45) Date of Patent: Jul. 9, 2024

(54) METHOD FOR DETERMINING LASER MACHINING PARAMETERS AND LASER MACHINING DEVICE USING THIS METHOD

(71) Applicant: LASER ENGINEERING APPLICATIONS, Angleur (BE)

(72) Inventors: David Bruneel, Sougne-Remouchamps (BE); Liliana Cangueiro, Leuven (BE); Paul-Etienne Martin, Bordeaux (FR); José-Antonio Ramos De Campos, Angleur (BE); Axel Kupisiewicz, Neupré (BE)

(73) Assignee: LASER ENGINEERING APPLICATIONS, Angleur (BE)

( * ) Notice: Subject to any disclaimer, the term of this patent is extended or adjusted under 35 U.S.C. 154(b) by 1022 days.

(21) Appl. No.: 16/964,147

(22) PCT Filed: Jan. 25, 2019

(86) PCT No.: PCT/EP2019/051914
§ 371 (c)(1),
(2) Date: Jul. 22, 2020

(87) PCT Pub. No.: WO2019/145513
PCT Pub. Date: Aug. 1, 2019

(65) Prior Publication Data
US 2021/0031304 A1    Feb. 4, 2021

(30) Foreign Application Priority Data
Jan. 26, 2018   (BE) .................................. 2018/5046

(51) Int. Cl.
*G06F 30/20*    (2020.01)
*B23K 26/06*    (2014.01)
(Continued)

(52) U.S. Cl.
CPC .......... *G06F 30/20* (2020.01); *B23K 26/0624* (2015.10); *B23K 26/0626* (2013.01);
(Continued)

(58) Field of Classification Search
CPC ............ B23K 26/0624; B23K 26/0626; B23K 26/082; B23K 26/40; B23K 26/70;
(Continued)

(56) References Cited

U.S. PATENT DOCUMENTS 10,730,783 B2    8/2020  Akarapu et al.
2004/0019403 A1  1/2004  Liu et al.
(Continued)

FOREIGN PATENT DOCUMENTS

JP    2013180295 A    9/2013
JP      5627760 B1    6/2015
(Continued)

OTHER PUBLICATIONS

Machine Translation of Takigawa (JP 2017-164801) performed Sep. 8, 2023 (Year: 2017).*
(Continued)

*Primary Examiner* — Brian W Jennison
(74) *Attorney, Agent, or Firm* — CHRISTENSEN O'CONNOR JOHNSON KINDNESS PLLC

(57) ABSTRACT

Method for determining laser machining parameters for the machining of a material using a laser machining system comprises the following steps: a) providing said central unit with a learning machining function capable of learning on the basis of said plurality of machining data samples, said learning machining function comprising an algorithm capable of defining the following laser machining parameters for said machining result sought and for said machining system: a polarization, an pulse energy $E_p$, a diameter at the focal point w, a Gaussian order p, a pulse repetition rate (Continued)

PRR of pulses n, a wavelength; b) making said learning machining function to learn so as to said laser machining system can machine said material to be machined according to the machining result sought.

16 Claims, 29 Drawing Sheets

(51) Int. Cl.
| | |
|---|---|
| *B23K 26/0622* | (2014.01) |
| *B23K 26/082* | (2014.01) |
| *B23K 26/359* | (2014.01) |
| *B23K 26/382* | (2014.01) |
| *B23K 26/40* | (2014.01) |
| *B23K 26/70* | (2014.01) |
| *G05B 19/4155* | (2006.01) |

(52) U.S. Cl.
CPC .......... *B23K 26/082* (2015.10); *B23K 26/359* (2015.10); *B23K 26/382* (2015.10); *B23K 26/40* (2013.01); *B23K 26/70* (2015.10); *B23K 26/702* (2015.10); *G05B 19/4155* (2013.01); *G05B 2219/45165* (2013.01)

(58) Field of Classification Search
CPC ................ B23K 26/702; B23K 26/382; G05B 2219/45; G05B 19/4155; G05B 13/027; G09B 19/24; G06F 30/00; G06F 30/20; G06N 3/088; G06N 3/086
See application file for complete search history.

(56) References Cited

U.S. PATENT DOCUMENTS

| | | |
|---|---|---|
| 2012/0290276 A1 | 11/2012 | Schulz et al. |
| 2016/0078156 A1 | 3/2016 | Wiening et al. |
| 2016/0325376 A1* | 11/2016 | Nakagawa ......... B23K 26/0876 |
| 2018/0150058 A1 | 5/2018 | Shapiro |
| 2020/0398381 A1 | 12/2020 | Richter et al. |

FOREIGN PATENT DOCUMENTS

| | | |
|---|---|---|
| JP | 2016059932 A | 4/2016 |
| JP | 2016136167 A | 7/2016 |
| JP | 2017164801 A | 9/2017 |
| WO | 2011/083087 A1 | 7/2011 |
| WO | 2015/113302 A1 | 8/2015 |

OTHER PUBLICATIONS

Machine Translation of Nakai (JP 2016-164801) performed Sep. 8, 2023 (Year: 2016).*
Machine Translation of Hara (JP 2016-059932) performed Sep. 8, 2023 (Year: 2016).*
Office Action mailed Feb. 2, 2023, issued in U.S. Appl. No. 16/964,161, filed Jul. 22, 2020, 14 pages.
International Search Report mailed Dec. 9, 2019, issued in corresponding International Application No. PCT/EP2019/051914, filed Jan. 25, 2019, 4 pages.
Office Action mailed Jan. 10, 2023, issued in corresponding Japanese Patent Application No. 2020-560597, filed Jan. 25, 2019, 13 pages.
Office Action mailed Sep. 13, 2023, issued in U.S. Appl. No. 16/964,161, filed Jul. 22, 2020, 12 pages.

* cited by examiner

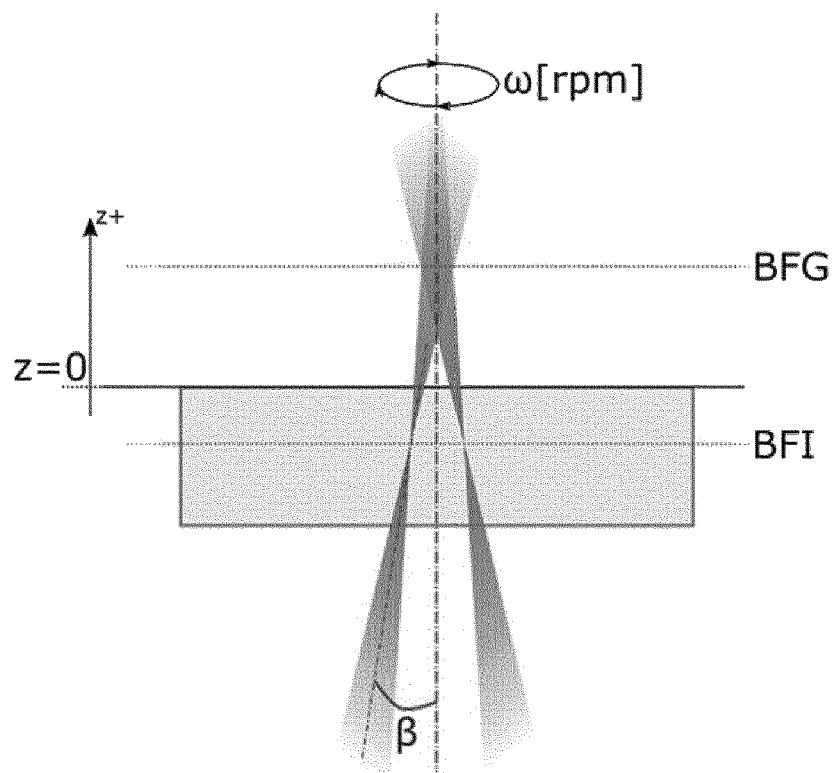
*Fig. 20a*
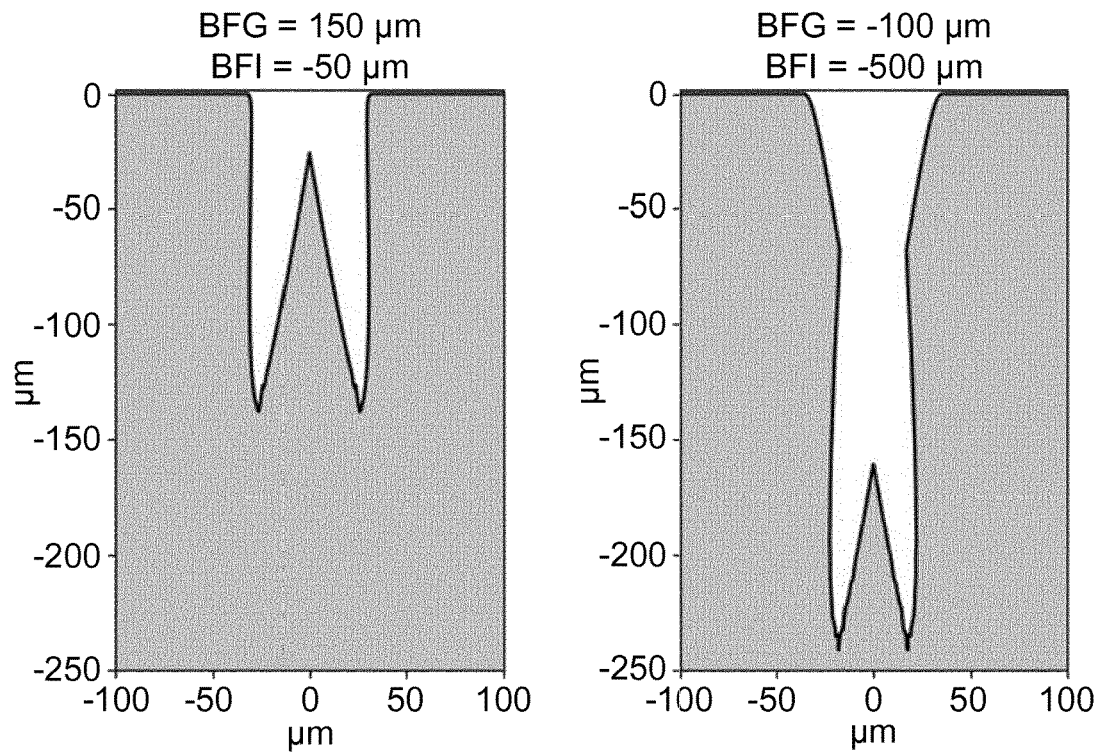
*Fig. 20b*  *Fig. 20c*

METHOD FOR DETERMINING LASER MACHINING PARAMETERS AND LASER MACHINING DEVICE USING THIS METHOD

TECHNICAL FIELD

According to a first aspect, the invention refers to a method for determining laser machining parameters for the laser machining of a material. According to a second aspect, the invention refers to a laser machining device.

BACKGROUND

Laser beams are sometimes used for machining workpieces. It is indeed possible to melt, evaporate or sublimate part of a material exposed to a laser beam. The machining of parts with laser beams enables the production of cuts, holes, grooves, surface texturing . . . with a very high degree of efficiency.

Laser machining devices increasingly use laser beam pulses with a duration of less than one ns and a high energy per pulse, in the order of $J/cm^2$. It is necessary to define, to parameterize the laser machining device in order to obtain a target machining you wish to carry out. It is then necessary to define the laser machining parameters for any newly defined target machining as well as for any new material.

In order to ensure that the machining process is as accurate as possible, it is known to model the interaction parameters between the laser beam and the material to be machined. However, such modeling generally requires the use of at least one model that generally has a linear response to input parameters. The problem with this approach is that the range over which a model presents a reliable response may not cover an adequate range to enable a laser machining device to be used at full capacity or in any case to enable the machining result sought in the shortest possible time and with good machining quality.

WO 2015/113302 A1 provides a method for determining laser machining parameters based on experimental machining results. The disadvantage of this method is that it uses an extrapolation of experimental machining results so that the user can deduce supposedly optimal laser machining parameters, the assessment of the suitability of the parameters being left to the user. By its nature, such extrapolation can lead to imprecise results. Another disadvantage is that it does not allow laser machining parameters to be determined over a wide data range, but only locally, around the experimental machining results.

The technical problem to be solved is therefore to have a method for defining laser machining parameters to obtain machining that is as close as possible to a target or desired machining, especially for different machining capabilities of a laser machining device. In addition, it would be useful to be able to determine laser machining parameters for a wide variety of laser machining systems.

SUMMARY OF THE INVENTION

According to a first aspect, one of the purposes of the present invention is to provide a method for determining laser machining parameters in order to obtain a specific machining result. One of the purposes of the present invention is also to provide a method for determining machining parameters that does not require extensive and costly prior testing.

To this end, the inventors propose a method for determining laser machining parameters for the machining of a material with a laser machining system and comprising the following steps:
a) providing a learning database comprising a plurality of machining data samples comprising machining results obtained as a function of the laser machining parameters used;
b) providing a central unit comprising:
    machine learning means;
    means for communicating with said learning database;
c) defining for said central unit a machining result sought of a material to be machined;
d) providing said central unit with a learning machining function capable of learning on the basis of said plurality of machining data samples, said learning machining function comprising an algorithm capable of defining for said machining result sought and for said machining system the following laser machining parameters:
    an information regarding a polarization of said machining laser beam,
    a pulse energy of said machining laser beam $E_p$,
    a diameter of said machining laser beam at the focal point w,
    an order of the Gaussian p of said machining laser beam between 1 and 20,
    a pulse repetition rate PRR of pulses n of the machining laser beam,
    a wavelength of the machining laser beam;
e) making said learning machining function with said central unit to learn on the basis of said plurality of machining data samples, so that said laser machining system can machine said material to be machined according to the machining result sought, by providing it with the machining parameters determined by said learning machining function when learning it.

The method of the invention allows the determination of machining parameters and preferably optimal machining parameters for machining a workpiece according to a target machining as accurately as possible. Such a method guarantees good machining quality without the need for numerous and costly machining parameter adjustments. Indeed the method proposed by the invention includes a machine learning step which allows, on the basis of previous experimental results, the determination of machining parameters for the machining of a result to be achieved. The use of a machine learning step is particularly advantageous because a learning machining function can be learned using pairs of machining data comprising machining results obtained according to the laser machining parameters used. The pairs of machining data can be obtained from machining that have been produced under different experimental conditions. In particular, an advantage of another embodiment of the invention is to enable supervised machine learning on the basis of the physical parameters of interaction between the laser beam and the material to be machined during the machining, during previous machining experiments or from a database including information on a laser source or a material to be machined.

The present invention enables to provide a method for defining laser machining parameters in an automated manner by using a learning database including information regarding previous machinings. The present invention also provides a central unit capable of driving a learning function on the basis of information regarding previous machining so as to determine optimum machining parameters from information in relation to the material, the machining parameters and the machining system previously recorded in the learning database. Another aim of the present invention is to propose a comprehensive approach to laser-material interaction so as to allow better learning of the learning machining function in order to obtain a machining as close as possible to a machining result sought.

The method of the invention enables to predict the laser machining parameters, for example: laser conditions: energy, frequency, speed, beam inclination, number of passes, hatch pitch, adjustment of spot size, . . . ; and enables to apply them to a material to be machined by means of a laser machining device, in order to obtain a target type of machining (engraving, cutting, drilling, welding).

Preferably, information about the material to be machined is information about the interaction of the laser machining beam with the material to be machined. Preferably, the information regarding the polarization of said machining laser beam is selected from a choice of vertical or horizontal P/S polarization. Preferably, the pulse energy of the machining laser beam $E_p$ is expressed in µJ. Preferably, the diameter of the machining laser beam at a focal point w corresponds to the waist size w. Preferably, the order of a Gaussian of said machining laser beam is between 1 and 10.

According to a particular embodiment of the invention, the inventors have observed in a surprising way that the control unit's consideration of the four material parameters related to laser machining (delta, threshold fluence, incubation coefficient, complex refractive index) enables to obtain machining results that are very close to the machining result sought without having to resort to empirical experiments and for extended ranges of use of a laser machining device.

The target criteria for the machining result sought are entered into the central unit, and from at least one learning database and the learning function, the optimum laser parameters for performing the target machining on the target material are obtained. Throughout the document, the learning function can generate a learned function that is ultimately the result of the learning of the function by the learning algorithm. Thus the learning function preferably includes the optimum machining parameters. The central unit is a learning central unit when it is set up to perform the learning function.

The learning of the learning function for a given material, allows to generate a learned function. A learned function is therefore, according to an embodiment of the invention, the result of the learning of the learning function. For example, a learned function is recorded in a learned function database. A learned function benefits from an algorithm that has evolved according to the learning it has received, for example, it is the learning algorithm that has evolved. From a learned function, it is possible to generate optimal machining parameters for a machining result sought. In another embodiment, it is possible to generate optimal machining parameters after the learning function has been learned and to save the learned function.

Preferably, the plurality of samples of the learning database at least partly comprises information about the material being machined, and this information includes at least one of the following information:
  a delta δ related to a penetration depth of the machining laser beam into the material,
  a threshold fluence $F_{th}$ related to a minimum energy density of the laser beam allowing a machining,
  an incubation coefficient S, between 0 and 1, related to the dependence of the threshold fluence based on a number of pulses of the laser beam at the same point,
  a complex refractive index n+ik.

Preferably, the laser machining system is capable of emitting a laser machining beam moving in a direction x and, said algorithm of said learning function of step d) is capable of further defining the following laser machining parameters:
  a distance of the focus point of the laser machining beam from the surface of the material to be machined,
  a speed (v) of movement of the laser machining beam relative to said material to be machined,
  an angle of incidence of the machining laser beam with respect to said surface of the material to be machined,
  a number of lines to be machined,
  a distance between said lines previously defined,
  a number of passes of the machining laser beam on each line to be machined.

For example, the distance of the focus point of the laser machining beam from the surface of the material to be machined is 0 when the focus point is on the surface. Preferably, the speed of movement is defined in the direction x. For example, the angle of incidence of the machining laser beam with respect to the surface of the material to be machined is 0° when the laser beam makes an angle of 90° with the surface of the substrate. For example, a number of lines to be machined is minimum 1 and can tend towards infinity. Preferably, the number of lines to be machined enables to define a trench width in relation to the distance parameter between the lines. Preferably, the distance between said lines or pitch is a distance from the center of one line to the center of another adjacent line. For example, the number of passes of the machining laser beam on each line to be machined is a number of "layers". A number of passes of the laser beam equal to 10 means that the laser beam passes 10 times along the same line.

Preferably:
  the laser machining system is a system capable of emitting a laser machining beam in rotation about an axis of rotation, and in that,
  said algorithm of said learning function of step d) is capable of further defining the following laser machining parameters:
  a rotational speed of said laser beam about said axis of rotation,
  a distance BFG from a surface of said material to be machined for which the rotating laser beam describes a fixed spot for all rotating laser machining beam positions,
  a distance BFI from a surface of said material to be machined at which the rotating laser beam is focused,
  an angle of incidence β of the rotating machining laser beam for all positions of the rotating laser beam in relation to the normal to the surface of the material,
  an activation time of the rotating machining laser beam.

Preferably, the rotational speed of the laser machining beam is the rotational speed of an optical element allowing the rotation of the laser machining beam. For example, such an optical element is a mirror, a prism, etc. The distance BFG from a surface of said material to be machined for which the rotating laser beam describes a fixed spot for all positions of the rotating laser machining beam, i.e. a point around which the laser machining beam rotates. Preferably a distance BFI from a surface of said material to be machined at which the rotating laser beam is focused, e.g. a distance BFI equal to 0 means that the laser beam is focused on the surface of the material for all positions of the rotating laser beam. Preferably, the distance BFI from a flat surface of a material to be machined is a plane. Preferably, an angle of incidence β of the rotating machining laser beam for all positions of the rotating laser beam relative to the normal to the material surface, 0° relative to the surface means that the rotating laser beam describes an angle of 90° from the surface or 0° from the normal to the surface of the material. Preferably, an activation time of the rotating machining laser beam depends on the thickness and type of material to be machined and other laser parameters. This embodiment is particularly advantageous because it allows to simulate with precision the laser parameters which will enable to have straight or negative flanks (the orientation of the flanks in general).

Preferably, the machining laser beam is a machining laser beam rotating about an axis of rotation and a point of rotation located at said distance BFG from said surface of said material to be machined.

Preferably, the algorithm comprises a learning step based on a precession radius $r_p$ of a machining of said material by said rotating machining laser beam comprising the following formula:

$$r_P = \left(\frac{BFG}{\cos\beta} - z\right)\tan\beta.$$

Preferably, two successive pulses n of the rotating machining beam are separated by a distance dx, preferably along a circle of radius $r_p$.

Preferably, the algorithm comprises a learning step based on an ablated crater radius $r_c$ for a pulse of the machining laser beam comprising the following formula:

$$r_C = w_0 \sqrt{\ln\left(\frac{F_0}{F_{th}}\right)}.$$

A machining result sought is preferably a two-dimensionally defined machining result sought profile according to:
- an axis y representing a direction substantially parallel to the surface of the material to be machined, and,
- an axis z representing a direction substantially perpendicular to the surface of the material to be machined, the axis z corresponding to an ablation depth $z_n$ in relation to the surface of the material.

Preferably, the algorithm comprises a learning step based on an ablation depth $z_n$ comprising the following formula:

$$z_n = -\delta\left[\ln\left(\frac{F_0}{F_{th}(n+NR/2)}\right) - 2\frac{n^2 dx^2}{w^2} - 2\left(\frac{(y+y_c)^2}{w^2}\right)^p\right].$$

Preferably, the delta δ is a constant parameter. The use of a constant parameter for delta δ is particularly advantageous because it allows to have a constant delta parameter δ for each material, regardless of the machining conditions applied. The inventors found that the use of a constant delta δ was contrary to the teachings of a large number of scientific publications. In particular, it has often been accepted that the delta δ of a material should vary as a function of the number of pulses of a laser beam, whereas the delta δ is an intrinsic property of the material and should not be considered as a fitting variable of a model.

The method of the invention enables, when the machining of a new material is decided upon, to enrich a material database on the basis of the parameters, specific to the machined material and the results observed after they have been characterized and analyzed by the detection means and the central unit according to the invention.

Preferably, the database of the invention allows the storage of at least one type of information as defined below: material characteristics, response of a material to one or more laser pulses, learning function, learned function. For example, a database includes material characteristics. For example, a database of learned functions includes learning functions that have been modified by the learning central unit when determining laser machining parameters.

Preferably, the method of the invention enables to realize and or applies to realize simulations to observe a machining that can be obtained with parameters defined by a user. This is particularly used to check the feasibility of a machining or to define machining sequences.

Preferably, the central unit is configured to execute a computer program for determining the laser machining parameters.

Preferably the method of the invention includes a step consisting in providing, to the central unit, a computer program for executing modeling means and/or machine learning means. Preferably, the modeling and/or machine learning means include a model based on algorithms that allow physical parameters to be linked together. A computer program is, for example, a software. Preferably, the modeling and/or machine learning means are used to generate data that can be stored in the database.

Preferably, the central unit configured to execute said computer program is accessible on dematerialized storage and computing means, e.g. a cloud, in particular a platform as a service and more particularly a software as a service.

The software as a service provides that this computer program is made available to the user. The computer program can be manipulated using a web browser or installed on a leasehold way on a central unit. The user does not have to worry about making updates, adding security patches and ensuring availability of the service.

For example, the method of the invention is an internet platform to help a user wishing to perform machining by means of a laser machining device to choose the right machining parameters. Preferably the method of the invention is a decision support tool. Preferably, the machining parameters proposed by the central unit are directly transmitted to the control unit.

Preferably, said central unit includes modelling means and machine learning means for determining said information about the material to be machined, the information of the material to be machined being stored in the database as physical material parameters or as a function learned by the machine learning means.

This preferred embodiment of the invention allows the machine learning of the model for determining the machining parameters. On the basis of the observations, the model can be updated to allow the determination of the machining parameters on the basis of the input parameters (related to the material, the laser source, the machining device . . . ). When the difference is such that it is a learning, then the model is updated, on the other hand, when the difference is such that it is not a learning, then the model is not updated.

Preferably, the method further comprises the following additional steps:

f) providing a laser machining system comprising:
- said material to be machined;
- said laser machining device comprising:
  - a laser source for emitting an ultra-short laser beam, less than 100 ps, onto said material to be machined;
  - a control unit for controlling the emission of said laser beam from said laser source;
- said central unit to control said control unit;
- said database;
- communication means enabling communication from said central unit to said database;

g) machining said material with said laser source configured with said laser machining parameters determined by said learning machining function in step e).

This embodiment allows the parameters for machining to be learned by means of an analysis device that enables to analyze the interaction of the laser beam with the material to be machined. An analysis of the interactions of the laser beam with the material to be machined enables the laser machining parameters to be adjusted so that a laser machining system using these laser machining parameters can produce a machining that corresponds as close as possible to a target machining.

Preferably the laser machining device and the analysis unit in particular comprises sensors installed at many points on the machine to measure the power in the machine and on the target, a beam analyser, a wavefront analyser (e.g. with a Shack-Hartmann), an $M^2$ measuring instrument, an instrument for calculating beam propagation with prediction of the position and size of the waists (position where the beam width is minimal) along the propagation of the beam, means for corroborating a measurement of the size of the spot and the position on the workpiece (e.g. with a Nanoscan).

Preferably, the machining system includes means for analyzing the result in real time, for example with an OCT (Optical Coherent Tomography), or after machining with an interferometer. The analysis means of the result in real time, for example OCT and or confocal, whose different dimensions measured enable us to deduce the physical characteristics of the materials, and also to check the result obtained and to deduce an error, according to which we can apply a correction of one or more parameters calculated by the model and the functions learned by the machine learning. Preferably the learned functions are learning functions.

The method of the invention presented in this particular embodiment also aims at providing and feeding databases that allow the prediction of optimal laser parameters specific to each material, according to criteria or within error intervals of the desired result. The invention includes a machining laser system which can be equipped with different laser sources (laser system apparatus), a laser beam management system (beam management), a machining unit for moving the laser beam relative to the workpiece to be machined and an analysis unit for obtaining an outcome relative to a machining carried out. An advantage of the invention is that it provides a database for storing material characteristics and learning functions. This database allows material characteristics and learning functions to be available as soon as a new machining is started, in order to benefit from the results of past experiments when they are compatible with the current experiment.

Preferably, said laser machining device further comprises:
- a unit for analysing the state of said material to be machined connected to said learning database, and that the following additional steps are implemented:

h) acquiring with said analysis unit after step g), machining results;

i) transmitting said machining results and said machining parameters used in machining in step g) to said central unit, said central unit being configured to communicate a machining data pair comprising machining results obtained according to the laser machining parameters used;

j) enriching said learning database with said pair of machining data.

This preferred embodiment of the invention enables to carry out machine learning of a statistical model by the laser machining machine, using experimental data resulting from databases of experiments already carried out at the time of training the statistical model or resulting from data acquired during the learning stage.

Machine learning is used to predict optimal parameters for parameter ranges for which current models as described below do not enable to predict such optimal parameters for machining a workpiece. Preferably the optimal parameters are given for a particular material. Preferably, machine learning can be used for all machining parameter ranges, even for ranges that could be covered by conventional models as described below in a non-exhaustive manner. A model is preferably an algorithm taking into account at least one of the equations described in the summary of this patent application.

The machine learning and a physical model to determine physical characteristics and "learned functions" or "learning functions" of machining by machine learning, these physical characteristics and "learned functions" are specific to each material.

The advantage of using a learning function or a learned function is that you can use such a function for each material that may have a different composition or properties. When the material has already been used or when it is already known in the database or in the database of learned functions then the method of the invention does not require the use of a learning function. If a material has already been used but in a different laser parameter range and the learning function needs to be expanded for a parameter range, then the learning function is expanded or redefined to be the range in which the existing learning function can be used. For example, a learning function needs to be completed when using a laser source with a pulse energy that has not been used before.

The method of the invention for defining an machine learning model or a machine learning model comprises the following specific elements:
- data resulting from a learning database or online measurements;
- a target machining result or a predefined machining result for online generation of measurement data for enabling learning;
- a learning algorithm also called a learning model;
- a measure of the performance of the learning algorithm in order to ensure its learning or in any case its maintenance of performance.

Data Used

The data used includes at least one data type with the following characteristic: data describing a target result or a result sought, user parameters, machine-related characteristics, instructions corresponding to predefined tests, parameters related to a material to be machined, parameters related to a material stored in a database, parameters related to a material stored in a database and obtained during a previous machining, algorithms comprising learning functions, optimal machining parameters, data resulting from the means for measuring the laser beam, data resulting from the means for analysing the result. Preferably the data types described above are annotated.

Data Cleaning

A cleaning step of the data collected or present in the database is provided for according to a preferred embodiment of the invention. This step ensures that data collected from a database or measured online are consistent, with no outliers or missing values.

Target and Predefined Results

The specific task to be performed or result to be achieved or target machining result or predefined target result according to the invention corresponds to the problem that a user of the present invention seeks to solve by modelling the phenomenon. The invention enables to consider a plurality of target machining results, each of the target machining results may require the choice of different learning algorithms.

Preferably, the learning central unit of the laser machining system controls all the units included in the system, and in particular at least: the laser source, the beam management device, the beam movement/focusing unit, the analysis unit, a database, a material database, a database of learned functions, an observation unit, a unit for implementing a machine learning, a unit for implementing modelling, a unit comprising predefined test characteristics. A learning central unit is, for example, a computer with several input and output interfaces. The learning unit is preferably connected to a network, e.g. to the Internet, allowing for example the relocation of units enabling to implement machine learning and/or modeling. The advantage that the units for implementing machine learning and/or modelling are not physically present in the laser machining system provides a learning central unit that does not require the hardware resources, e.g. computing power required to implement machine learning and/or modelling. This also enables to have a laser machining system with a learning central unit dedicated to laser machining. Preferably the database(s) are also stored on a central server, preferably the central server being located in the same place as the units to implement machine learning and/or modelling.

Preferably, the result that the invention proposes to predict is a number (value of a parameter), preferably the invention proposes to predict a function for which a regression or a regression technique can be used.

Learning Algorithm

Machine learning according to the invention enables to find and/or improve a model (stochastic or deterministic) of the phenomenon at the origin of the data. Preferably, the phenomenon responsible for the data can be attributed to a multitude of parameters. The machine learning algorithm used by the present invention enables to consider that each observed data item is the expression of a random variable generated by a probability distribution.

The machine learning algorithm of the invention constitutes the method by which the statistical model will be parameterised from data resulting from a database (example data) and/or data collected by an on-line measurement. The invention is not restricted to the choice of a particular type of algorithm. The invention provides for the determination of a type of algorithm according to the type of parameters that one wishes to learn/master and the type of data available. The determination of the type of algorithm according to the invention is a function of the input data of the algorithm and the desired output parameters.

Preferably the learning algorithm used by the method of the invention is a supervised learning algorithm, this supervised learning algorithm is preferably based on at least one of the already developed and known models which are detailed in this patent application.

Examples of machine learning for supervised learning algorithms are, for example, individually or in combination:
the linear regression,
k-nn,
the Support Vector Machine (SVM),
the neural networks,
the random forests.

Machine learning methods according to the invention can be defined according to the following methods:

Unsupervised learning, in unsupervised learning, the learning algorithm only receives raw observations of random variables: $x_1, x_2, x_3, x_4, \ldots$ and the learning algorithm is configured to discover at least one relationship with structural latent variables: $x_i \rightarrow y_i$, where i is a non-zero integer.

Supervised learning, in supervised learning, the learning algorithm receives collected data or annotated example data: $(x_1,y_1),(x_2,y_2),(x_3,y_3), \ldots$, the learning algorithm being configured to predict the parameters obtained at the output of the learning algorithm on the basis of new observations: $x^* \rightarrow y^*$.

Semi-supervised learning, the semi-supervised learning allows to consider, as input of the learning algorithm, some data annotated and others not. This method is particularly advantageous because it allows you to take advantage of both supervised and unsupervised learning methods.

Reinforcement learning, the reinforcement learning allows the learning algorithm to be based on a cycle of experience/reward and improves performance with each iteration of the learning algorithm.

Preferably, the machine learning means comprise a learning model implemented by the central unit and allowing the learning of the material parameters of the material to be machined on the basis of the machining results obtained with said laser machining parameters, the learning of the material parameters being stored in said database as a learned function.

Preferably, the machine/machine learning of the learning machining function is performed for a material to be machined according to a variation of the laser machining parameters from known laser machining parameters, in particular the variation of the machining parameters is indicated by a predefined test.

Performance Measurement

The performance measurement is performed after machine learning based on at least one result of machining. This performance measure enables monitoring the quality of a model for which machine learning is implemented according to the method of the invention and based on a learning algorithm. The performance measurement ensures that the model remains efficient by allowing machine learning for a model and avoiding an under- or over-learning of the learning algorithm. The performance measurement of the model learning algorithm in machine learning is in particular based on performance indicators and for example regression performance indicators.

Regression Performance Indicators

A regression performance indicator allows taking into account a regression function f obtained by minimizing a function R measuring the sum of the square of the errors. This performance indicator, in the case of a classification performance indicator, can be described as follows: the smaller the error function, the better the classification performance indicator. In the case of the regression performance indicator, a determination coefficient with the value $R^2$ is preferably used. $R^2$ can be defined as a normalization of an error function. The coefficient $R^2$ is between 0 and 1; the closer $R^2$ is to 1, the lower the sum of the errors.

Performance Indicators for Unsupervised Learning

Depending on whether the algorithms are unsupervised clustering algorithms and/or outlier detection algorithms, a performance indicator for each type of unsupervised learning must be considered. For clustering algorithms, two performance indicators are possible: the intra-class distance and the inter-class distance. For outlier detection algorithms, the indicators are the outlier density scores (e.g. the Local Outlier Factor LOF score).

Preferably said central unit further comprises
 means for determining a difference obtained between information in relation to the material to be machined according to a variation of the laser machining parameters;
 and in that a machine learning of said learning machining function is performed when the difference determined by said determining means allows an improvement of said learning machining function.

Preferably said learning database further comprises information in relation to said material to be machined from a learning function based on a physical model or resulting from modelling/simulation means in the form of physical characteristics of material.

Preferably, said database includes information in relation to said material of at least one of the following types: learned function, physical characteristics of a material.

Preferably, said physical characteristics of a material include at least one of the following characteristics:
 a delta;
 a threshold fluence;
 a fluence of maximum efficiency.

Preferably, said unit for analyzing the state of said material to be machined is an optical detection unit.

Preferably, the central unit is configured for at least one of the following types of machine learning:
 supervised,
 unsupervised.

The central unit is preferably configured for the supervised machine learning of at least one of the following model types:
 regression,
 classification,
 ranking.

The central unit is preferably configured for unsupervised machine learning of at least one of the following model types:
 clustering,
 reduction of the number of dimensions,
 recommendation system.

Preferably, the central unit is configured for machine learning based on a supervised and unsupervised machine learning assembly.

Preferably, the central unit is configured for supervised machine learning including at least one of the following machine learning techniques:
 linear regression,
 decision trees,
 neural networks,
 K-nn,
 support vector machine (SVM),
 random forests.

Preferably the laser machining parameters includes at least one of the following parameters:
 a scanning speed of the laser beam over the material to be machined;
 a number of pulses per second emitted by said laser source;
 a wavelength emitted by the laser source;
 a spot size of the laser source on the material to be machined;
 an energy per pulse emitted by said laser source.

Preferably, the control unit is further configured to control said light beam from said laser source to said material to be machined. Preferably, the algorithm of the learning function is capable of determining laser machining parameters to feed the learning database so that the learning function can be learned.

Preferably, the target machining is a predefined machining for teaching the learning model.

Preferably, the method also includes the following additional step:
 k) acquiring information in relation to the material to be machined enabling an identification of said material to be machined by the central unit.

Preferably, the method also includes the following additional step:
 l) further determining a machining strategy on the basis of said machining of said material to be machined, preferably the machining strategy is determined by the learning machining function.

Preferably, the method also includes the following additional steps:
 m) irradiating said material to be machined with said light beam with laser machining parameters defined by the learning function according to a range of predefined laser machining parameters;
 n) acquiring by the optical detection unit a result generated by the irradiation of said material to be machined by said light beam;
 o) transmitting said result to the central unit and accessing said result generated by irradiating said material to be machined with said light beam;
 p) extracting from said result by means of the central unit a pair of machining data comprising machining results obtained as a function of the laser machining parameters used in step m);
 q) storing said machining data pair in said learning database.

The inventors propose, according to a second aspect, a laser machining device comprising a central unit adapted to perform the steps of the method according to the first aspect of the invention.

The different variants and advantages described for the method according to the first aspect of the invention apply to the device of the second aspect, mutadis mutandis.

Preferably the device further comprises an optical unit for directing said laser beam towards said material to be machined.

Preferably, said optical unit for directing said laser beam towards said material to be machined allows precession of said laser beam.

The inventors propose, according to a third aspect, a computer program to implement the method according to the first aspect of the invention.

The different variants and advantages described for the method according to the first aspect of the invention and for the device according to the second aspect of the invention apply to the computer program of the third aspect, mutadis mutandis.

Preferably, the computer program comprising the instructions which lead the laser machining device according to the second aspect of the invention to perform the steps of the method according to the first aspect of the invention.

The inventors propose, according to a fourth aspect, a computer-readable medium on which the computer program is recorded according to the third aspect of the invention.

The different variants and advantages described for the method according to the first aspect of the invention, for the device according to the second aspect of the invention and for the computer program according to the third aspect of the invention apply to the computer-readable medium of the fourth aspect, mutadis mutandis.

Determining the Laser Machining Parameters on the Basis of the Laser Machining Parameters in Relation to the Material of a Workpiece When a decision is made to machine a workpiece, a target machining of this workpiece is set. Preferably a target machining of a workpiece is a hole, a groove, a channel, a cutout or other machining obtained by ablation, through or non-through machining that the operator wishes to perform in a workpiece. Preferably, a target machining is defined in a two-dimensional space, and more preferably in a three-dimensional space. For example, a target machining defines a volume of material to be ablated. A target machining may, for example, correspond to a cut or a change in the optical properties of a transparent material.

In order to perform the target machining with the smallest possible machining tolerances, the machining parameters must be determined according to the nature of the workpiece, i.e. its composition, original shape and the properties of the laser source used. The method of the invention allows the determination of laser machining parameters without necessarily resorting to empirical tests beforehand. In fact, thanks to the use of the different models which will be detailed later and by knowing the interaction parameters of the material of the workpiece when it is irradiated by the light beam, it is possible to determine the laser machining parameters. The laser machining parameters determined when implemented according to the method of the invention enables to obtain the target machining.

The laser machining parameters are preferably defined for a laser machining device and include but are not limited to:
- a scanning speed of the laser beam over the workpiece;
- a number of pulses per second emitted by said laser source;
- a wavelength emitted by the laser source;
- a spot size of the laser source on the material to be machined;
- an amount of energy per pulse emitted by said laser source;
- a pulse duration emitted by said laser source.

A workpiece is defined by the material of which it is made and its dimensions. For example, the dimensions can be defined in a multidimensional space in order to clearly define the material locations and the locations where no material is present. A dimension can for example define a roughness of the workpiece, for example a roughness can be defined for each of the faces of the workpiece when it is defined by faces.

It is possible to determine the $\delta$ from the equations described below, however it is not always easy to have all the parameters, constants or coefficients necessary to make this calculation. Thanks to the method of the invention it is possible to determine a $\delta$ experimentally while taking into account the variability of certain parameters. To do this, scans must be produced over the surface of the material, with constant power values and increasing speed values, and with constant speed values and increasing power values, as shown in FIGS. 7a and 7b. Preferably, the maximum depths should be measured and compared with the values obtained with the corresponding model described below. The $\delta$ value used in the model must be adjusted until a good coincidence between the experimental points and the modeled points is obtained.

Determination of the Ablation Threshold Using the $D^2$ Method.

Ablation threshold determination by the $D^2$ method is the most accepted and widely used method for determining the ablation threshold of all types of materials. This method is used for Gaussian beam energy profiles (see FIG. 1). This method has the advantage of offering the possibility to estimate the radius of the Gaussian beam W at the surface of the material and the incubation coefficient.

The fluence (or energy density) in a plane perpendicular to the laser beam axis is given by:

$$F(r) = F_0 \exp\left(\frac{-2r^2}{\omega^2}\right), \tag{1}$$

where r is the distance to the beam axis, $\omega^2$ is the radius of the beam at the surface of the material at $e^{-2}$ of the maximum intensity. If the beam is focused on the surface, $\omega = \omega_0$. $F_0$ is the maximum fluence (at r=0) and is calculated and given by:

$$F_0 = \frac{2E_P}{\pi \omega^2}. \tag{2}$$

The diameter of an ablation crater produced with one or more laser pulses can be described as a function of the maximum fluence:

$$D^2 = 2\omega^2 \ln\left(\frac{F_0}{F_{th}}\right), \tag{3}$$

where $F_{th}$ is the ablation threshold. Since F increases linearly with $E_p$, the radius of the $\omega$ beam can be estimated from the graph of crater diameters $D^2$ as a function of the logarithm of the pulse energy, using equation 3. The radius W can be calculated from the slope of a curve defined by the experimental results:

$$\omega = \sqrt{\frac{slope}{2}}. \tag{4}$$

The ablation threshold can be calculated by extrapolating the craters diameter at power 2 to a crater diameter equal to zero in a graph representing the crater diameter at power 2 ($D^2$) as a function of the logarithm of the pulse energy.

In general, the ablation threshold is reduced by increasing the number of pulses incident on the same point on the surface of the material to be machined. This behaviour is attributed to the increase in radiation absorptivity caused by the accumulation of defects created with each pulse, even at fluences lower than the threshold fluence. Such an increase in radiation absorptivity can be characterized by an incubation factor or coefficient, expressed by the following equations (5) and (6):

$$F_{th}(N) = F_{th}(1) \times N^{S-1} \qquad (5)$$

When $F_{th}(N)$ is the fluence of the ablation threshold for N pulses, $F_{th}(1)$ is the fluence of the ablation threshold for a single pulse and S is the incubation coefficient. S=1 means that there is no incubation, i.e. the ablation threshold is independent of the number of pulses. For most materials S<1, the ablation threshold decreases with increasing number of pulses.

In general, the incubation or the decrease in threshold fluence is more pronounced during the first one hundred pulses for a large majority of materials and particularly for the most commonly used materials.

To apply the $D^2$ method to find the ablation threshold, the incubation coefficient and, if necessary, the beam radius, a crater matrix with increasing pulse numbers and pulse energies must be produced as shown in FIG. 2. In order to have sufficient experimental points, at least twenty energy values, and several pulse number values less than one hundred pulses are required. The diameter of each crater must be measured from images obtained with an optical or electron microscope.

Determination of the Ablation Threshold Using the Diagonal Scan Method.

The Diagonal-Scan or D-Scan method is a geometric method for determining the value of the ablation threshold. The D-Scan method is an alternative method to the $D^2$ method and has the advantage of being more efficient and faster in terms of experiment time and number of measurements to be performed. The disadvantage of this method compared to $D^2$ method is related to the method for determining the beam radius, which is always important for measurements and calculation of the parameters.

The Diagonal-Scan method involves moving the sample diagonally in relation to the focal point of the beam using different beam energies and a variable number of pulses, while changing the speed of movement (FIG. 3). The experiments enabling to implement the D-Scan method involve the determination of the ablated surface. The ablated surface corresponds to the points where the radiation power has exceeded a critical value defined by:

$$P_{crit} = \tfrac{1}{2} e \pi \omega_0^2 I_{th}, \qquad (7)$$

where $I_{th}$ is the ablation threshold in terms of intensity, given by:

$$I_{th} = \frac{P_0}{e \pi \rho_{max}^2}, \qquad (8)$$

where $P_0$ is the maximum pulse power and $\rho_{max}$ is the maximum width of the ablated region (FIG. 3). The ablation threshold is given by:

$$F_{th} = I_{th} \tau_p, \qquad (10)$$

where $\tau_p$ is the pulse duration.

To apply the D-Scan method to find the ablation threshold and the incubation coefficient, scans must be produced as shown in FIG. 3, with different energy values and speed of movement in order to have measurements for different numbers of superimposed pulses. The number of pulses superimposed on the points corresponding to the wider part of the lobes is given by:

$$N = \sqrt{\pi} \frac{f \times \rho_{max}}{v_y}, \qquad (11)$$

where f is the pulse frequency and $v_y$ is the speed in the direction of the axis y.

Determination of $\delta$ Using the Skin Depth Method.

During the interaction between an ultra-short laser pulse and a solid, the electrons do not have time to transfer their energies to the ions, because the electron-phonon coupling time is longer than the pulse duration. Under these conditions, the electron density can be assumed to remain constant and the electromagnetic field in the solid can be calculated using Maxwell's equations in combination with the material equations. It can also be considered that in this case, the electric field of the laser on the material surface decreases exponentially with the depth in relation to the material surface:

$$E(x) = E(0) \exp\left(-\frac{x}{\delta}\right), \qquad (12)$$

where $\delta$ is the penetration depth or the skin depth. The surface of the material corresponds to x=0 and the equation (12) is valid for x>0. In general, the absorption depth is expressed as:

$$\delta = \frac{c}{\omega_L \kappa}, \qquad (13)$$

where $\kappa$ is the imaginary part of the refractive index, $$N = \sqrt{\varepsilon} = n + i\kappa, \qquad (15)$$

where $\varepsilon = \varepsilon' + i\varepsilon''$ is the dielectric function and $\omega_L$ is the frequency of the laser. The dielectric function can be considered in the Drude formula for the following calculations:

$$\varepsilon = 1 - \frac{\omega_{pe}^2}{\omega(\omega + i v_{eff})}, \qquad (16)$$

where $$\omega_{pe} = \sqrt{\frac{4 \pi e^2 n_e}{m_e}} \qquad (17)$$

is the frequency of the electron plasma, $v_{eff}$ is the effective collision frequency between the electrons and the lattice of ions, and $m_e$ and $n_e$ are the mass and density of the conduction electrons, respectively. In the case of a high collision rate, $v_{eff} \gg \omega$ and thus $\varepsilon'' \gg \varepsilon'$, the equation (13) can be reduced to the following form:

$$\delta = \frac{c}{\omega_{LK}} \approx \frac{c}{\omega_{pe}} \sqrt{\frac{2v_{eff}}{\omega_L}}. \tag{18}$$

Determination of $\delta$ by Ablation Depth.

Under non-equilibrium conditions for the determination of $\delta$ by the skin depth method, the electron thermal conduction time ($t_{heat}$), or the time for the electrons to reach thermal equilibrium in the region in the skin layer is also longer than the laser pulse duration. The time $t_{heat}$ can be approximated by the following equation, with an expression of the thermal diffusion coefficient as follows:

$$t_{heat} \approx \frac{\delta^2}{\kappa_T}; \kappa = \frac{l_e v_e}{3}, \tag{19}$$

where $K_T$ is the thermal diffusion coefficient, and $l_e$ and $v_e$ are the mean free electron path and its speed, respectively.

The laws of energy conservation in this case have a form that describes the variation in electron temperature caused by the absorption of energy in a skin layer:

$$c_e(T_e) n_e \frac{\partial T_e}{\partial t} = -\frac{\partial Q}{\partial x}, \tag{20}$$

where Q is the energy flow absorbed in the skin layer:

$$Q = AI_0 \exp\left(-\frac{2x}{\delta}\right), \tag{21}$$

where $A = I/I_0$ is the absorption coefficient, $I_0 = cE^2/4\pi$ is the incident laser intensity. The absorption coefficient and the skin depth are therefore a function of the laser frequency $\omega_L$, of the conduction electron density $n_e$, the effective frequency of electron-electron and electron-ion collision $v_{eff}$, of the angle of incidence and of the polarization of the laser.

The depth of a crater z produced with an ultrafast laser with a fluence F is of the order of the penetration depth of the beam, according to the equations:

$$z = \delta \ln \frac{F}{F_{th}}, \tag{22}$$

where $F_{th}$ is a threshold fluence for the ablation and $\delta$ is a length having several interpretations depending on the approximations in the two temperature equations and the fluence range. Typically, in the low fluence domain, $\delta$ is related to the optical absorption coefficient and, for higher fluences, to thermal parameters such as electron scattering and the time interaction duration. For many materials, there are different values of $F_{th}$ and $\delta$ at high and low fluences, with the boundary depending on the material. Each material is then represented by a set of parameters ($\delta$, $F_{th}$) in a given fluence zone. The laser fluence F for a laser beam with a Gaussian intensity profile is given by:

$$F(r) = F_0 \exp\left(-\frac{2r^2}{\omega_0^2}\right) \tag{23}$$

where r is the radial distance (distance from the center of the laser beam), $F_0$ is the fluence peak or the fluence at the center of the beam, and $\omega_0$ is the radius of the beam at $1/e^2$ of the maximum intensity. The maximum fluence $F_0$ can be obtained from the pulse energy $E_p$:

$$F_0 = \frac{2E_p}{\pi \omega_0^2}. \tag{24}$$

The ablation depth by pulse after irradiation with a Gaussian beam is given by the relation:

$$z_G(r) = \delta \ln\left(\frac{F_0}{F_{th}}\right) - 2\frac{r^2}{\omega_0^2}. \tag{25}$$

This model is based solely on the response of the material to the applied fluence. All geometric effects described by this approach will be related to the temporal or spatial distribution of fluence.

In the case of multi-pulse irradiation, it must be taken into account that the surface topography is no longer flat but becomes paraboloid, its depth increasing after each consecutive laser pulse. Therefore, a few considerations are essential to achieve a better prediction of the ablation dimensions. The first condition that should not be overlooked is the incubation, or lowering the ablation threshold with the number of pulses. Secondly, the effects of local surface angle on energy absorption and reflectivity must be taken into account.

Finally, and since multi-pulse irradiation is typically used to obtain deeper craters or laser scans, the variation of the Gaussian beam of the fluence with the depth must also be considered.

This description is valid for relatively low fluences with respect to the ablation threshold. For higher fluences, thermal parameters such as electron scattering or the duration of the laser-matter interaction must also be considered.

Line Ablation

In most applications, a static description is not relevant if the sample or beam is moving. A numerical description can be used for dynamic situations. Consider a motion in the direction x with a speed v. Since the pulse repetition rate of the laser is PRR, the distance $\Delta x$ between two successive pulses is:

$$\Delta x = \frac{v}{PRR}. \tag{26}$$

In this case, it is not possible to assume a radial symmetry and the fluence is then a function of the position in x and in y. It is then necessary to enter a number of pulses N as seen by the material for one pass. The ablation depth can then be expressed according to the following equation:

$$z_k(0, y) = \delta \ln\left(\frac{F_0}{F_{th}(N)}\right) - 2\frac{k^2 \Delta x^2}{\omega_0^2} - 2\frac{y^2}{\omega_0^2} \tag{27}$$

In cases where the focusing position of the beam is not corrected with increasing crater or line depth, which is usually the case, in the previous equation, $\omega_0$ should be replaced by $\omega$ (z). The crater profile becomes a Z (y) "line" profile defined by:

$$Z(y) = \Sigma_{k=-N}^{N} z_k(y). \tag{28}$$

To perform the analytical calculation of the previous equation, note that the number of pulses depends on y, i.e. it is not the same along the entire line profile. A number of pulses can be determined in the direction perpendicular to said line by the following equation:

$$N(y) = \frac{\omega_0}{\sqrt{2}\,\Delta x} \sqrt{\ln\left(\frac{F_0}{F_{th(N)}}\right) - 2\frac{y^2}{\omega_0^2}}\,. \tag{29}$$

It is important to note that the total number of pulses seen by a sample point for one pass is 2N+1. This expression leads to several comments. First of all, the line profile is no longer parabolic as it was the case for a plurality of static pulses. Second, depending on the value of Δ, the maximum number of pulses may be small, for example less than 10. In most materials, incubation effects must also be taken into account to obtain realistic results with the three previous equations.

When a material is ablated along a line, the fluence (F) expressed in J/cm2 can be expressed in the direction perpendicular to said line by the following equation:

$$F(y) = F_0 \exp\left(-\frac{2k^2 \Delta x^2}{\omega_0^2}\right) \exp\left(-\frac{2y^2}{\omega_0^2}\right), \tag{30}$$

Δx describing the distance between the centres of two successive pulses, where $F_0$ is the peak fluence of the laser beam, k . . . , $\omega_0$ is a minimum beam width, Since the ablation threshold $F_{th}$ is a parameter related to a fluence in J·cm$^{-2}$, the following assumptions about an ablation threshold value are preferred:

the redeposition of debris is negligible;

the ablation speed is not affected by the interaction with previous pulses;

there is no heat build-up or thermal effect on the surface of the material or plasma absorption;

there is no internal reflection.

With respect to the performance of a laser machining machine, a laser beam ablation rate can be defined by the following equation:

$$\frac{dV}{dt} = \frac{f \delta \pi}{6} \ln\left(\frac{F_0}{F_{th}}\right) \left[\ln\left(\frac{F_0}{F_{th}}\right) - \Delta x^2\right]. \tag{31}$$

A fluence ablation rate can also be defined by the following equation:

$$\frac{dV}{dt}/F_0 = \frac{fS\Delta x}{F_0}. \tag{32}$$

A maximum ablation rate can then be defined by the following equation:

$$\left(\frac{dV}{dt}/F_0\right)_{max} = \frac{2}{e^2}\frac{\delta}{F_{th}}. \tag{33}$$

The equations defining the ablation rate have limitations because they do not allow the following parameters to be taken into account:

saturation due to the conicity of the machined part;

reflectivity (S,P);

incubation;

thermal effects.

The above parameters can be taken into account in a model for predicting the machining parameters for a target machining. By simulating the ablation profiles for all fluence ranges of the laser beam with the equations defining these ablation profiles and varying the parameters not taken into account in these equations. Such a method would be way too slow and would require too many experiments.

Perform an experimental plan with a limited number of parameters and identify the parameters that have the greatest influence on the final results.

Determination of the threshold fluence using a diagonal scan model (Diagonal-Scan)

$$\phi_{th} = \frac{E_p}{e\pi \rho_{max}^2}. \tag{34}$$

Preferably the machining parameter determination algorithms described above can be used to implement the machine learning algorithm of the invention.

Consideration of the Local Angle of Incidence of the Beam

One way to introduce this local surface angle correction is to consider that the fluence varies with the distance to the crater centre r, since the angle between the beam direction and the surface varies from the crater rim to the crater centre. For a deep crater this angle is small on the walls but should reach 90° at the center. The conicity γ(r) of the walls is directly related to the derivative of the crater profile at the considered r:

$$\tan(\gamma(r)) = \frac{dz}{dr} z_k(r), \tag{35}$$

which is equal to the slope of the tangent at each point of the crater profile (indicated in the figure below by the red line L). The local fluence after N pulses, F_N (r), can therefore be simply expressed as follows:

$$F_N(r) = F(r)\cos(\gamma(r)). \tag{36}$$

It can be noted that the above equation can also be used even if the fluence remains constant from one pulse to the next, for example if the sample is already pierced or for a large crater shape.

Consideration of Non-Normal Beam Incidence

There are several applications that require cavity walls perpendicular to the surface, which is difficult to achieve if the laser beam is scanned normally towards the surface.

However, negative or 0° wall conicities can be obtained if the laser beam is tilted in relation to the surface. To model this, the surface angle to the beam must also be considered. The previous equation thus becomes:

$$F_{abs,N}(r)=F_N(r)(1-R)\cos(\gamma(r)+\beta) \quad (37)$$

where β is the angle between the normal to the surface and the laser beam (FIG. 1). It should also be considered that the direction of ablation should be parallel to the direction of the beam rather than perpendicular to the original surface. The referential coordinates must therefore be adapted accordingly, as shown in FIG. 18b.

Consideration of Reflectivity

Polarization plays a major role in laser ablation processes of metals because of the role of the reflected beams. The evolution of reflectivity with the angle of incidence α is given by the Fresnel formulae for s, p circular polarizations:

$$R_s = \left| \frac{\sqrt{n^2 - \sin^2\alpha} - \cos\alpha}{1 - n^2} \right|^2 \quad (38)$$

$$R_p = \left| \frac{n^2\cos\alpha - \sqrt{n^2 - \sin^2\alpha}}{n^2\cos\alpha + \sqrt{n^2 - \sin^2\alpha}} \right|^2 \quad (39)$$

$$R_{circular} = \frac{R_s + R_p}{2} \quad (40)$$

The fluence absorbed by the material is then given by the following expression:

$$F_{abs}(r)=F(r)(1-R) \quad (41)$$

where R is $R_S$, $R_P$ or $R_{circular}$ depending on the direction of polarization radiation. If we introduce into the correction described by the equation allowing the contribution of the surface reflectivity to be taken into account, the local fluence absorbed after N pulses then becomes:

$$F_{abs,N}(r)=F_N(r)(1-R)\cos(\gamma(r)) \quad (42)$$

In the case of the referential, we use (FIG. 18b), α=90°−γ. In general, for metals, for low conicity, i.e. for a high value of a, the p-polarized reflectivity becomes low and the transmission is improved, so the ablation efficiency is also improved for a low conicity. For the oblique beam, the same calculation can be done with α-β instead of β. With a medium polarization, the effect is taken into account with a multiplicative coefficient at $F_0(0)$ in the equation defining the local fluence after N pulses using the reflectivity equations of $R_S$ and $R_p$. This coefficient is 1 for conicity greater than 20°, and can reach 1 for conicity less than 20° also depending on the value of β.

Gaussian Beam Propagation

Since laser treatments are usually performed with the (Gaussian) beam focused using a lens with a certain focal length, the beam propagation must be taken into account as most experiments are performed without adjusting the surface distance to the focal plane. The depth of ablation increases. The variation of the beam radius as a function of the focal plane distance is given by:

$$\omega(z) = \omega_0 \sqrt{1 + \left(\frac{z}{z_R}\right)^2} \quad (43)$$

where $z_R$, is the Rayleigh distance, given by the relation:

$$z_R = \frac{\pi\omega_0^2}{\lambda} \quad (44)$$

In the case of a non-normal incidence, the fluence distribution as a function of z and the radial coordinate r can be determined numerically by applying a geometric correction as shown in FIG. 19. The centre of the beam with an angle of inclination α=90°−β can be described as follows:

$$z_R=r\tan(\beta)+f, \quad (45)$$

where f is the distance from the surface to the focal plane. On the other hand, the line perpendicular to this central axis of the beam and passing through the generic point P (r,z) is given by:

$$z_P=r\tan(\beta+90°)+O_P \quad (46)$$

To determine the fluence at the generic point P(r,z), it is necessary to know the Gaussian distribution of the intensity along the plane $z_P$ and, in turn, the distance between the point BP(r,z) and the focus f. The point BP can be calculated from the intersection of the two lines $z_B$ and $z_P$:

$$z_B=z_P \quad (47)$$

$$z_{BP}=r_{BP}\tan(\beta+90°)+O_P \quad (48)$$

$$O_P=z_{BP}-r_{BP}\tan(\beta+90°) \quad (49)$$

The distances z' and r' can then be easily obtained from the Cartesian coordinates of the points BP and P:

$$z'=\sqrt{(r_{BP})^2+(z_{BP}-f)^2} \quad (50)$$

$$r'=\sqrt{(r_{BP}-r_P)^2+(z_{BP}-z_P)^2} \quad (51)$$

From the two distances z' and r', it is then possible to calculate the local fluence, using the beam width on this plane described by the line z:

$$F(z_P) = F_0\exp\left(2\frac{rr^2}{\omega(z')}\right), \text{ où } \omega(z') = \omega_0\sqrt{1 + \left(\frac{z'}{z_R}\right)^2}. \quad (52)$$

Since laser treatments are usually performed with the (Gaussian) beam focused with a lens of a certain focal length, the beam propagation must be taken into account, as most experiments are performed without adjusting the surface distance to the focal plane as the depth of ablation increases.

Contrary to the prior art, the model included in the algorithm implemented by the central unit takes into account the beam propagation. The variation of the beam radius as a function of the focal plane distance is given by:

$$\omega(z) = \omega_0\sqrt{1 + \left(\frac{z}{z_R}\right)^2} \quad (53)$$

where z_R, Rayleigh's distance, is:

$$z_R = \frac{\pi\omega_0^2}{\lambda} \quad (54)$$

For example, this results in the following beam distribution profile in the focal plane area for a beam with a focal diameter of 30 μm and a wavelength of 1030 nm. In this case, the Rayleigh distance is 686.27 μm.

Simulation of Machining Using a Precession Laser Beam

Precession laser ablation is a technique that allows to perform straight-sided drilling and cutting at high-speed that is more advantageous and efficiently than, for example, using a nozzle and a gas or scanning the beam at high speed with a scanner head. The precession movement can be achieved by using a rotating mirror or other rotating element in the optical path of the laser. With a rotating mirror, it is easy to control the rotational speed of the beam w (in rpm), the positions of the center of rotation of the BFG (best focus-global beam) and the focal plane of the BFI (best focus-individual beams) beam relative to the surface and the angle of attack β.

In this ablation configuration, the pulse superposition will be different from the ablation produced by a linearly scanned beam. To determine the ablation profile of a drilled hole, the distance between spots dx, which depends on the precession radius $r_P$, and the angle θ, must be known.

The precession radius $r_P$ is given by:

$$r_P = \left(\frac{BFG}{\cos\beta} - z\right)\tan\beta \quad (55)$$

where BFG is the distance to the centre of rotation of the beam, β is the angle of attack and z is the distance to the material surface.

The distance between two consecutive pulses dx can be calculated as the distance between two vertices of a polygon with NR sides (eq. 57), where NR is the total number of pulses during one revolution. NR depends on the pulse repetition rate PRR (Hz) and the rotational speed ω (rpm) (eq. 56).

$$NR = \frac{PRR}{\omega/60} \quad (56)$$

$$dx = 2r_P \sin\left(\frac{n\theta}{2}\right) \quad (57)$$

Thus, there is a superposition between pulses if the distance dx between the first pulse $n_0$ and the pulse $n_N$ is less than the radius of an ablated crater $r_c$ (FIG. 20a), which is given by:

$$r_c = w_0 \sqrt{\ln\left(\frac{F_0}{F_{th}}\right)} \quad (58)$$

Finally, the depth of ablation produced by each pulse n during one revolution as a function of the distance to the center is given by:

$$z_n = -\delta\left[\ln\left(\frac{F_0}{F_{th}(n + NR/2)}\right) - 2\frac{n^2 dx^2}{w^2} - 2\left(\frac{(y + y_c)^2}{w^2}\right)^p\right] \quad (60)$$

where δ is the depth of penetration of the radiation into the material, $F_0$ is the maximum fluence, $F_{th}$ is the ablation threshold, w is the radius of the Gaussian beam and p is the Gaussian order. This depth must be iterated R times, where R is the total number of revolutions, given by:

$$R = \text{proc·time}*\omega/60. \quad (61)$$

where proc·time is the total machining time. Note also that the radius of the Gaussian beam depends on the distance to the focal point BFI. In the equations described above, it is important to note the following: the w will change as the machining depth increases. After each ipulse the $r_P$ will change if part of the machining has already been ablated.

Preferably, the formulas described above can be used individually or in combination to implement a learning algorithm that can be trained on the basis of a learning database for determining laser machining parameters.

BRIEF DESCRIPTION OF THE FIGURES

These and other aspects of the invention shall be clarified in the detailed description of particular embodiments of the invention, reference being made to the drawings of the figures, in which:

the FIG. 3a-FIG. 4b represent: FIG. 3b, a fluence profile obtained transversely to the line described in FIG. 3a; FIG. 3c represents a distribution of pulse number N transversely to the line described in FIG. 3a; FIG. 4b, the groove depth obtained transversely to the line described in FIG. 4a;

FIGS. 6a and 6b show in FIG. 6a the movement of the sample in the direction of the axes Y and Z for the implementation of the D-Scan method and in FIG. 6b the ablation lobes resulting from the implementation of the experimental protocol of FIG. 6a;

FIG. 12 represents the maximum depth as a function of the beam fluence. FIG. 13 represents the maximum depth as a function of scan speed of the beam;

FIG. 20a shows a schematic representation of machining with a precessing laser machining beam;

FIGS. 20b, 20c, 21b and 21d show simulations of machining according to a particular embodiment of the method of the invention;

FIG. 22a shows a schematic representation of the points of impact of a precessing or rotating machining laser beam, the FIG. 22b shows a detail of the FIG. 22a;

The drawings of the figures are not to scale. Generally, similar elements are denoted by similar references in the figures. The presence of reference numbers in the drawings may not be considered as limiting, even when such numbers are indicated in the claims.

Example of an Experimental Device for Implementing the Method of the Invention

The experiments carried out to compare the models described above were performed on samples of polished stainless steel 316L and 316 and TiCr6Sn4. The tests were performed in air using a Satsuma HP2 (Amplitude Systems) femtosecond laser with a pulse duration of about 330 fs, a radiation wavelength of 1030 and a maximum power of 20 W at 500 kHz. The beam was focused on the surface of the samples using a telecentric lens with a focal length of 100 mm, producing a spot radius of about 10 µm determined using the $D^2$ method.

Morphological and topographical analysis of the processed samples was performed using a confocal optical microscope (Olympus LEXT OLS4100).

The $D^2$ method was used to calculate the threshold fluence ($F_{th}$) values. To determine the value of δ, several line scans with increasing pulse energy were produced and their depths measured. The value δ applied in the model was varied until the best match with the experimental results was obtained.

Preferably, the greater the amount of results provided to the database, the more accurately the laser machining parameters are determined.

DETAILED DESCRIPTION OF CERTAIN EMBODIMENTS OF THE INVENTION

Figure 1:
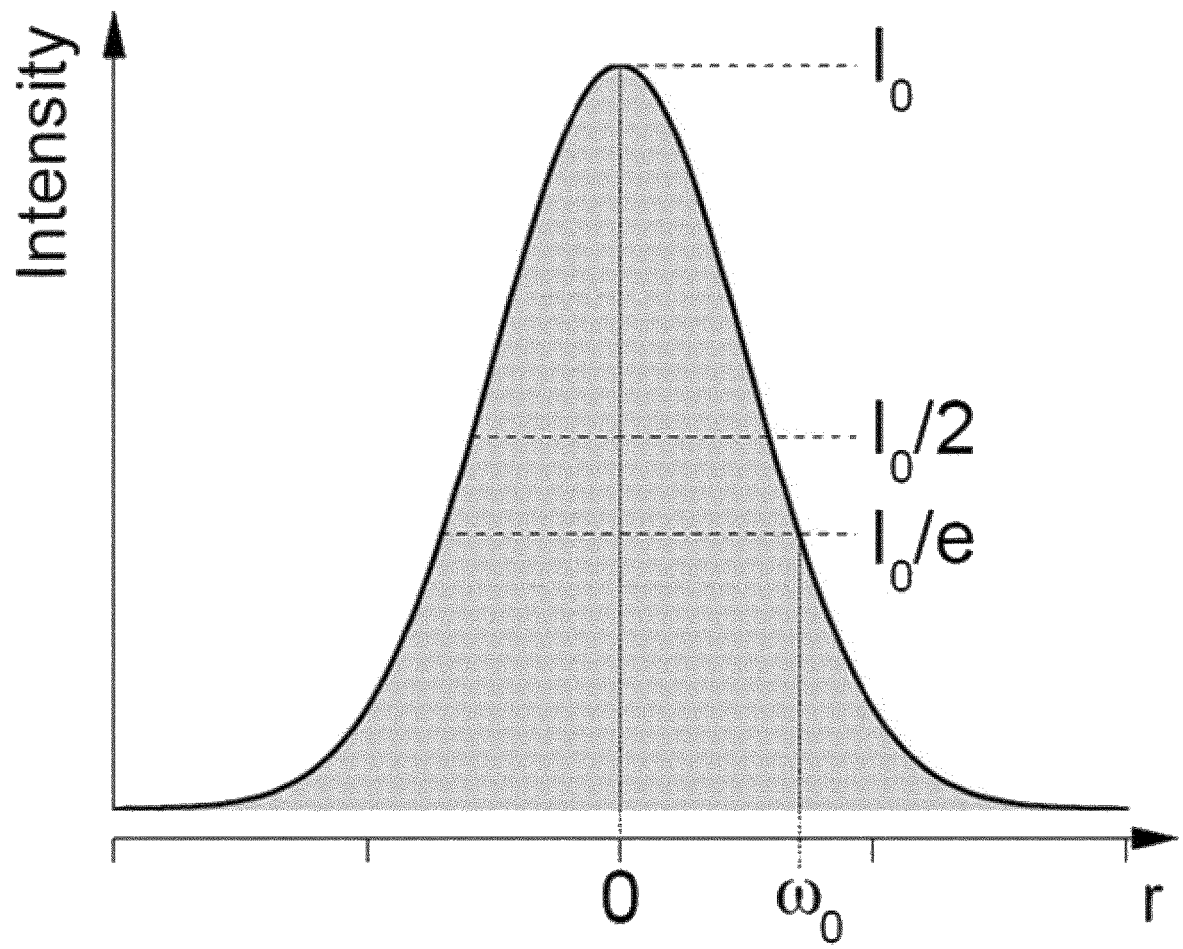
FIG. 1 represents the main characteristics of a beam having a Gaussian intensity profile.

FIG. 1 shows an intensity profile of a Gaussian laser beam. The center of the beam is defined by the value 0 along the abscissa axis defining a beam radius r and a maximum intensity $I_0$ is observed at the center of the beam. A beam radius $\omega_0$ relative to the beam center is defined for a beam intensity value equal to $I_0/2$.

Figure 2:
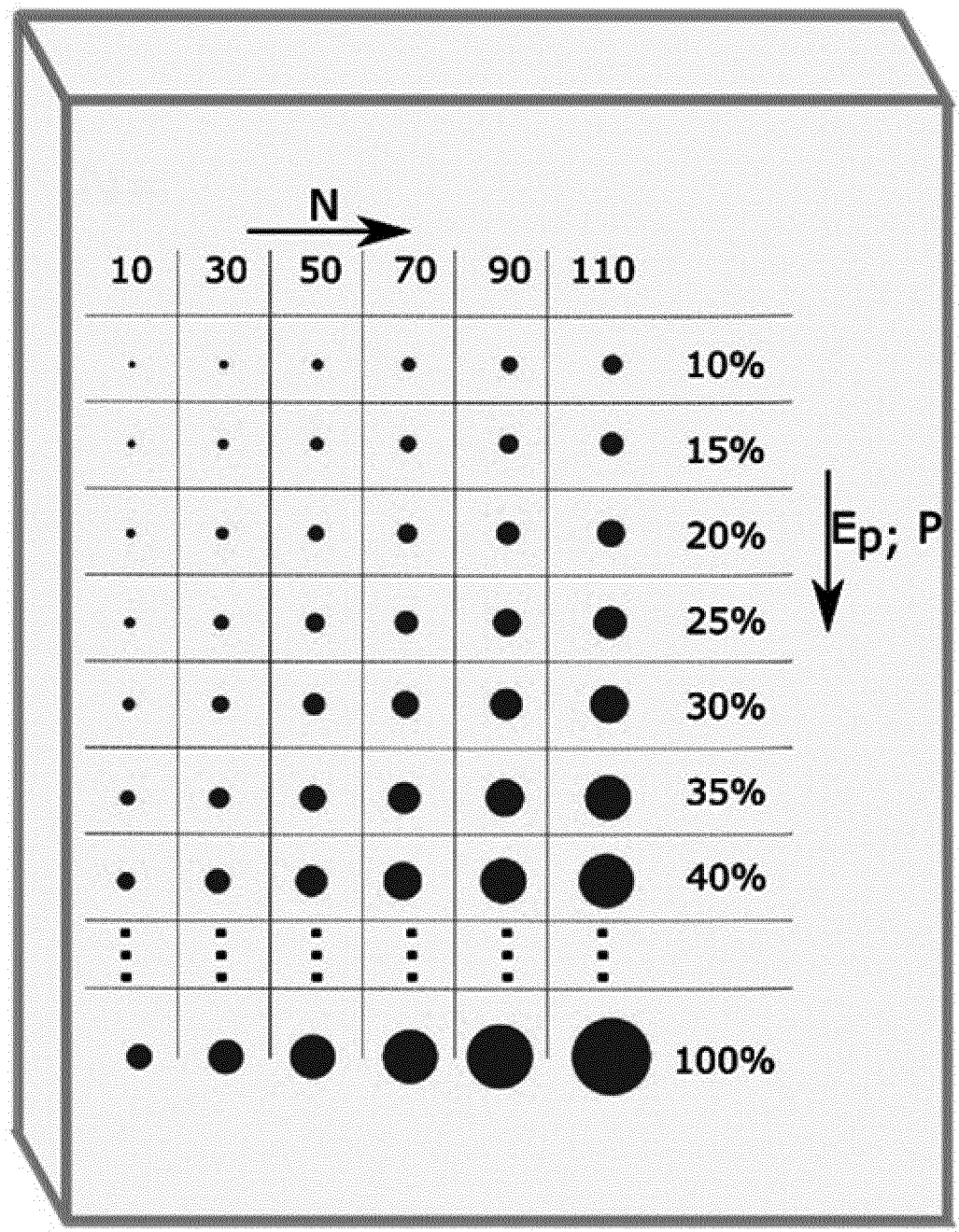
FIG. 2 represents a matrix of craters with increasing numbers of pulses and pulse energies.

FIG. 2 shows a crater matrix to be machined in order to implement the ablation threshold determination by the $D^2$ method. FIG. 2 describes a preferred embodiment for producing a crater matrix with the laser machining machine of the invention. The matrix shown in FIG. 2 shows a number of pulses for each of the columns between 10 and 110 and beam energies between 10% and 100% of a maximum beam value that can be provided by the laser machining machine of the invention. The realization of such a matrix of craters while respecting the beam energies and the numbers of pulses indicated, followed by the topological and/or dimensional characterization of the craters of this matrix thus enables to define an ablation threshold, an incubation coefficient or even a beam radius. Preferably the production of the crater matrix should be performed with increasing pulse numbers and pulse energies, as illustrated by the arrows in FIG. 2. In order to have sufficient experimental points, at least 20 energy values and several pulse number values less than 100 pulses are required. The diameter of each crater can be measured from images obtained with an optical or electron microscope or a profilometer.

Figure 3A:
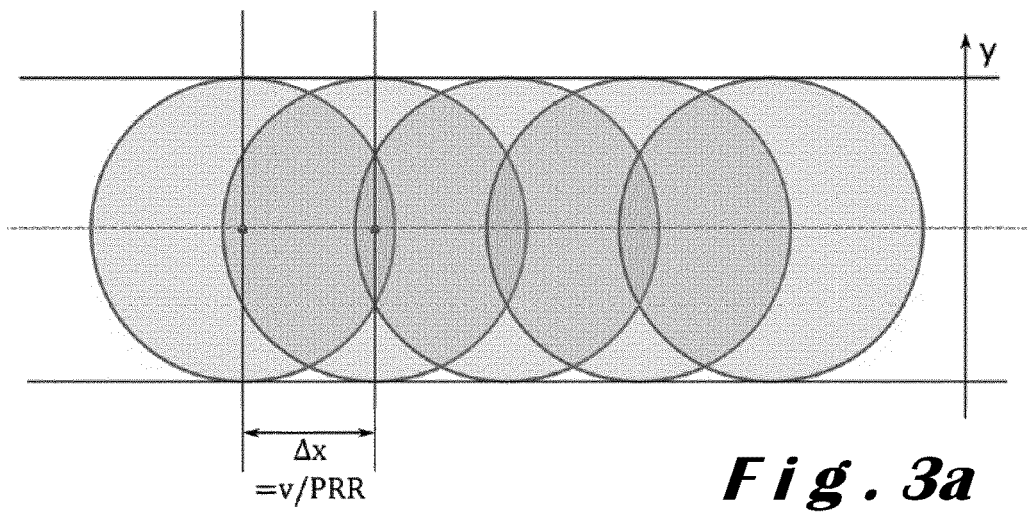
FIG. 3a and FIG. 4a, a plurality of pulses along a line.

FIG. 3a shows a plurality of pulses along a line. A pulse is represented by a circle with its center on a line. The centres of each circle, i.e. the points where the maximum intensity of each pulse is maximum $I_0$, are spaced along a line of: $\Delta x = v/PRR$. v being the speed of movement of the beam and PRR being a number of pulses per unit time. FIG. 3a shows that for pulses along a line, with a distance between each circle less than the radius of each circle, then statistically more pulses reach the centre of the line than the edges of the line.

Figure 3B:
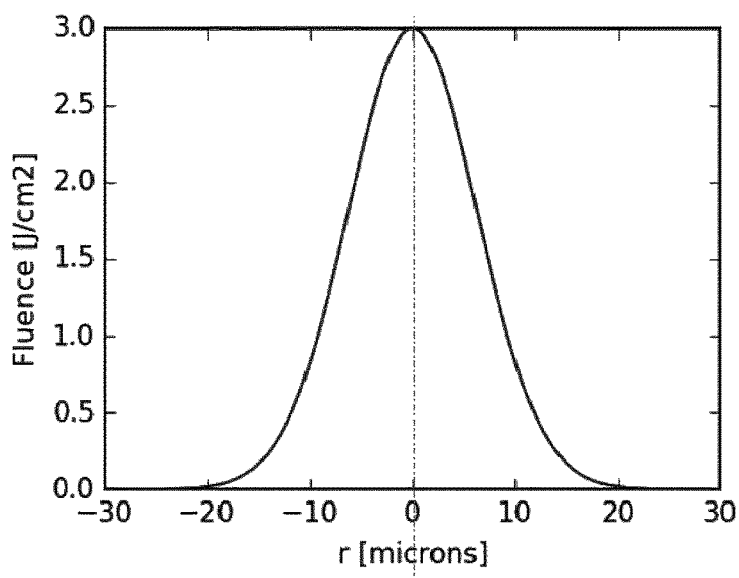

FIG. 3b shows a fluence profile obtained transverse to the line described in FIG. 3a. This fluence profile shows that the fluence at the center of the line is much higher than at the edges of the line.

Figure 3C:
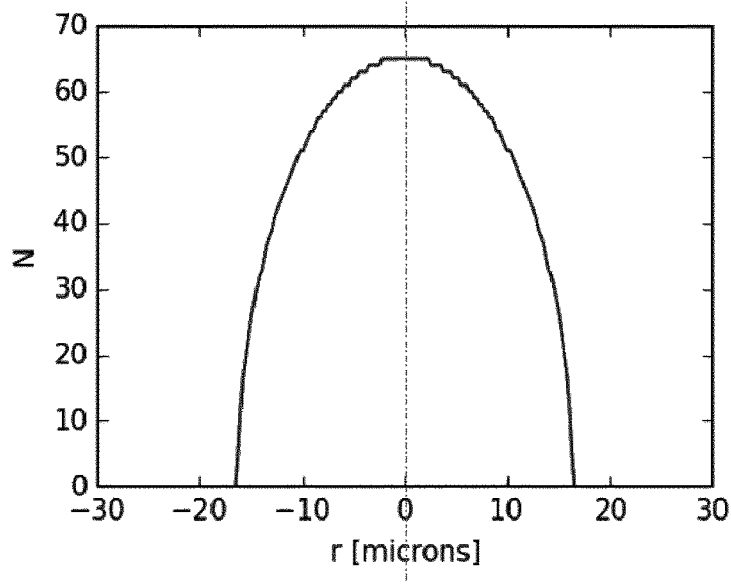

FIG. 3c shows a distribution of the pulse number N transversaly to the line described in FIG. 3a. As expected from the description in FIG. 3a, statistically, a greater number of pulses reach the center of the line than the edges of the line.

Figure 4A:
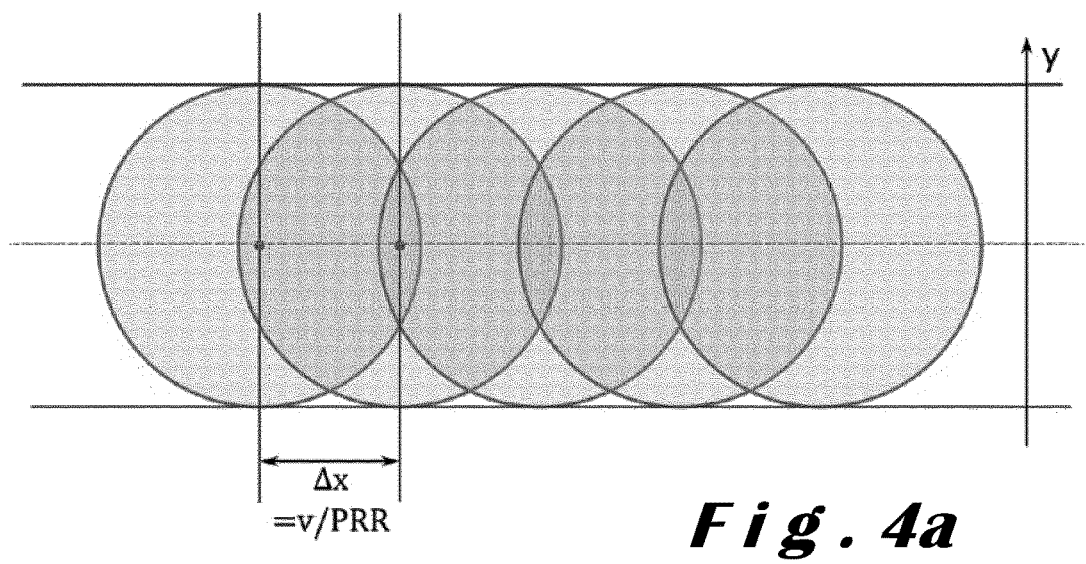
Figure 4B:
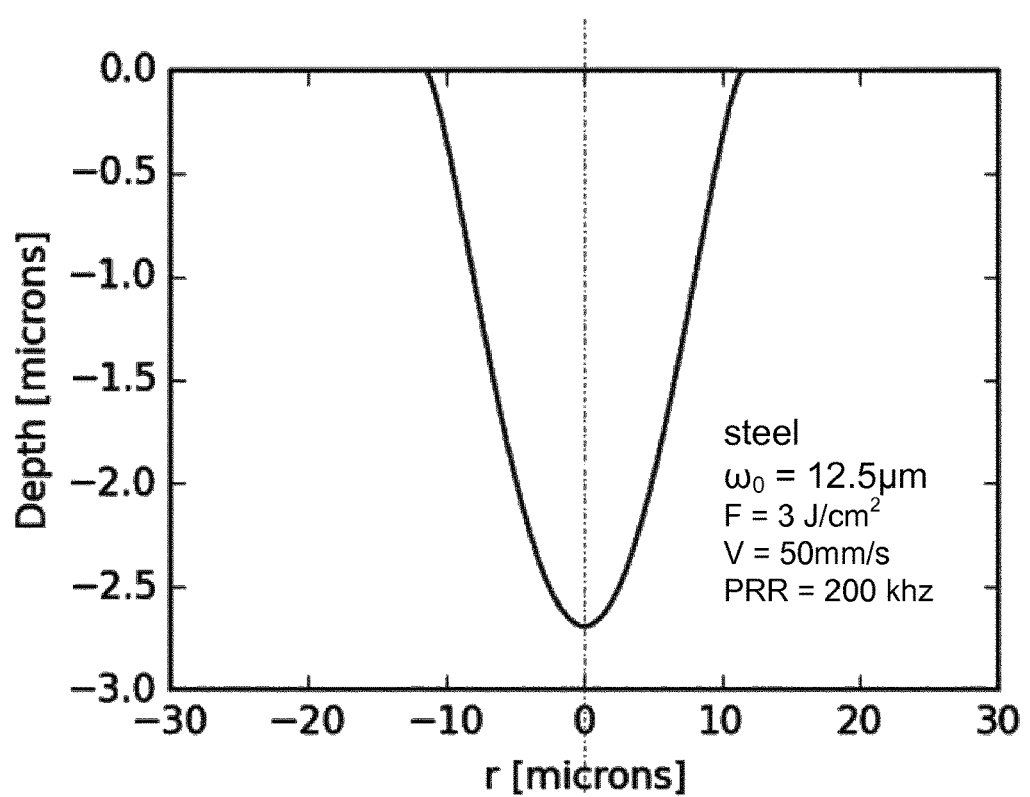
Figure 5:
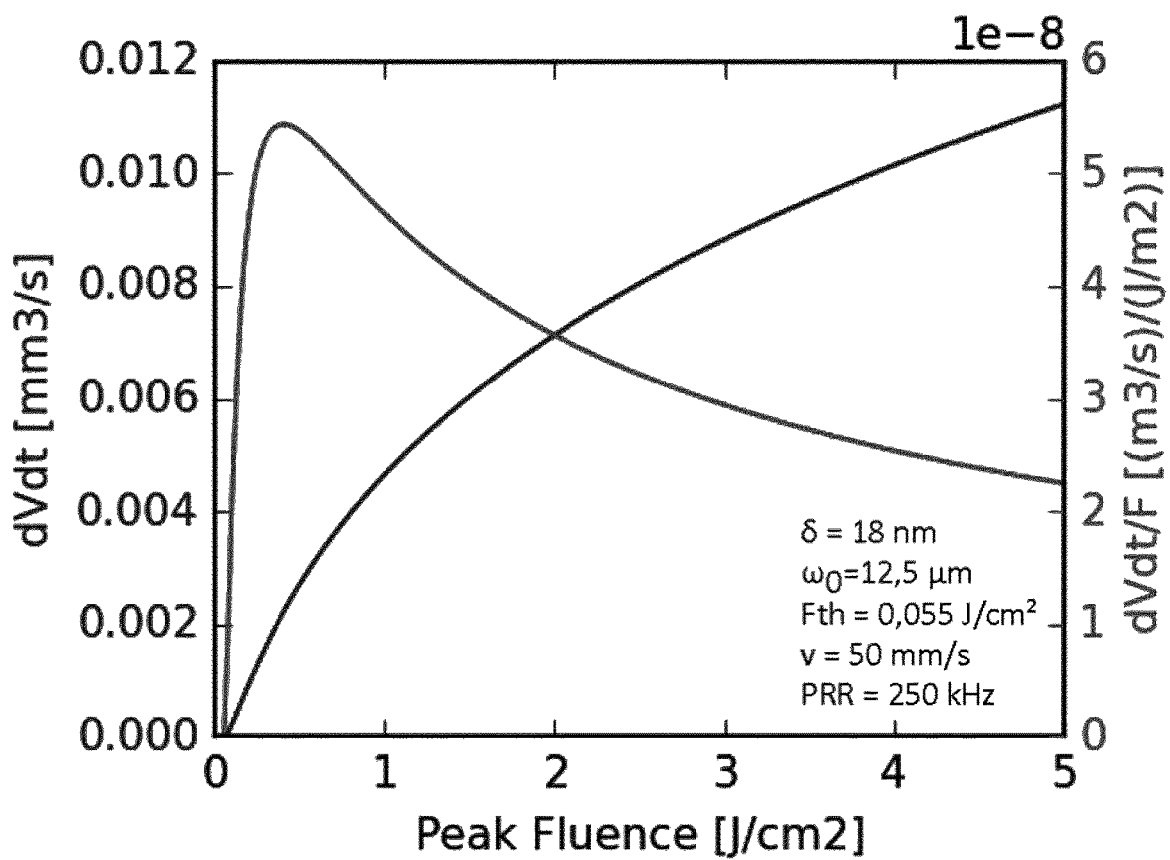
FIG. 5 shows simulation results obtained for a cross section of a line representing an ablation rate (left) and a maximum ablation rate as a function of the fluence of the laser.

FIG. 4a shows as in FIG. 3a a plurality of pulses along a line. FIG. 4b, shows the groove depth obtained transversaly to the line described in FIG. 4a with the following experimental parameters:

material: steel;
$w_0 = 12.5$ µm;
$F = 3$ J/cm$^2$;
$V = 50$ mm/s;
PRR = 200 kHz.

Figure 7A:
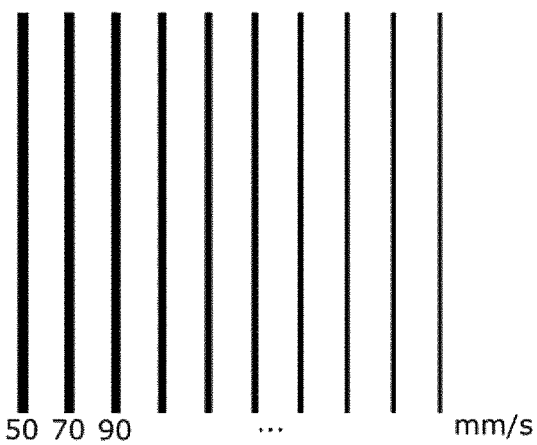
FIGS. 7a and 7b show a schematic representation of the experiments to be performed to estimate the value of δ using the skin depth method.
Figure 7B:
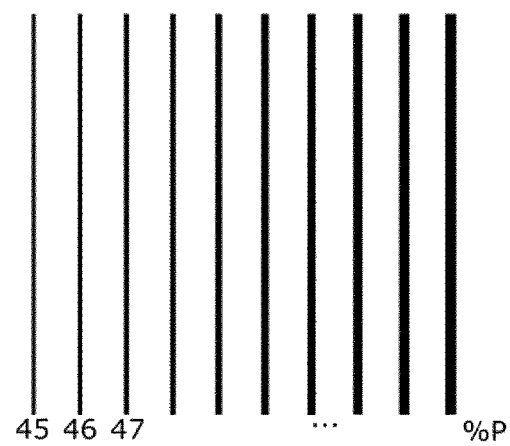
Figure 7C:
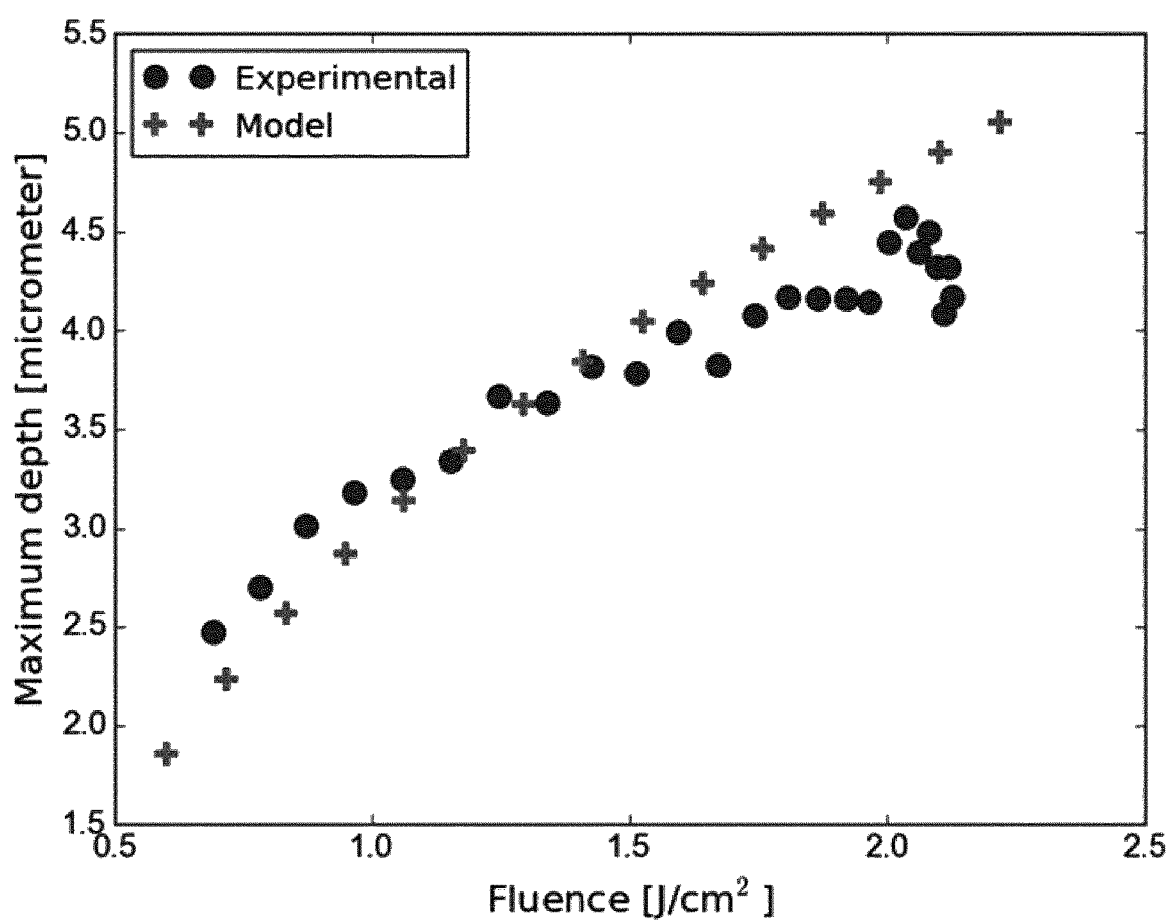
FIGS. 7c and 7d show the experimental results compared to the models for the experiments shown in FIGS. 7a and 7b respectively.
Figure 7D:
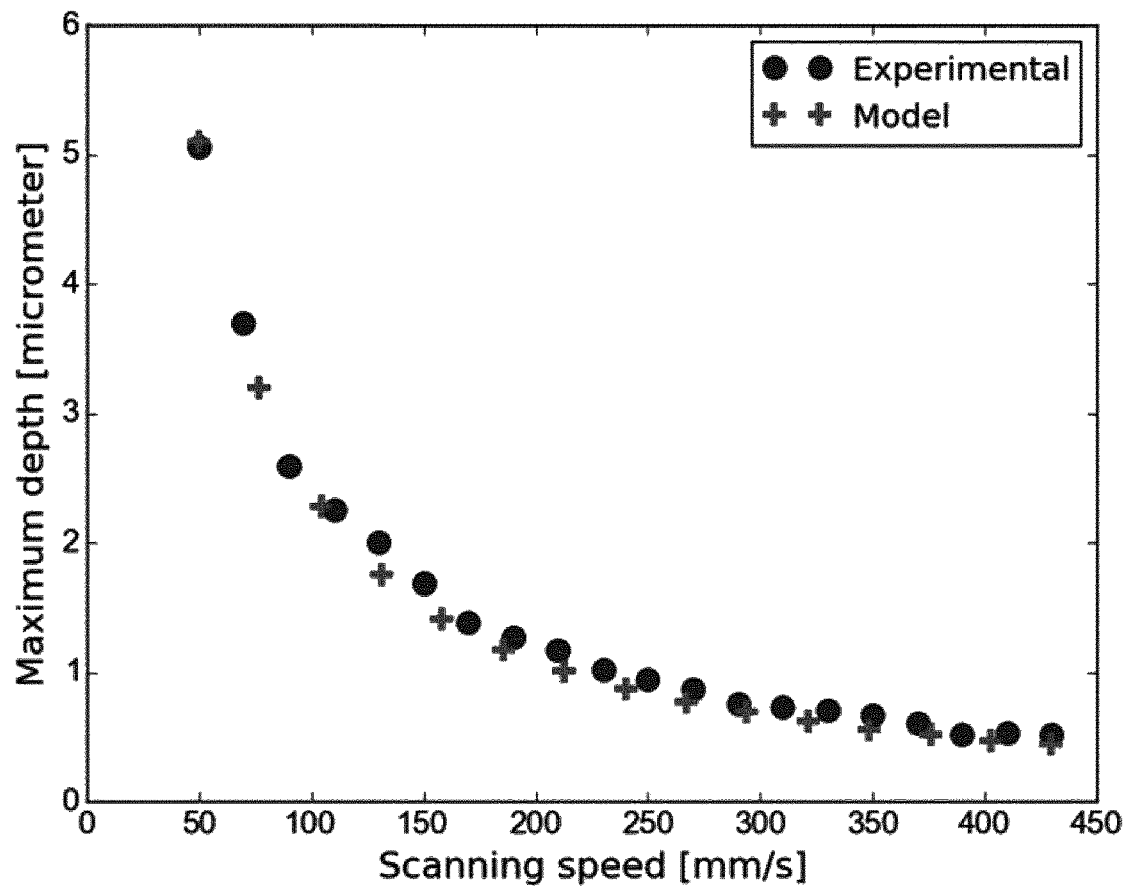

FIGS. 7c and 7d represent the experimental results compared to the corresponding models obtained by the experiments described in FIGS. 7a and 7b. FIG. 7c shows the maximum scan depths obtained on a steel substrate as a function of the maximum fluence. FIG. 7d shows the maximum depths of scans obtained on a steel substrate as a function of the offset speed or the scan speed.

Figure 6A:
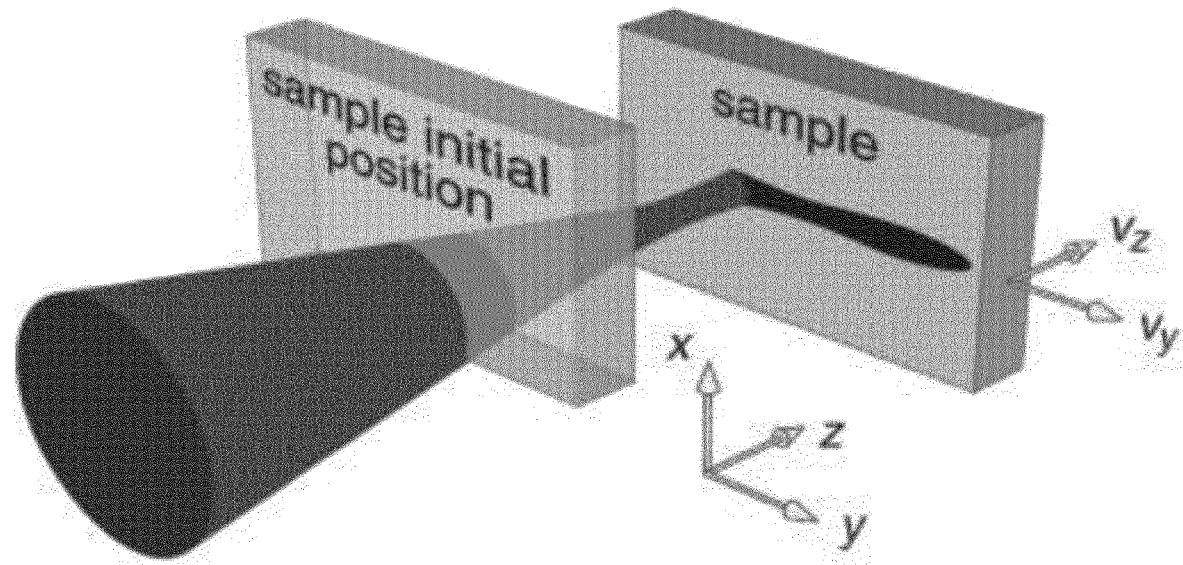
Figure 6B:
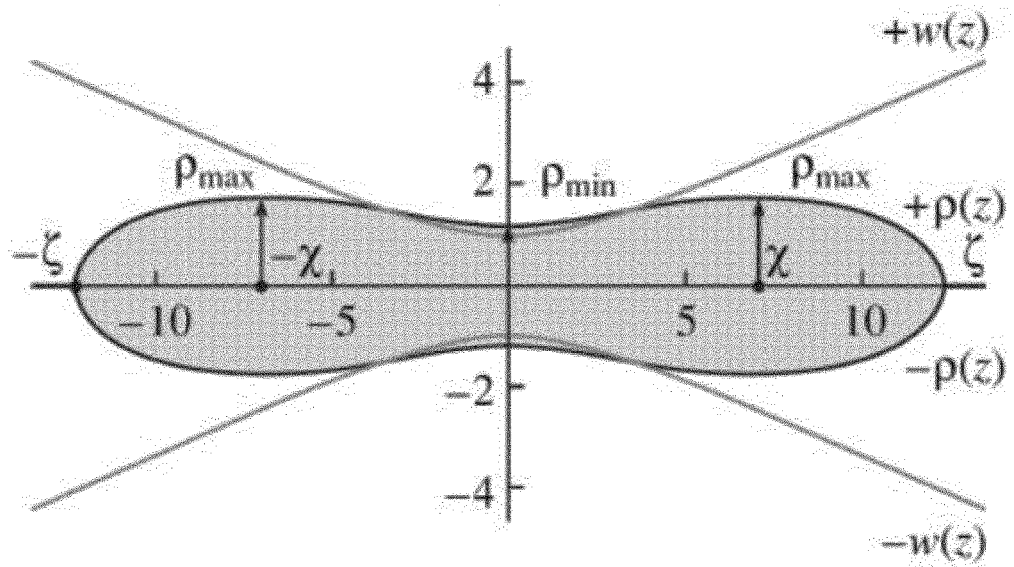
Figure 8A:
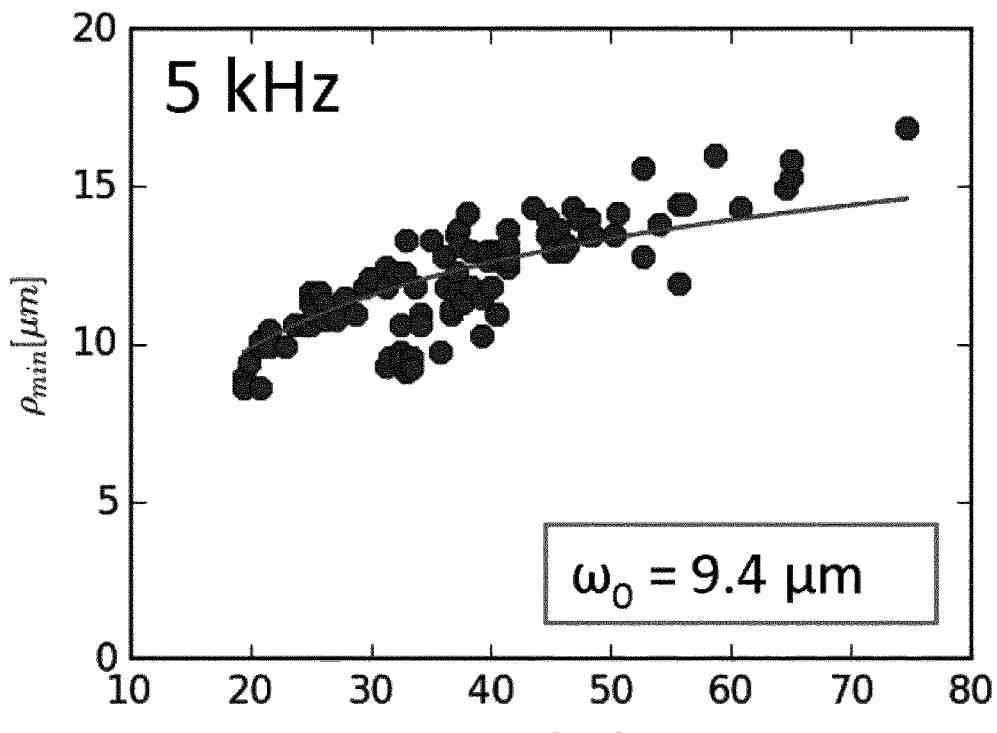
FIGS. 8a and 8b show the results for the dimensions $\rho_{min}$ and $\rho_{max}$ from the experiments shown in FIGS. 7a and 7b for laser beam pulse frequencies of 5 KHz and 100 KHz respectively.
Figure 8B:
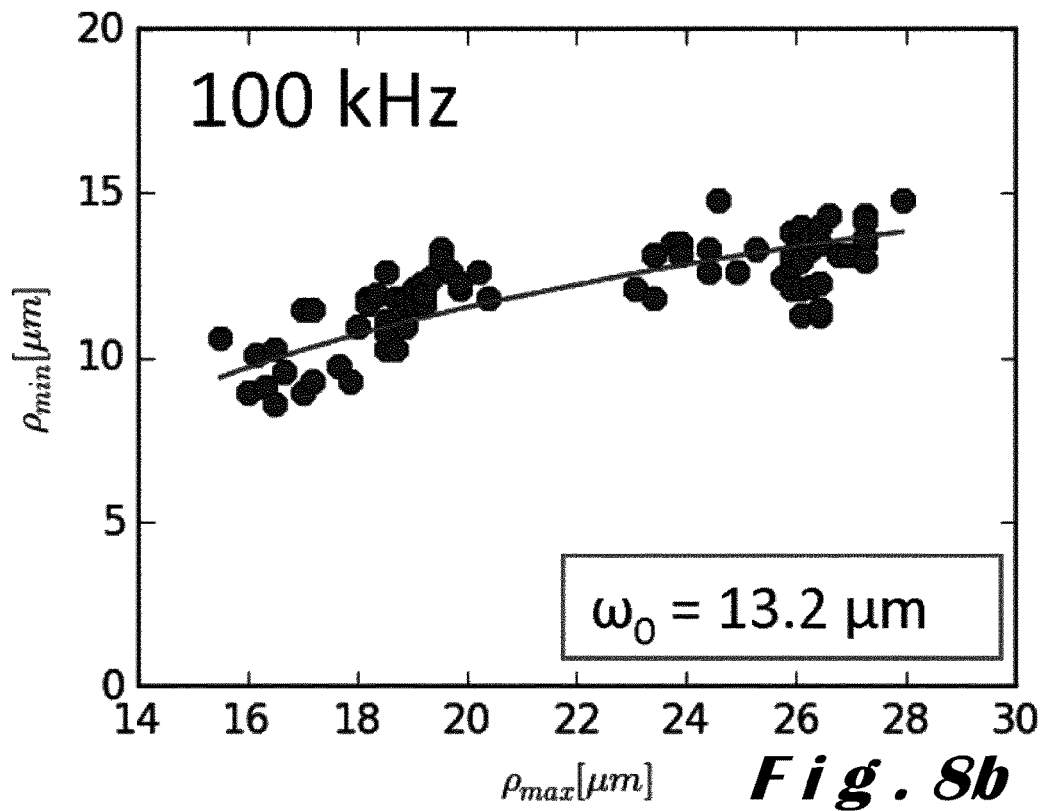

FIGS. 8a and 8b show point clouds obtained for experiments described in FIGS. 6a and 6b for which a regression according to an algorithm of the invention allows to determine the parameter $\omega_0$.

Figure 9:
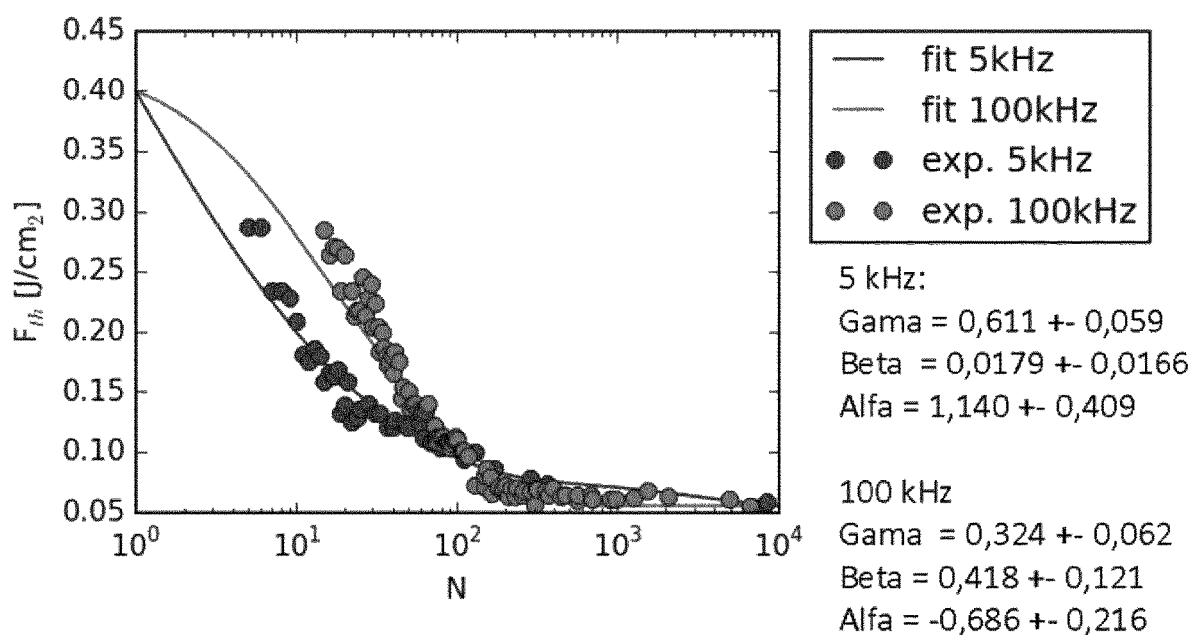
FIG. 9 shows the results of the 5 KHz and 100 KHz experiments of FIGS. 8a and 8b in a graph showing the fluence $F_{th}$ as a function of pulse number N.

FIG. 9 shows the experimental results of the D-scan method for two pulse frequencies of 5 KHz and 100 KHz. The regressions for these two sets of experimental results are also illustrated by the lines. The parameters of these two regressions are indicated by Gama, Beta and Alfa.

Figure 10:
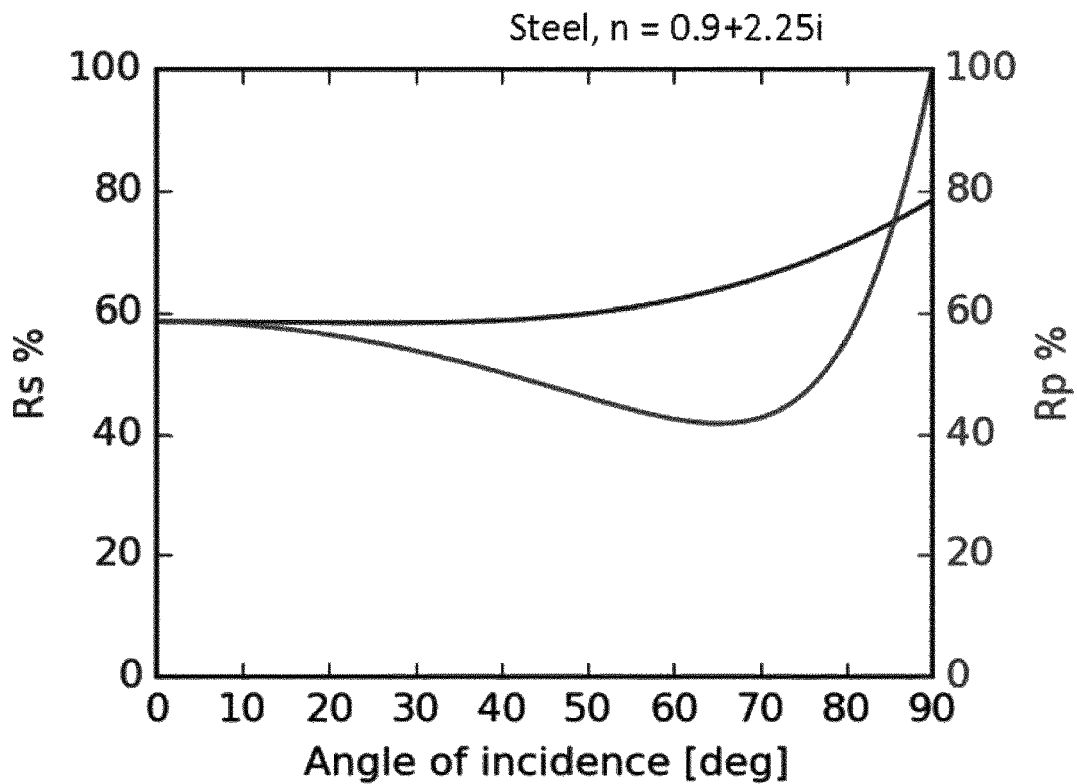
FIG. 10 shows a simulation of the measured ablation as a function of the angle of incidence for a polarization S on the left and P on the right.

FIG. 10 shows a parameter for the interaction of a polarized light beam with a steel substrate having the following properties: n=0.9+2.25i. FIG. 10 shows the interaction parameter for incidence angles between 0° and 90°, for a polarization s and for a polarization p. The curve representing the polarization p is the one with a maximum at 100% for an incidence angle of 90°.

Figure 11:
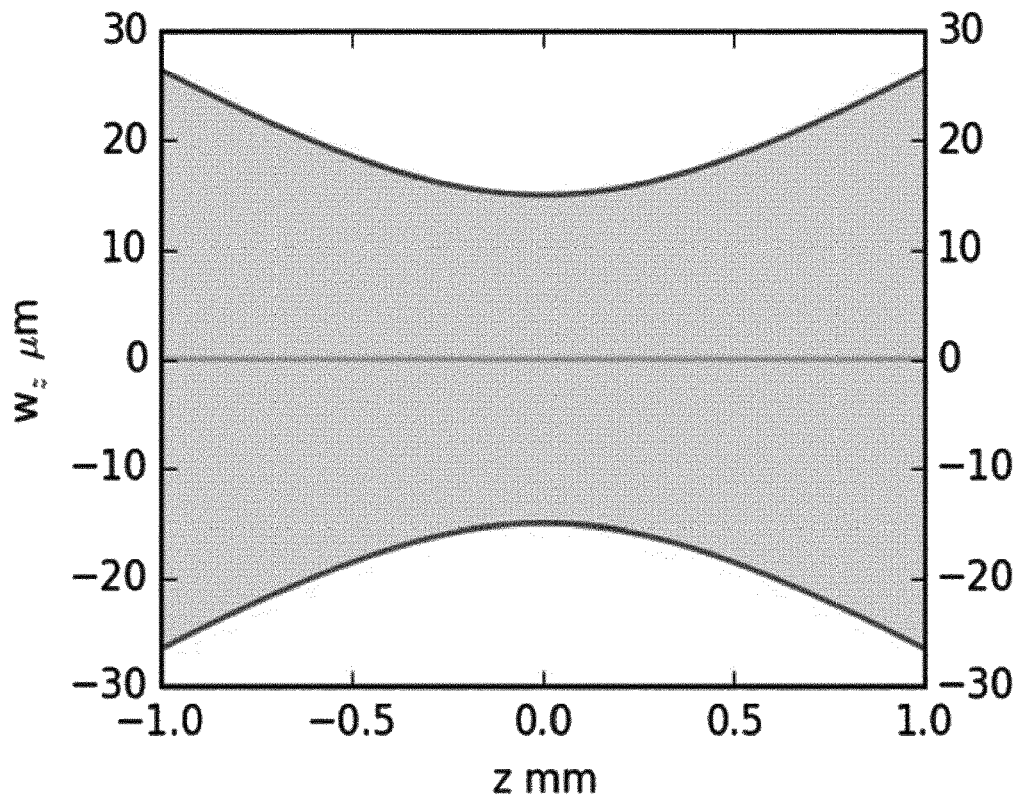
FIG. 11 shows the propagation of a Gaussian beam and represents the beam diameter w as a function of a propagation distance z.

FIG. 11 shows a simulation of the beam width $w_z$ at its minimum width. The minimum beam width is shown at a distance z in a propagation direction z having a value of 0. The simulated beam profile shows the divergence of the beam in the direction z.

Figure 12:
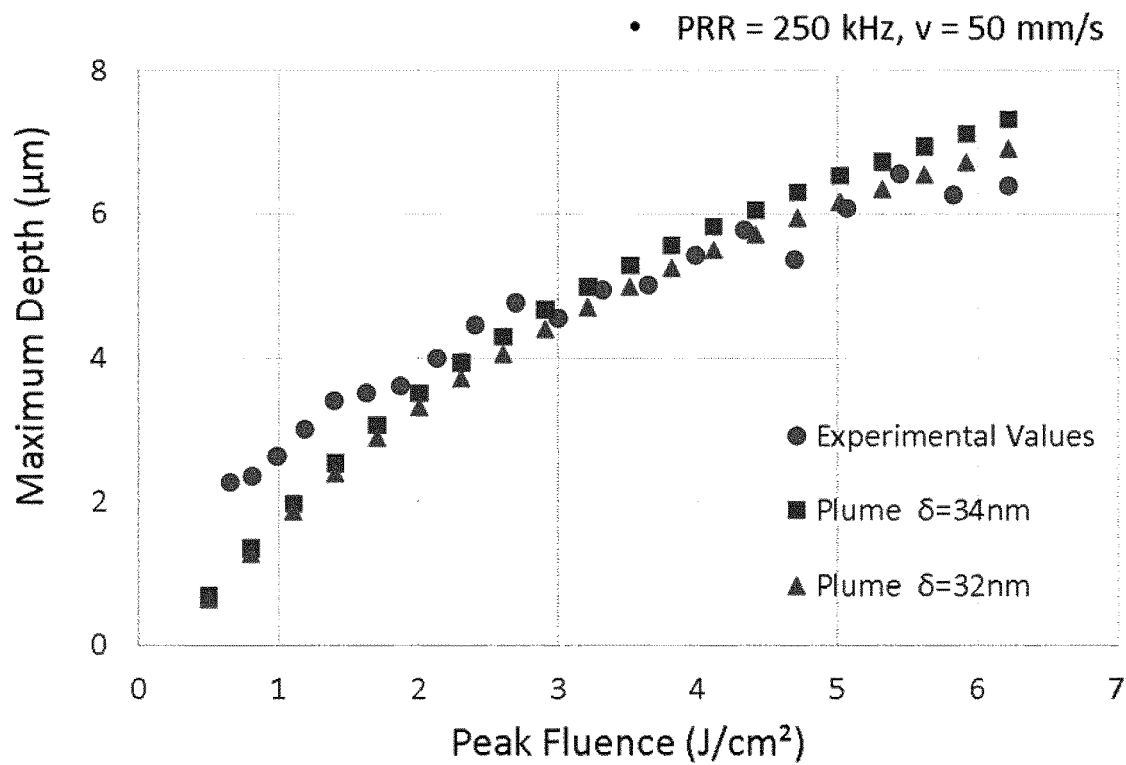
FIGS. 12 and 13 represent experimental and simulation results for two values of δ.

FIG. 12 shows experimental results and simulations for two δ values for the maximum depth as a function of beam fluence. For peak fluence values less than 2 J/cm$^2$ and greater than 4.5 J/cm$^2$, the experimental results vary from the two simulations having for δ value 32 nm and 34 nm. This figure illustrates very well the need for a learning algorithm in order to obtain a better simulation of the parameters or a better prediction of the machining parameters when fluences lower than 2 J/cm$^2$ and higher than 4.5 J/cm$^2$ are used.

Figure 13:
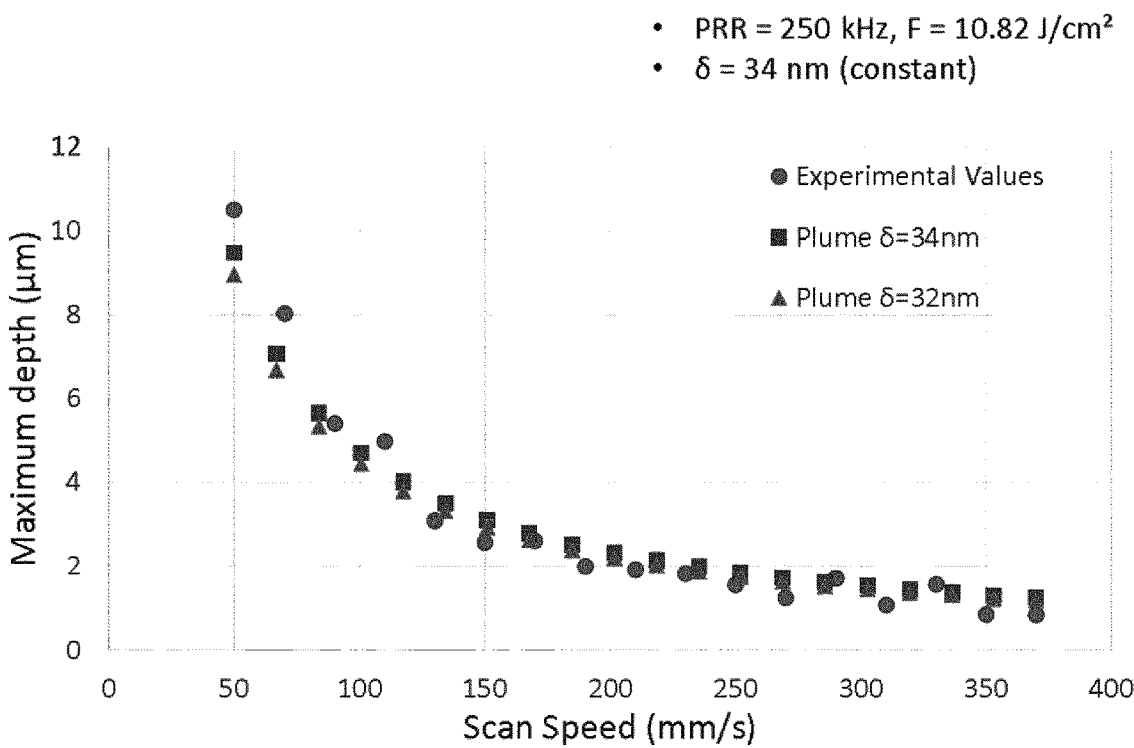

FIG. 13, showing the maximum depth as a function of beam scanning speed, shows a good correlation between the experimental ablation results and the beam scanning speed. The experimental results also show a relatively good robustness when varying the δ parameter from 32 nm to 34 nm.

Figure 14A:
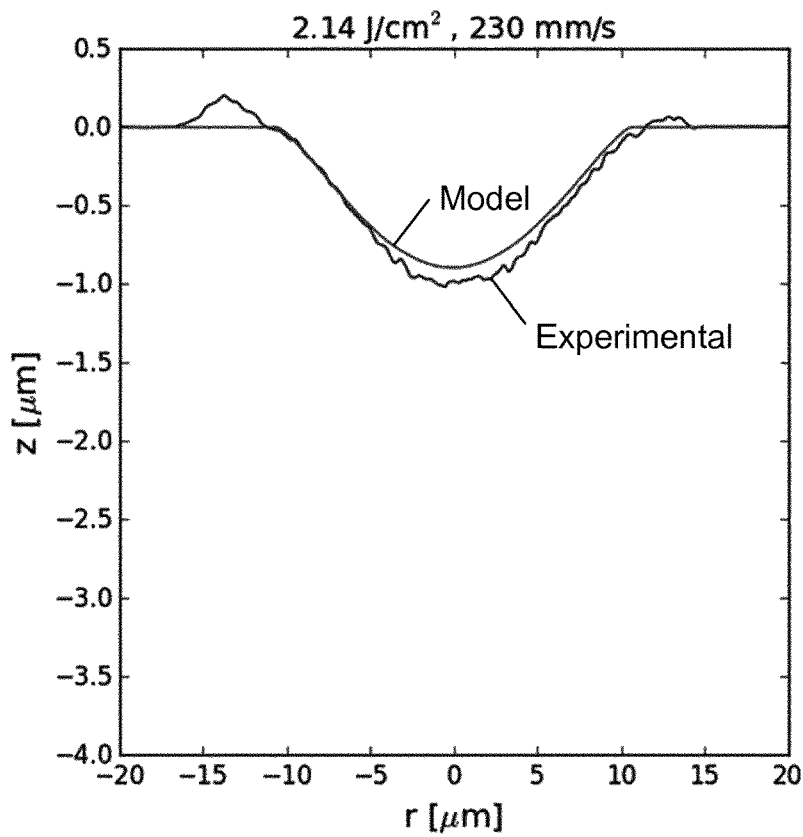
FIGS. 14a, 14b, 15a, 15b, and 15c represent experimental and simulated profiles obtained on stainless steel 316L.
Figure 14B:
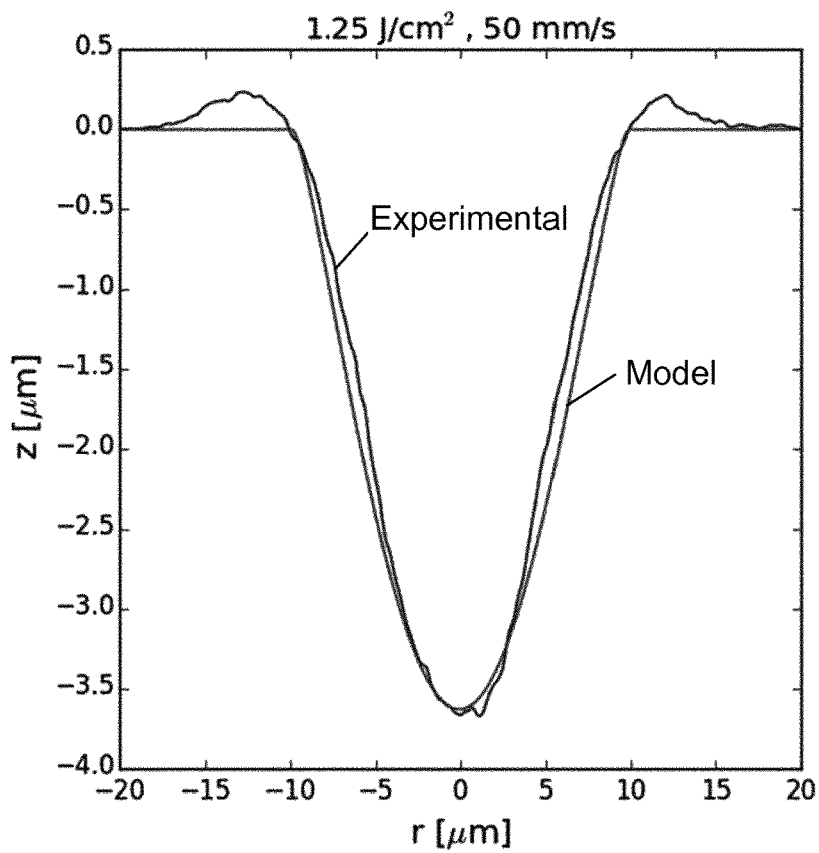

FIGS. 14a and 14b show experimental and simulated profiles obtained on stainless steel 316L with a maximum fluence of 2.14 J/cm$^2$, scanning speed 230 mm/s (FIG. 14a) and 1.25 J/cm$^2$ and scanning speed 50 mm/s (FIG. 14b, polarization p and 250 kHz frequency). A good correspondence between experimental and simulated results is observed with respect to the maximum depth of ablation as well as the ablation profile. On the other hand, the redeposition of material at the edges of the ablation is not taken into account by the simulation. The prediction and learning method of the invention allows better consideration of the redeposition of material at the edges of the ablation performed experimentally.

Figures 15A, 15B, 15C:
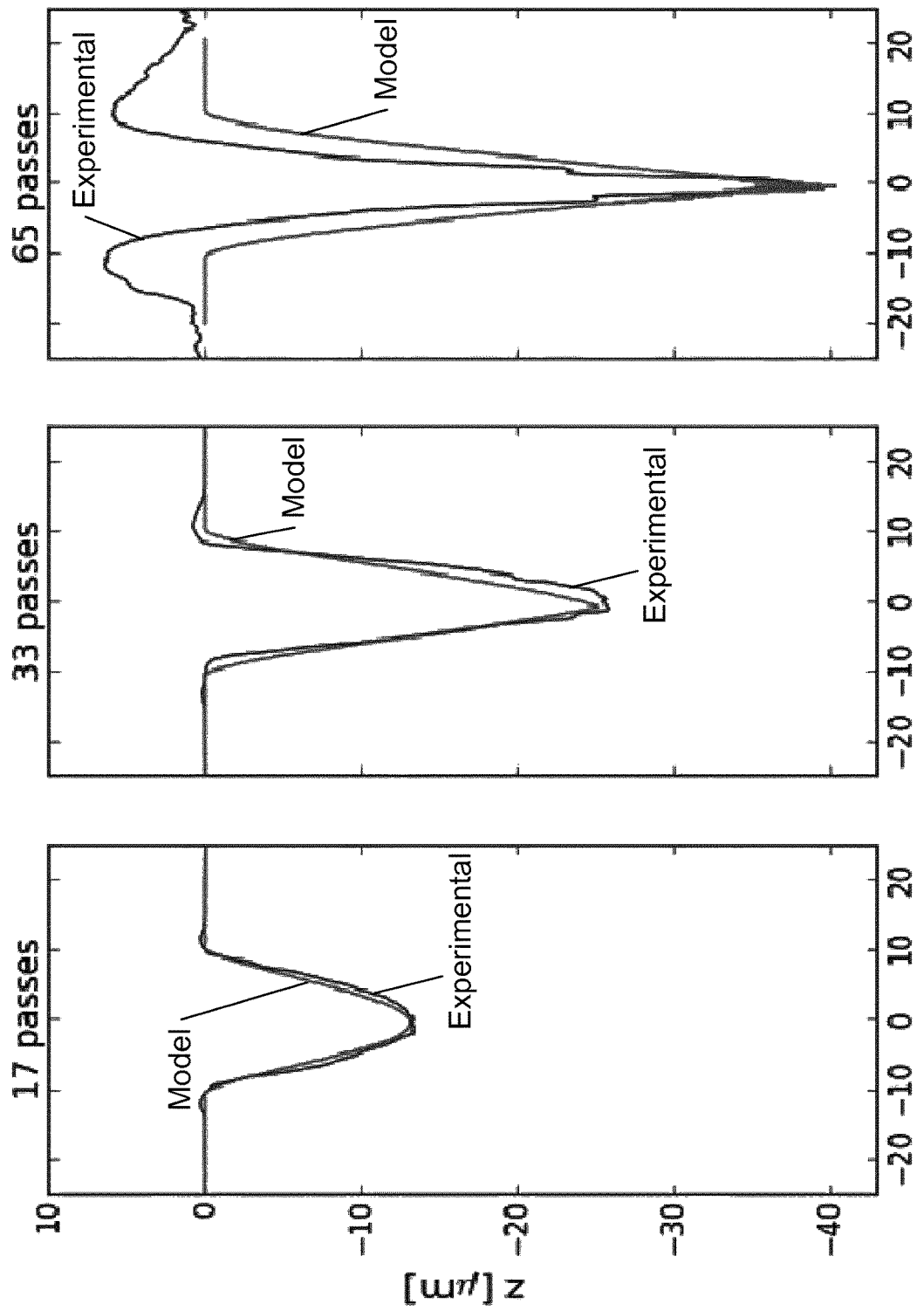

FIGS. 15a, 15b and 15c represent experimental and simulated profiles obtained on stainless steel 316L with a maximum fluence of 1.92 J/cm$^2$, scanning speed 100 mm/s, frequency 100 kHz, the FIG. 15a is obtained after 17 scans, the FIG. 15b after 33 scans and the FIG. 15c after 65 scans. The same observations as for FIGS. 14a and 14b can be observed.

Figure 16A:
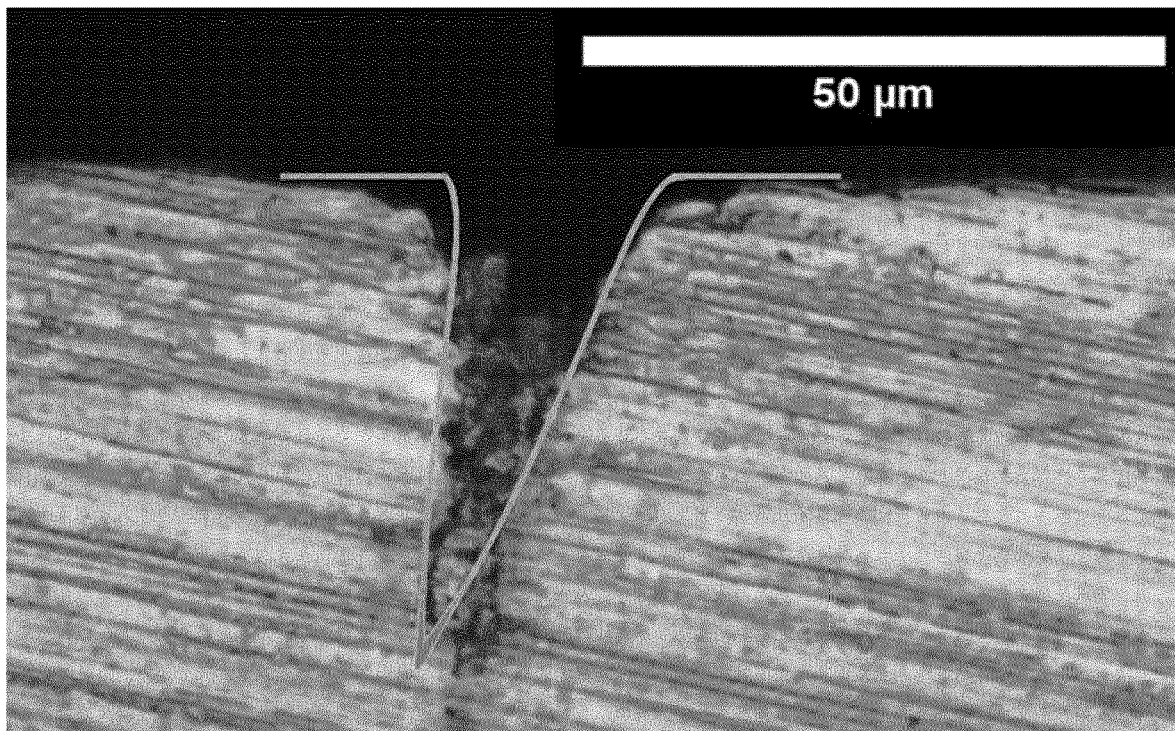
FIGS. 16a and 16b show in FIG. 16a a cross-section of a scan and the corresponding simulated cross section (FIG. 16b) obtained on stainless steel 316L.
Figure 16B:
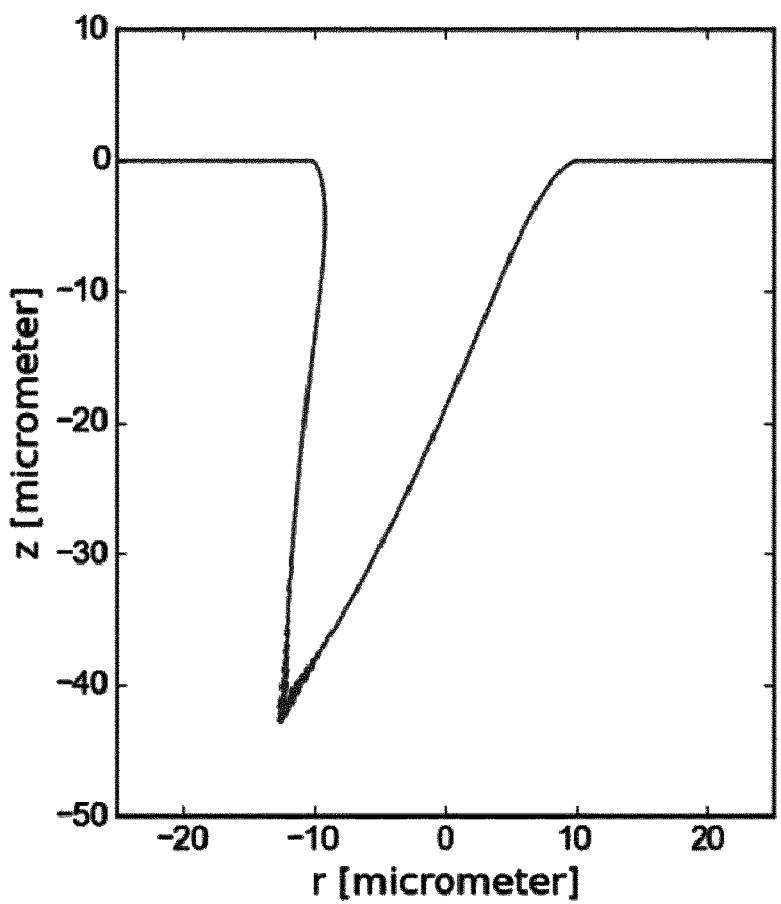

FIGS. 16a and 16b show in FIG. 16a a cross section of a scan and the simulated correspondent (FIG. 16b) obtained on stainless steel 316L with a maximum fluence of 2.9 J/cm$^2$, scanning speed of 500 mm/s, frequency of 100 kHz and 500 passes with the beam tilted of 15° in relation to the normal to the surface. The model of the invention allows a good taking into account of the angle of incidence of the beam incident on the material to be machined. As shown in FIG. 16a, there is a good correspondence between the micrography of the machining (ablation) and the simulation which is superimposed.

Figure 17A:
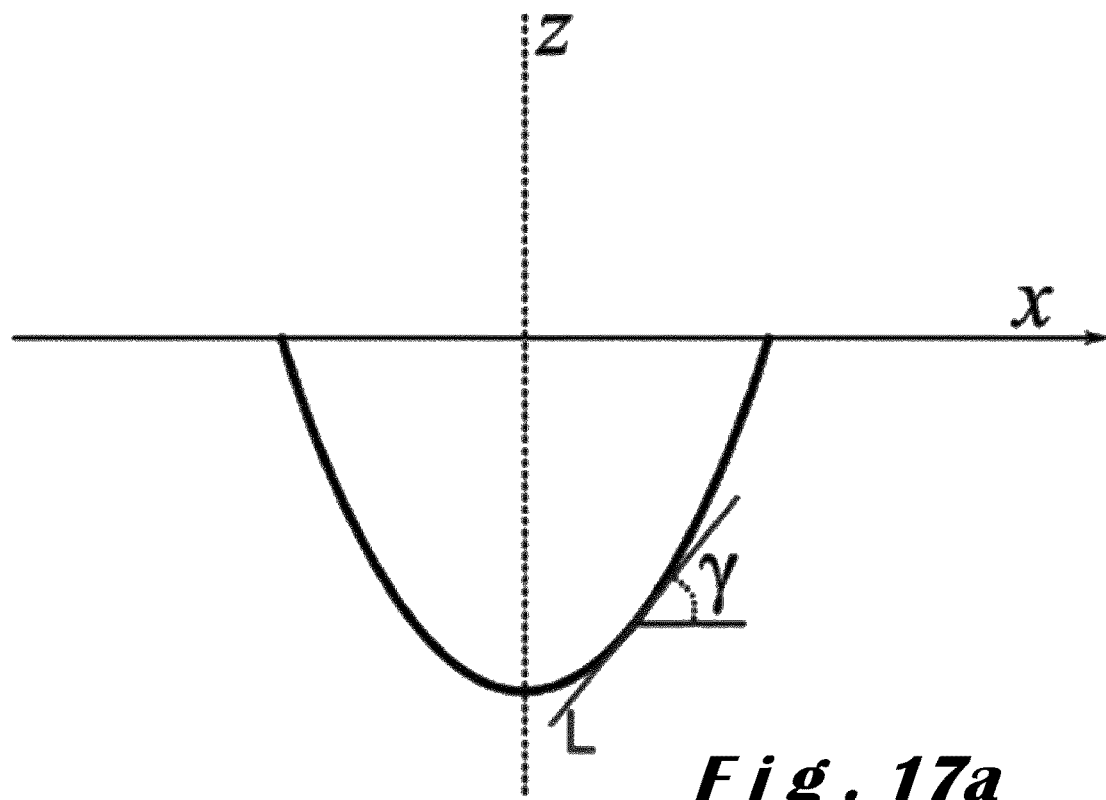
FIGS. 17a and 17b show a schematic representation of a machining with a normal angle of incidence in FIG. 17a and a machining with a non-normal angle of incidence in FIG. 17b.
Figure 17B:
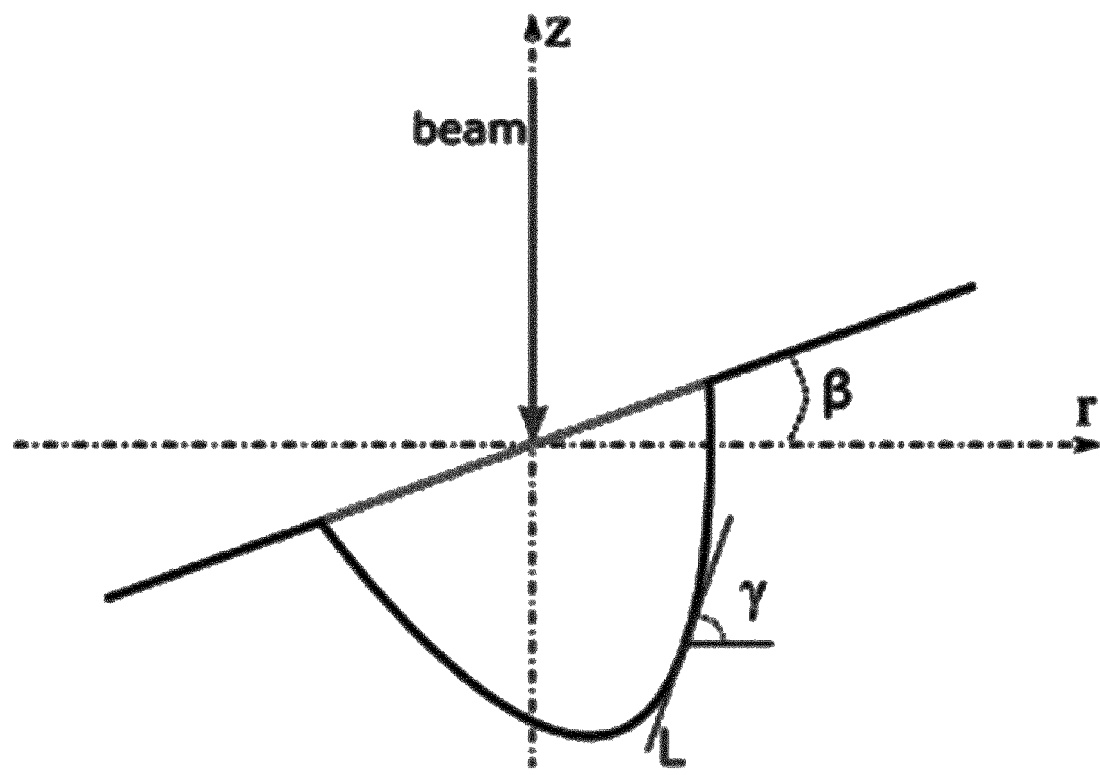

FIGS. 17a and 17b show machining profiles obtained with an angle of incidence normal to the surface of the workpiece and with an angle of incidence describing an angle 90°-β in relation to the surface of the workpiece. For example, these schematic representations with different angles of incidence in relation to the surface of the workpiece enable to calculate the local fluence.

Figure 18:
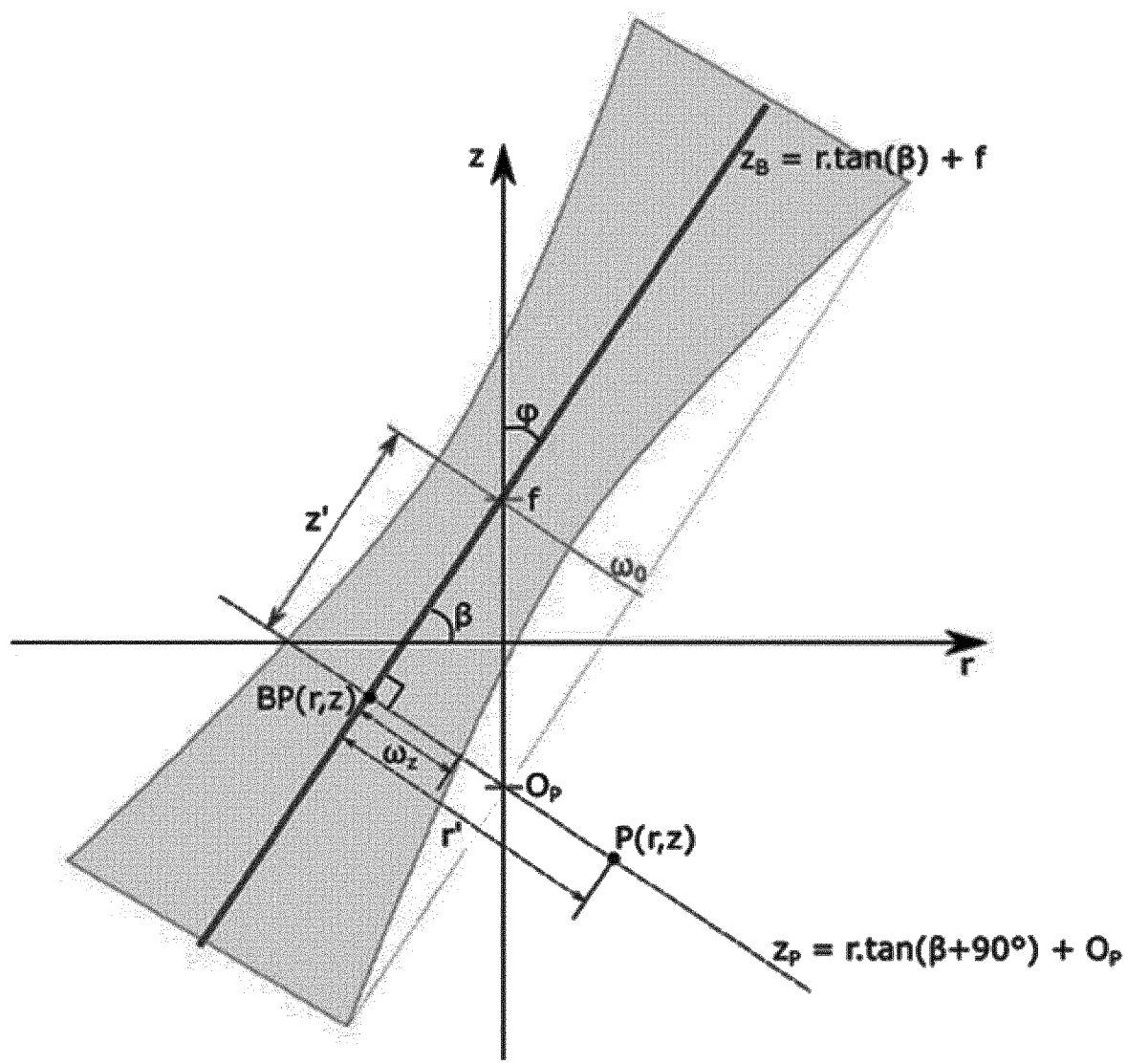
FIG. 18 shows a schematic representation of the angles of a light beam in experiments for the calculation of the local fluence at a non-normal incidence.

FIG. 18 shows a schematic representation of the angles of a light beam in experiments for the calculation of the local fluence under a non-normal incidence. In particular, this schematic representation illustrates the divergence of the beam having a non-normal incidence with a substrate to be machined. The peculiarities caused by this divergence of the focused beam are thus illustrated.

Figure 19B:
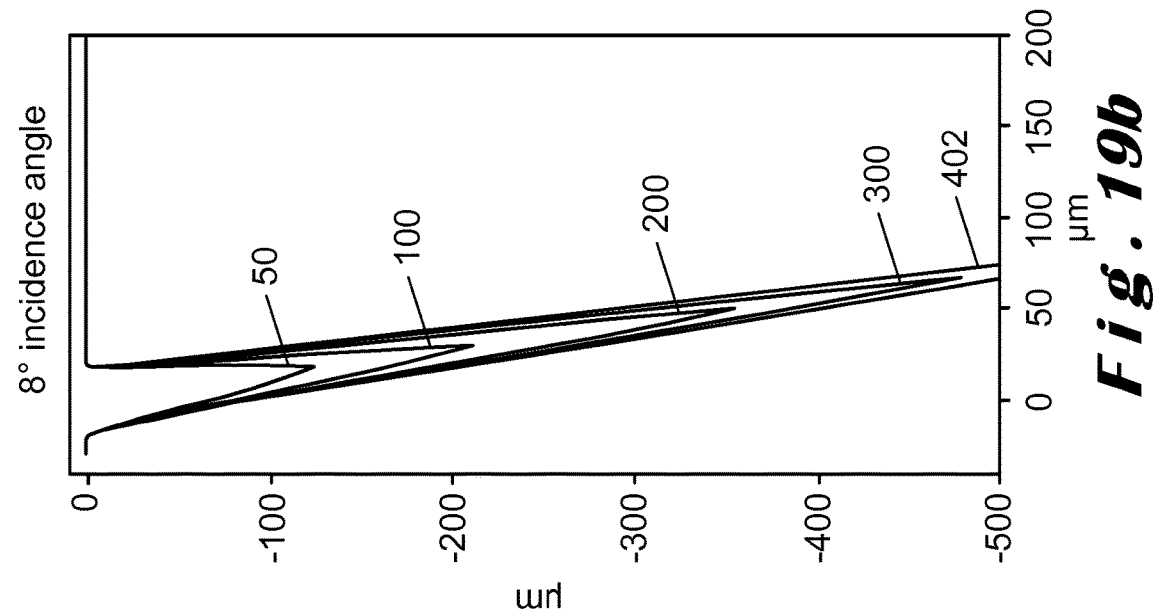
FIGS. 19a and 19b show a comparative example between a simulation of a machining profile according to the prior art (FIG. 19a) and a simulation according to a particular embodiment of the method of the invention for a machining carried out with a machining laser beam having a non-zero angle of attack with the normal to the surface of the material to be machined.
Figure 19A:
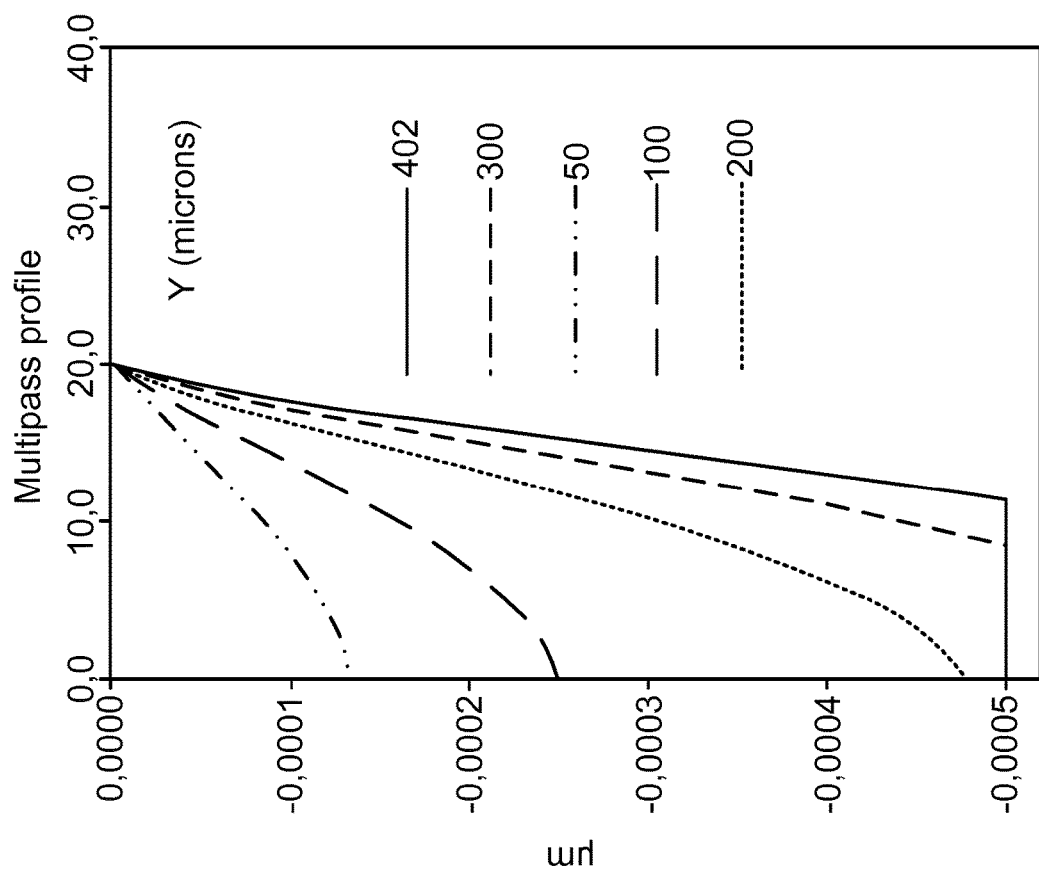

FIGS. 19a and 19b show a comparative example between a simulation of a machining profile according to the prior art (FIG. 19a) and a simulation according to a particular embodiment of the invention (FIG. 19b) for a machining performed with a machining laser beam having a non-zero angle of attack with the normal to the surface of the material to be machined. Both FIGS. 19a and 19b are multipass profiles obtained on stainless steel (in both cases δ=32 nm, $F_{th}(1)$=0.1 J/cm$^2$, S=0.8, n=0.9-2.25i) for $w_0$=14 μm, PRR=200 kHz, Δx=0.75 μm, $F_0$=8 J/cm$^2$ and an angle of incidence of 8°. The numbers in the figures show the number of passes of the machining laser beam for each of the simulated two-dimensional machining profiles. The simulations were therefore carried out for 50, 100, 200, 300, 402 passes. The particular embodiment of the invention which allows the processing of machining laser beams having a non-zero angle in relation to the surface of the material allows a very representative simulation of how the machining would be using the same laser parameters. In the case of the simulation using prior art methods, it is observed that a high number allows a machining flank to be approached perpendicular to the surface of the material but without ever reaching it, which is problematic for the simulation of machining with a conicity of the flanks in relation to the surface of the material which is well controlled. Indeed, the precession or other machining laser beam modules that allow machining with a well-controlled beam angle require suitable simulation tools. The particular embodiment of the invention seems to be one of them. The ordinate axis in FIGS. 19a and 19b represents a simulated ablation depth expressed in μm. The abscissa axis of FIGS. 19a and 19b represents a dimension y corresponding to a dimension parallel to the surface of the material to be machined.

FIG. 20a shows a schematic representation of a machining with a precessional laser machining beam. It shows a material to be machined whose surface corresponds to the coordinate z=0 in relation to the axis z essentially perpendicular to the surface of the material. The laser beam is rotating, especially during precession as indicated by the circular arrow indicating a direction of rotation. The beam comes from the side of this circular arrow and is directed towards the material to be machined. The machining laser beam is shown as passing through the material so as to illustrate the trajectory of the precession laser beam. Thus the laser beam describes a point BFG located on a plane BFG essentially parallel to the surface of the material. As can be seen, the precession beam always passes through the same point at the point BFG. Furthermore, the plane BFI is the plane in which the precessional laser beam is focused. The precession laser beam rotates around an axis represented as being normal to the surface of the material. The precession laser beam therefore describes an angle β for all precession positions of the beam with respect to the axis of rotation of the beam.

Figure 21A:
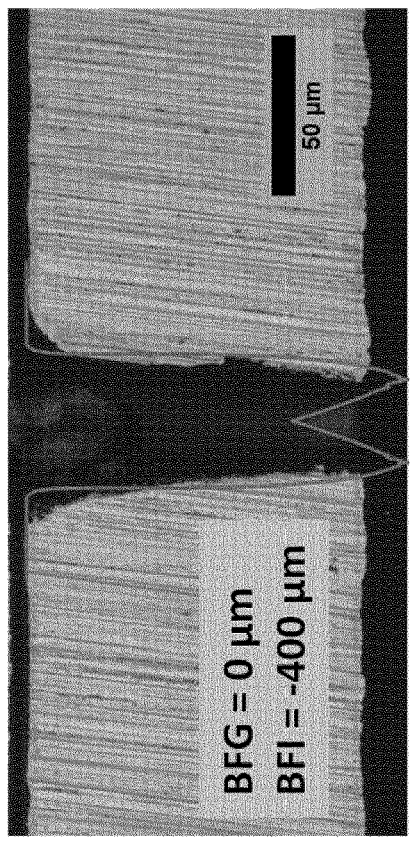
FIGS. 21a and 21c show machining results in the form of cross sectional images of a machining, the machining simulations illustrated in FIG. 21b and FIG. 21c are superimposed to the machining results respectively.
Figure 21B:
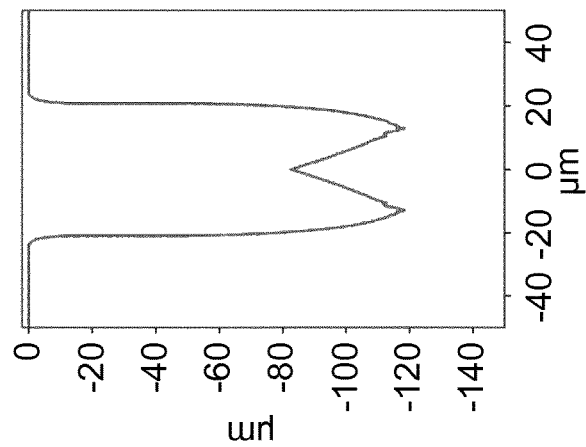

FIGS. 20b, 20c, 21b and 21d show machining simulations according to a particular embodiment of the invention for a precession laser beam as shown schematically in FIG. 20a. FIGS. 20b, 20c, 21b and 21d show two-dimensional machining profiles along the axes y, z, with the ordinate axis representing the dimension z (depth of ablation) and the abscissa axis representing the dimension y. FIG. 20b corresponds to a simulation according to the particular embodiment of the invention allowing the simulation of a precession laser machining beam with BFG=150 µm and BFI=−50 µm. Similarly, FIG. 20c was obtained with BFG=−100 µm and BFI=−500 µm. The simulations in FIGS. 20b and 20c were obtained with the laser parameters: $w_0$=10 µm, PRR=500 kHz, $E_p$=20 µJ, ω=30000 rpm, β=4.5°, machining time=50 ms. FIG. 21b corresponds to a simulation according to the particular embodiment of the invention allowing the simulation of a precession laser machining beam with BFG=0 µm and BFI=−400 µm. Similarly, FIG. 21d was obtained with BFG=−100 µm and BFI=−500 µm. The simulations in FIGS. 21b and 21d were obtained with the laser parameters: $w_0$=12 µm, PRR=100 kHz, $E_p$=27 µJ, ω=30000 rpm, β=4.5°, machining time=50 ms.

Figure 21C:
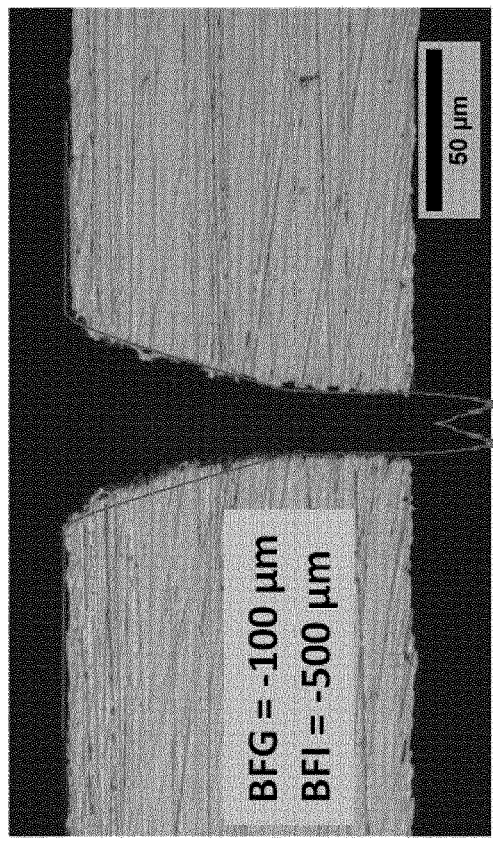
Figure 21D:
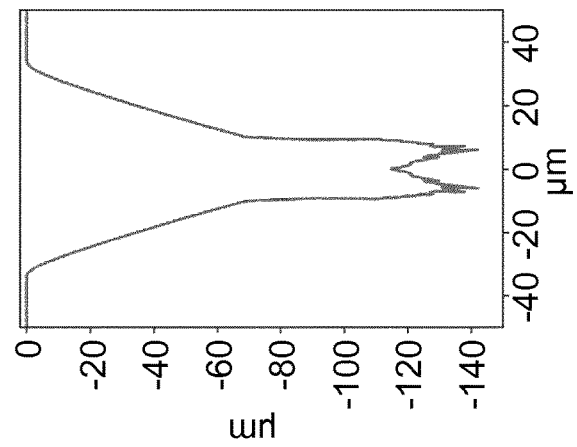

FIGS. 21a and 21c show machining results in the form of cross-sectional cutting images of a machining, the machining simulations shown in FIG. 21b and FIG. 21c are superimposed on the machining results respectively. It is thus observed that the machining simulations allow a good anticipation of the machining obtained on the basis of the same parameters for a precession laser machining beam.

Figure 22B:
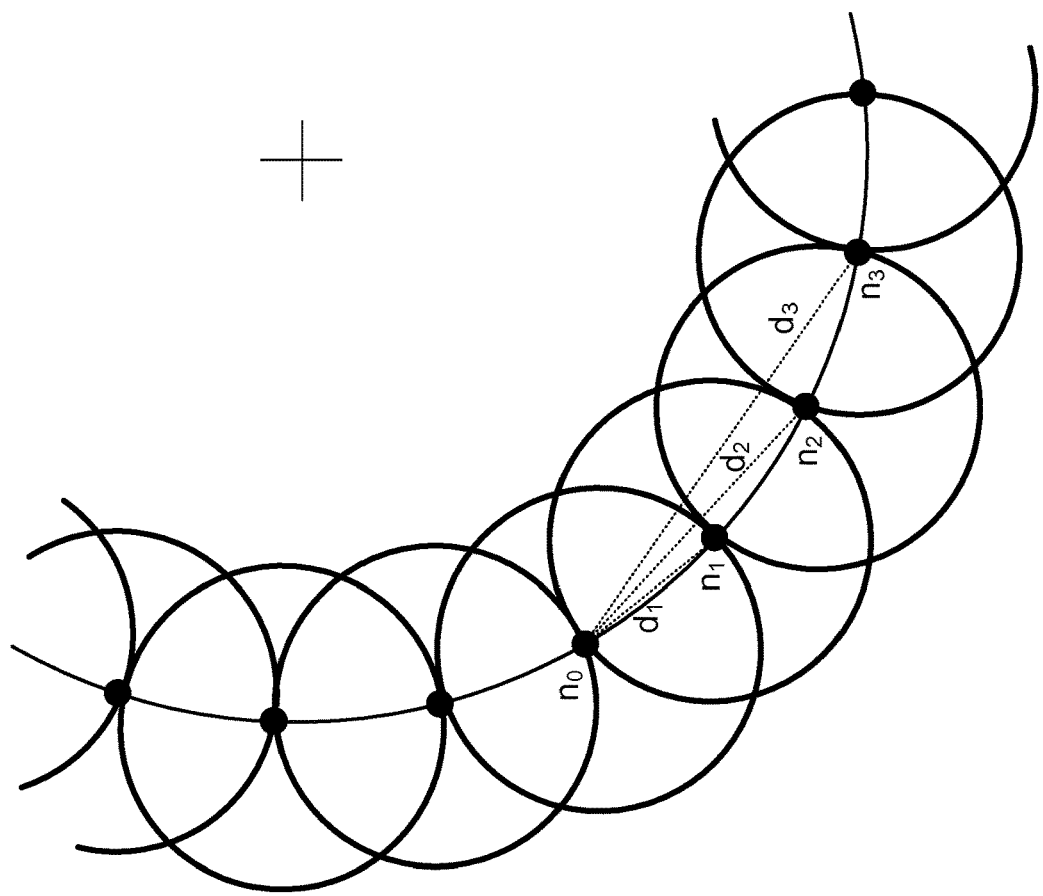
Figure 22A:
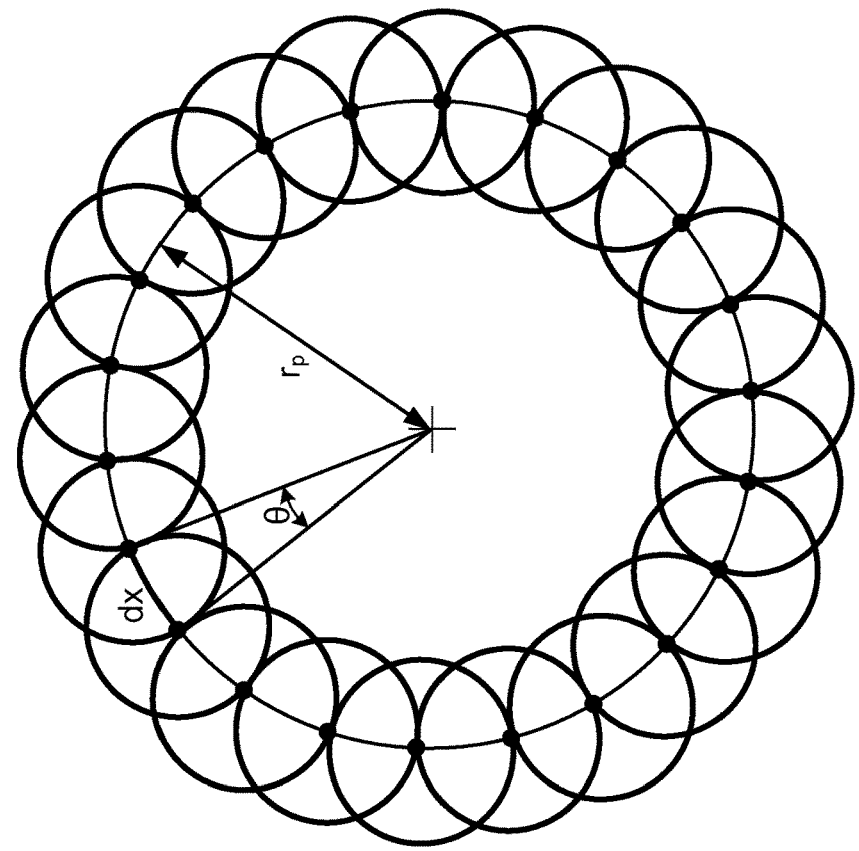

FIG. 22a shows a schematic representation of the points of impact of a precessing or rotating machining laser beam, FIG. 22b shows a detail of FIG. 22a. FIG. 22a, shows the pulse superposition of a precession laser machining beam. Around an axis represented here by a point because it is a projection of the laser pulses in a plane, preferably on the surface of the material. The axis of rotation of the precession laser beam is therefore perpendicular to the surface of the material and therefore represented by a point. Each circle represents one pulse. The center of each pulse is located on a precession circle centered on the axis of rotation of the machining laser beam. The precession circle has a radius $r_p$. The distance between the center of each adjacent circle on the precession circle is dx. Preferably dx is constant during machining. The center of each adjacent circle describes an angle θ in relation to the precession axis. FIG. 22b represents a detailed view of FIG. 22a in which, the center of the circles corresponding to a pulse is named $n_0$, $n_1$, $n_2$, $n_3$, . . . . The distance between $n_0$ and $n_1$ is $d_1$, the distance between $n_0$ and $n_2$ is $d_2$, the distance between $n_0$ and $n_3$ is $d_3$.

FIGS. 23 to 31 show flow diagrams describing the individual components of a laser machining system and the possible steps or decisions that can be taken. In particular, these flow diagrams show the means allowing the flow of information and allowing to achieve the machining of a material with optimum parameters or allowing to enrich a material database and/or functions learned by a machine learning.

Figure 23:
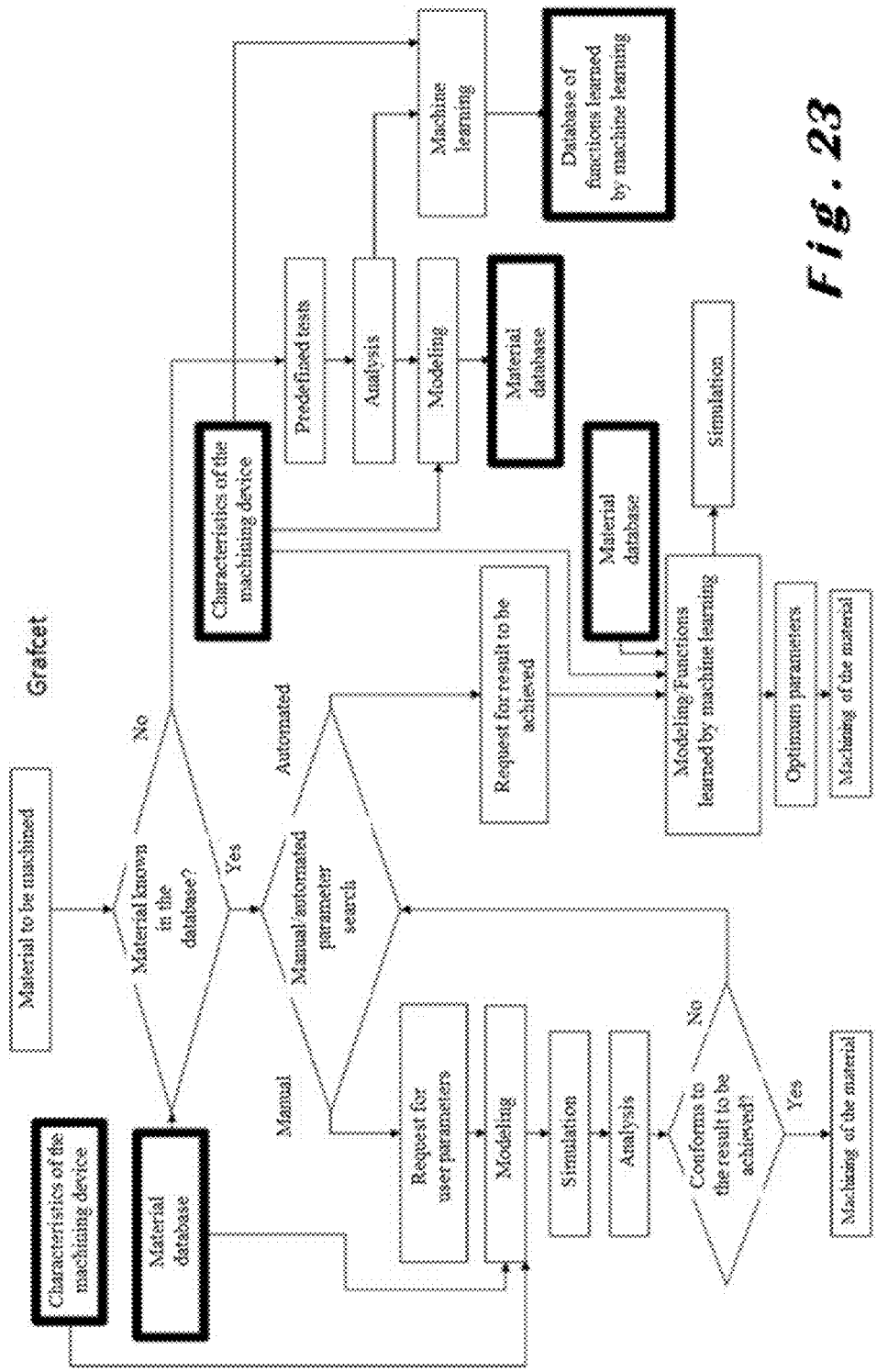
FIGS. 23 to 31 show flow diagrams of the preferred embodiments of the invention.

FIG. 23 represents a Functional Graph for Step and Transition Control (Grafcet) or functional flowchart of the different actions available according to the invention. In particular, this flowchart shows that the method of the invention may decide, in the event that the parameters of a material are not available in a database, to resort to the launching of a predefined test machining in order to allow the acquisition of data in relation to the said material to be machined.

FIG. 23 shows the following procedure: a material to be machined is communicated to the laser machining system, which queries whether information about this material is present in a material database or in a database of learned functions. In the case of a positive answer, it is then possible to choose between manual or automated determination of the machining parameters.

If the machining parameters are determined in an automated manner, the central unit sends a request for knowing the machining result sought. This result to be achieved can also be communicated when the material to be machined is communicated. On the basis of the result to be achieved (target result) defined by the user, the laser machining system and in particular the central unit collects information about the characteristics of the machining device as well as the information available in one of the databases about the information of the material to be machined. The learning central unit then enables the exploitation of the means for modelling and/or machine learning by taking into account the information of the material to be machined, the characteristics of the machining device and the machining result sought. The learning central unit can then generate optimal machining parameters. These optimal machining parameters are then transmitted to the laser machining device in order to start the laser machining of the material to be machined according to the result to be achieved. It is possible that the learning central unit is connected to the laser machining device via a network connection so that the learning central unit can be relocated in relation to the laser machining device.

If the machining parameters are determined manually, the learning central unit sends a request to obtain parameters from the user for a result to be achieved. Preferably the parameters transmitted by the user are those parameters which the user believes to be the optimum results. However, several iterations are often necessary for the operator of the laser machining system to specify parameters that will achieve the result to be achieved. When parameters are communicated by the user, then modeling means are implemented. The modelling means preferably comprises a model including an algorithm allowing an estimation of the machining on the basis of the parameters provided. Thus simulation means coupled to the modeling means enable to carry out a simulation of the result expected to be obtained on the basis of the parameters communicated. The operator can then compare the simulation of the result on the basis of the parameter with the result to be achieved. If the operator considers that the simulation does not conform (or sufficiently conforms) to the result to be achieved and communicates this to the learning central unit, then the learning central unit offers a choice between manual or automated determination of the machining parameters. The operator can then decide to test several different machining parameters manually until a simulation of the result expected on the basis of the communicated parameters conforms to the result to be achieved. When the operator is satisfied with the simulation of the result (machining) expected on the basis of the communicated parameters, then he can decide to start machining on the basis of the parameters used in the last modeling and simulation. The operator can choose at any time to use the automated parameter search so that the laser machining system uses the automated mode as described above. The learning central unit then sends a request to know the machining result sought and determines the optimal machining parameters as described above and as represented by the flowchart. During the modeling/simulation step in manual mode, the modeling/simulation means have access to the material database as well as to the characteristics of the machining device.

If the query as to whether information on the material to be machined is present in a material database or in a database of learned functions is answered in the negative, the laser machining system then defines predefined machining tests. These predefined machining tests enable the laser machining system to produce a predefined machining on a material, preferably the material in the material database being identical to the material to be machined, the machining being analysed by the analysis unit and the analysis results being transmitted to the learning central unit.

The results of the analysis are either communicated to modeling means for extracting physical or material light interaction parameters specific to the material to be machined. Modeling means for receiving information about the characteristics of the machining device. The parameters determined by the modelling means are then machining parameters which are communicated to the material database in order to enrich it. When the material to be machined is known in the database, it is then possible to continue the machining process and in particular towards the stage proposing a manual (this invention) or automated parameter search.

When the analysis results are reported to the learning central unit, the learning central unit having access to the characteristics of the machining device enables to generate machining parameters in the form of machining data comprising machining results obtained according to the laser machining parameters used. This machining data is communicated to the learning database. In a preferred embodiment, the material database and the learning database are common and all machining parameters are then accessible from either database. Thus, when the question arises as to whether the material is known in the database, having the characteristics of the material to be machined in the form of physical parameters or in the form of a learning database enables to answer this question in the affirmative.

Figure 24:
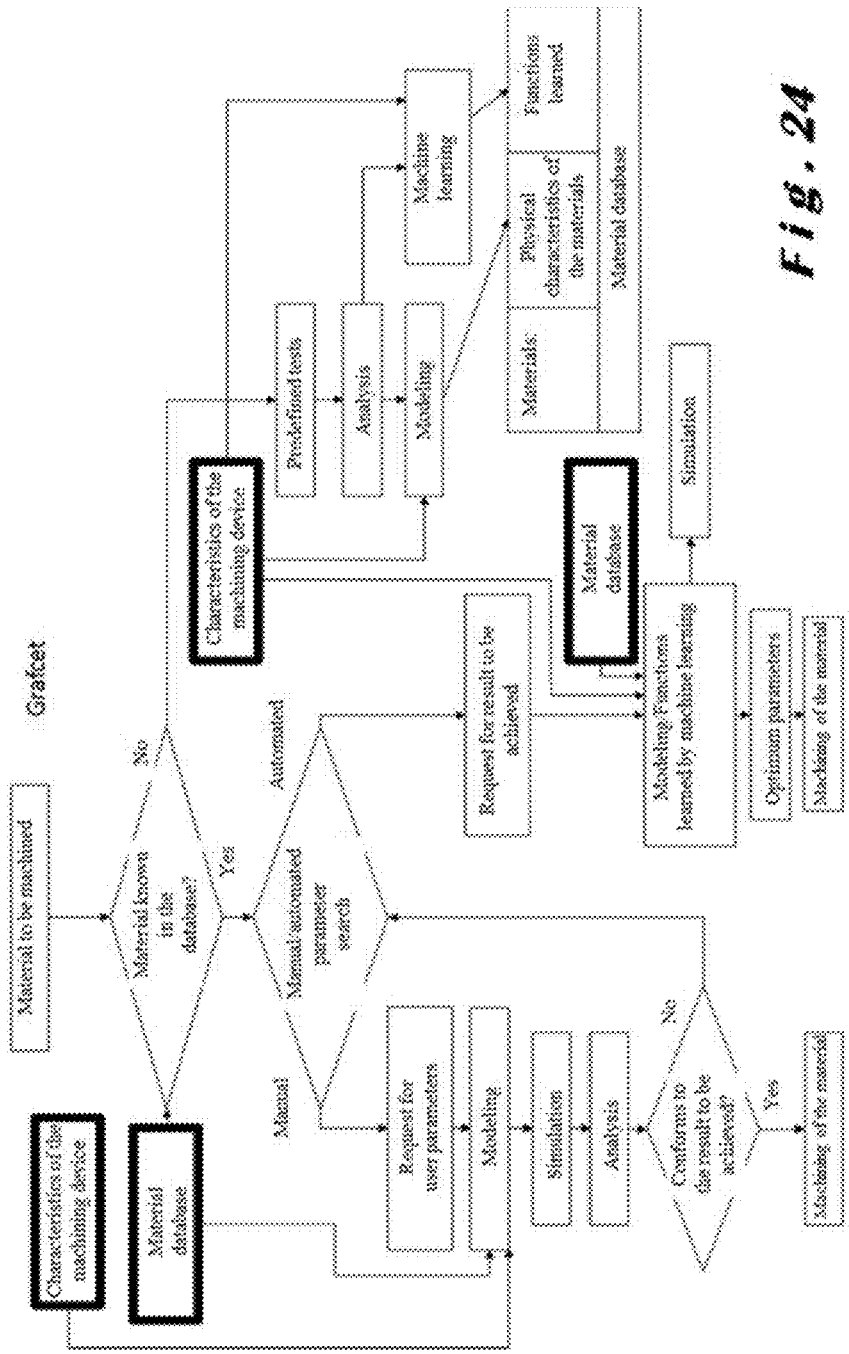

The embodiment described in the previous paragraph is shown in FIG. 24. Thus, the same database allows to gather for the same material, the physical characteristics of the materials as well as the information in relation to the laser machining system so as to form a learning database for the implementation of an machine learning algorithm. Preferably the physical characteristics of the materials as well as the information for the learning represent the learning database. The operation of the flowchart described for the FIG. 23 applies to the FIG. 24 mutatis mutandis.

Figure 25:
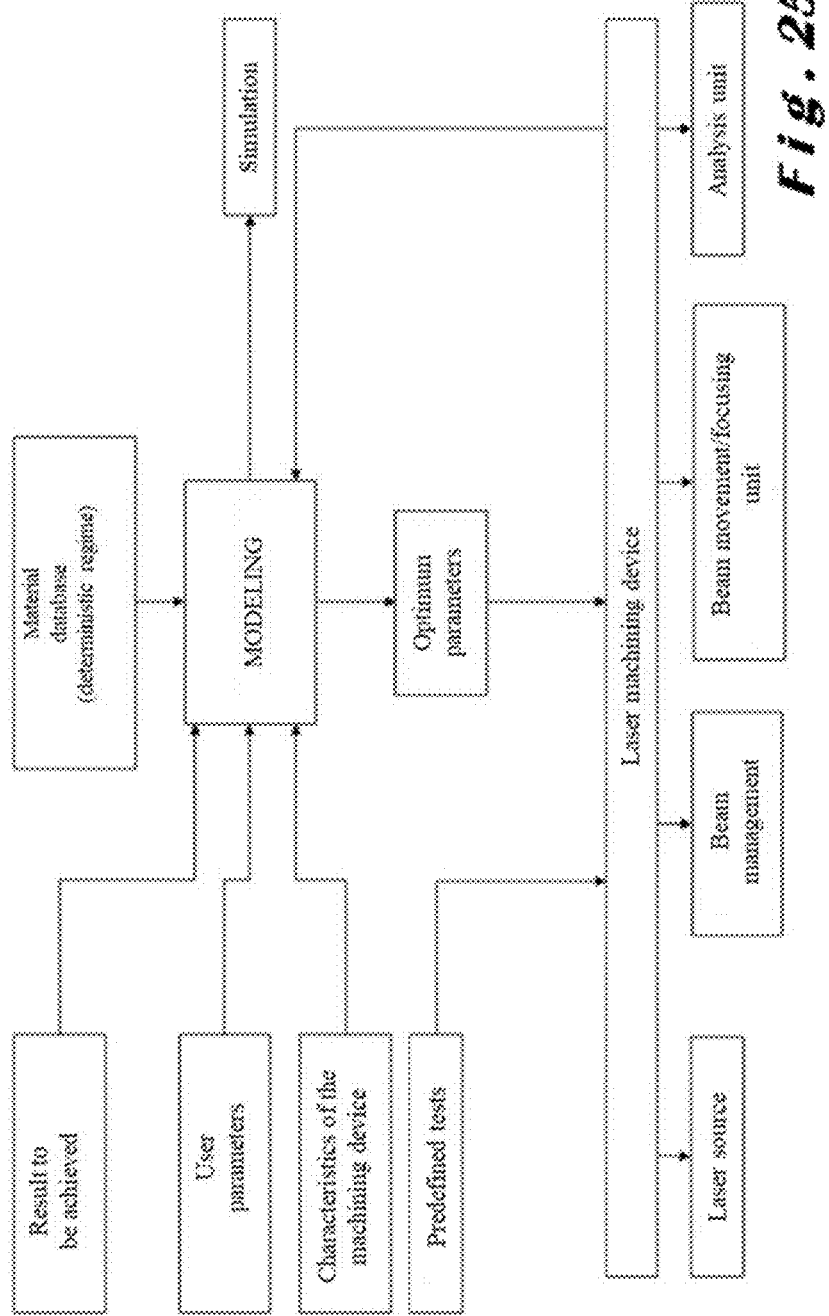

FIG. 25 shows an embodiment of the invention for determining the optimum machining parameters in a deterministic regime for a laser machining system. In particular, this embodiment is based primarily on the use of known algorithms as described by the invention. This embodiment also allows the simulation of ablations which would be obtained for laser parameters obtained by the algorithms of the invention or defined by a user. This figure describes the embodiments detailed in FIGS. 26 to 28. These embodiments are derived from the flowcharts shown in FIGS. 23 and 24.

Figure 26:
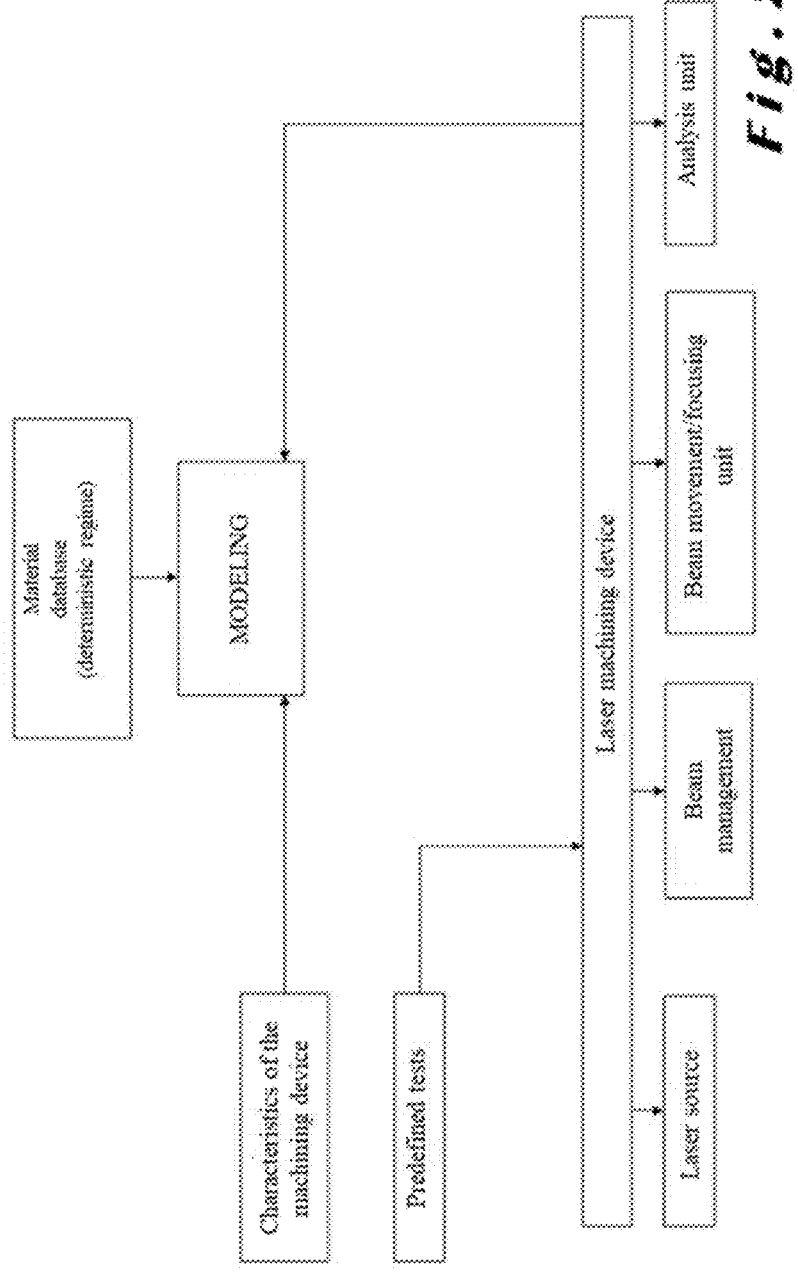

FIG. 26 shows an embodiment of the invention allowing the feeding of physical material characteristics to the material database, for example in the case where a predefined test has been machined and for which the results are communicated to the modeling means as described for FIGS. 23 and 24. The arrow connecting the material database to the modelling means can be interpreted in either direction. The purpose of this embodiment is the determination and the storage of experimental parameters in a database. From a machining performed by a laser machining device, the results of this machining are communicated to a central unit which allows the experimental data to be processed in order to extract physical parameters of materials.

Figure 27:
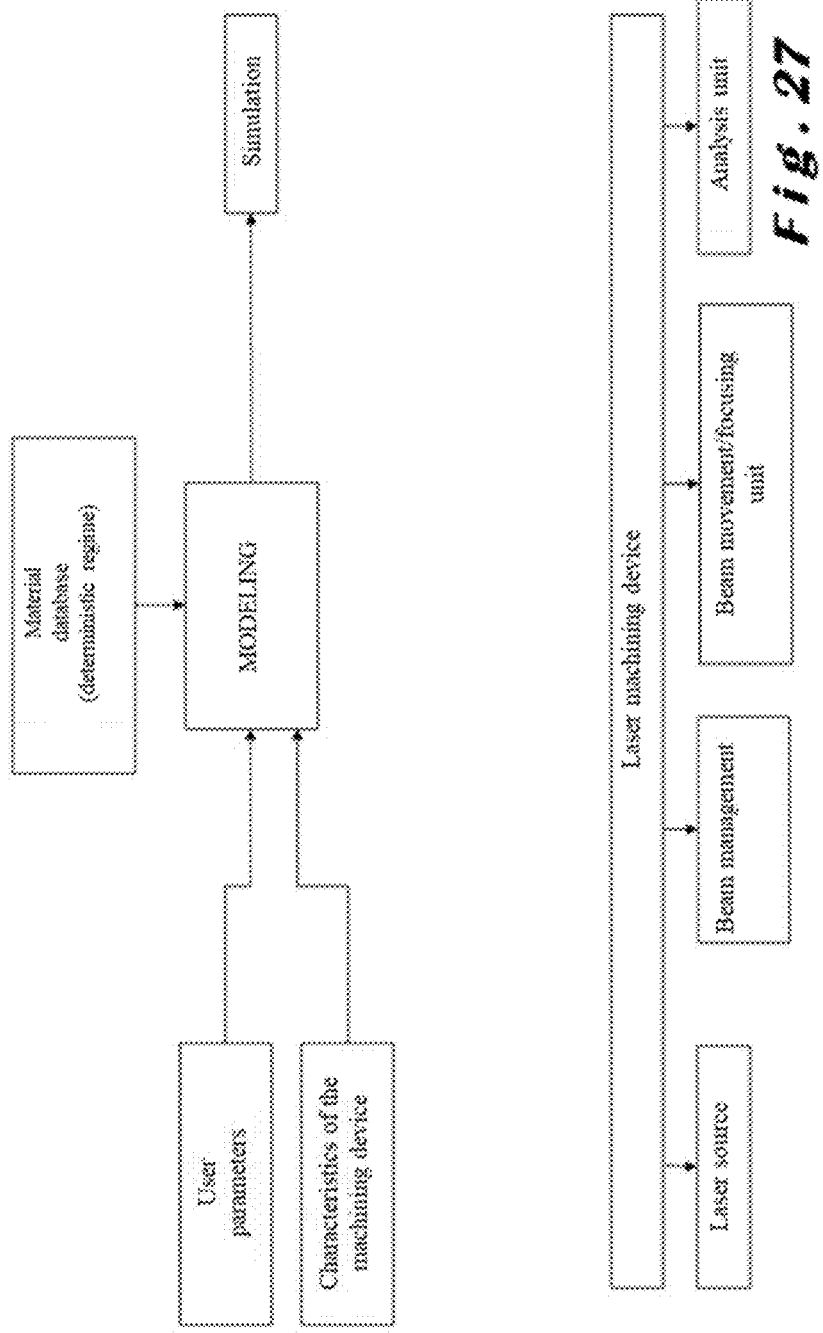

FIG. 27 shows an embodiment of the invention allowing the simulation without necessarily requiring the use of a laser machining device. Physical characteristics of materials previously stored in the material database allow a simulation of the results that could be obtained for machining according to user parameters and characteristics of the machining device.

Figure 28:
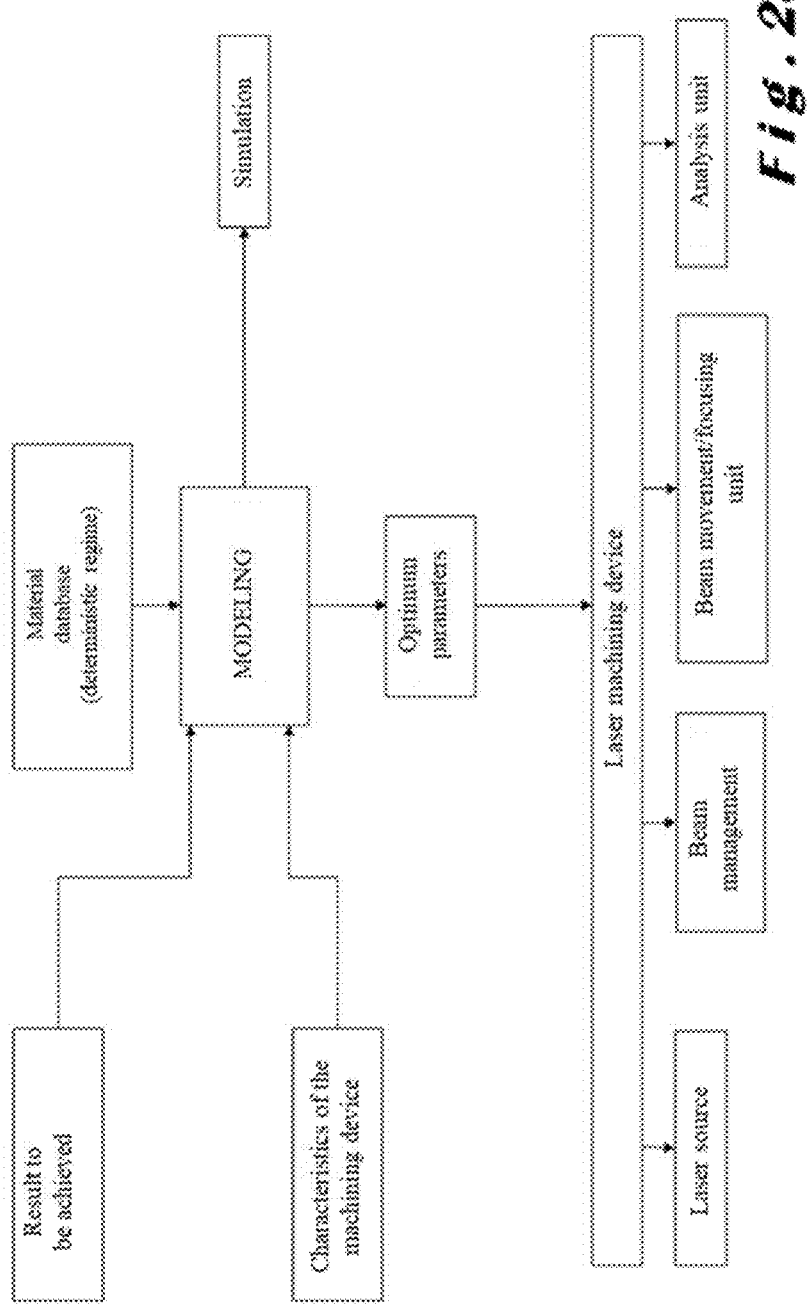

FIG. 28 shows an embodiment of the invention for determining optimal machining parameters from the results to be achieved, the characteristics of the laser machining device and from a database comprising physical characteristics of materials, for example observed and stored in the material database during previous machinings.

Figure 29:
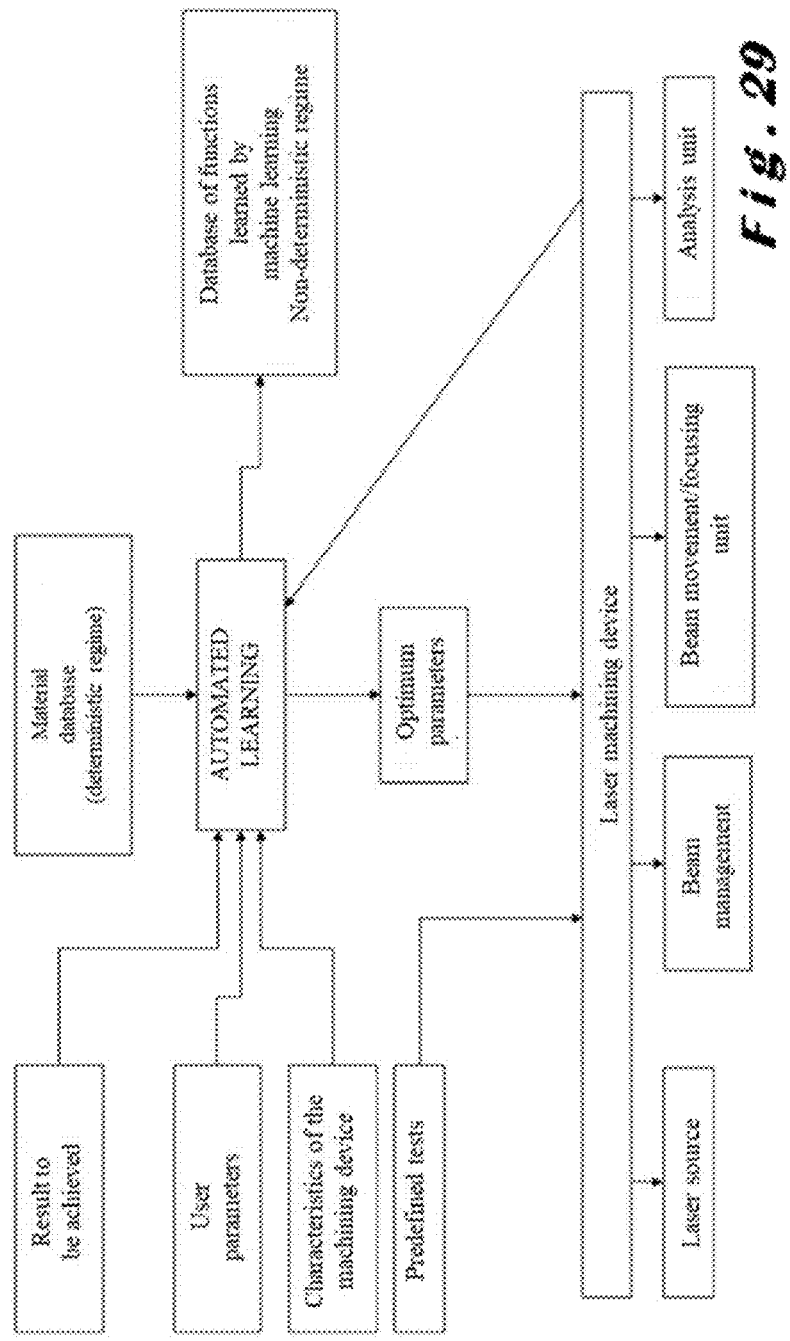

FIG. 29 shows an embodiment of the invention and in particular an embodiment of the invention based on machine learning means for taking into account physical characteristics of materials or functions learned by the machine learning. A learned function is the result of the learning of a learning algorithm itself included in a learning function. This information is preferably stored in a database or in several databases. This embodiment is preferably based on a non-deterministic optimal parameter determination regime, i.e. not necessarily using modelling means comprising an algorithm defining deterministic functions.

Preferably, the embodiment detailed in FIG. 29 includes a learning function whose learned functions (resulting from the learning) are stored in a database. This embodiment allows the method of the invention to learn and refine the optimal parameters based on past experiences and observations. For example, experiments conducted on other laser machining devices are taken into account in learning the algorithm for determining optimal machining parameters by accessing the learning database. This embodiment also allows the performance of a specific experiment for collecting experimental data in order to obtain optimal machining parameters for a target machining. For example, predefined tests are available in the laser machining system of the invention and are applicable when it is considered necessary to obtain machining with high fidelity in relation to a target machining.

Figure 30:
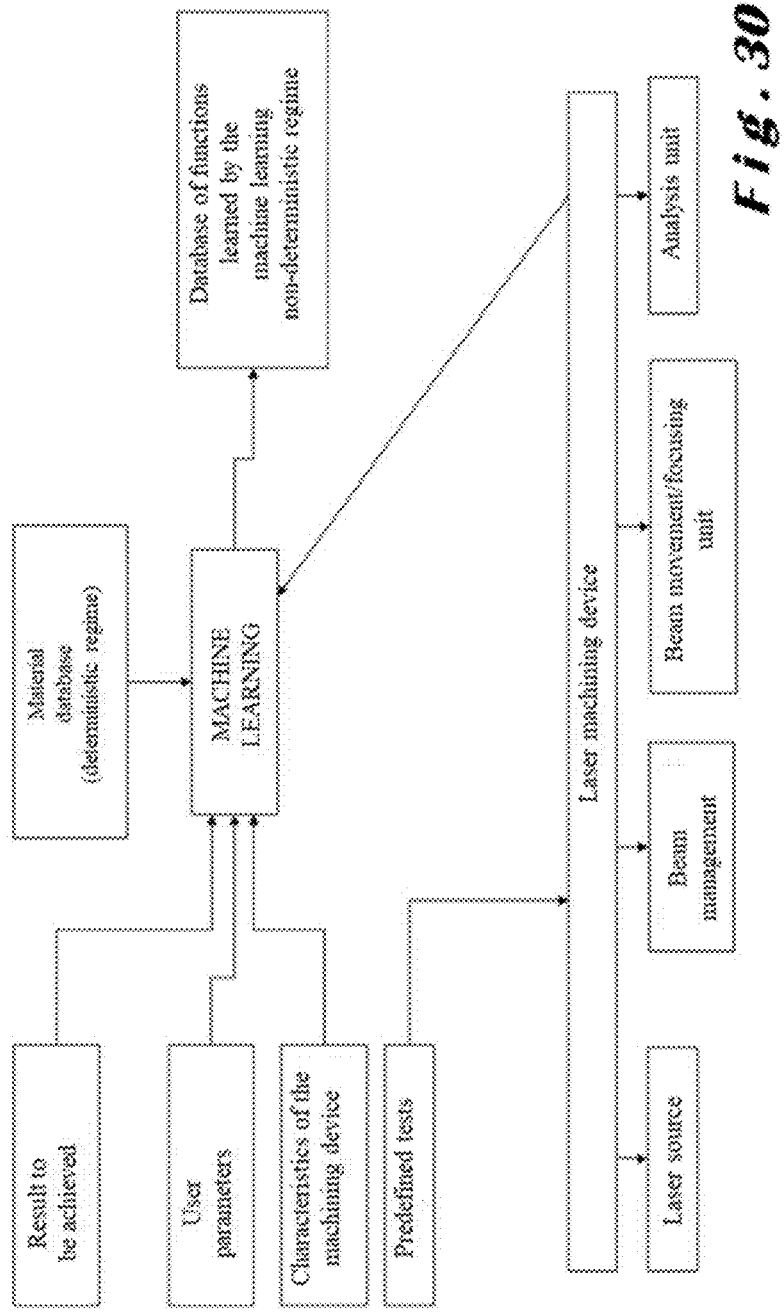

FIG. 30 shows a particular embodiment of the FIG. 29 allowing machine learning and recording the learning functions as learned functions. FIG. 30 shows the feeding of the database of learned functions by the machine learning in non-deterministic regime. Preferably, this embodiment implements a predefined machining test, which can be started on a selected material. For example, a predefined machining test is defined in FIGS. 2, 3*a*, 6*a*, 6*b*, 7*a*, 7*b*. These tests allow, after characterization of the machinings obtained by the analysis unit, the machine learning and the determination of a learned function. The results of these tests and of the learned functions generated by taking these tests into account are then stored in a learning database.

Figure 31:
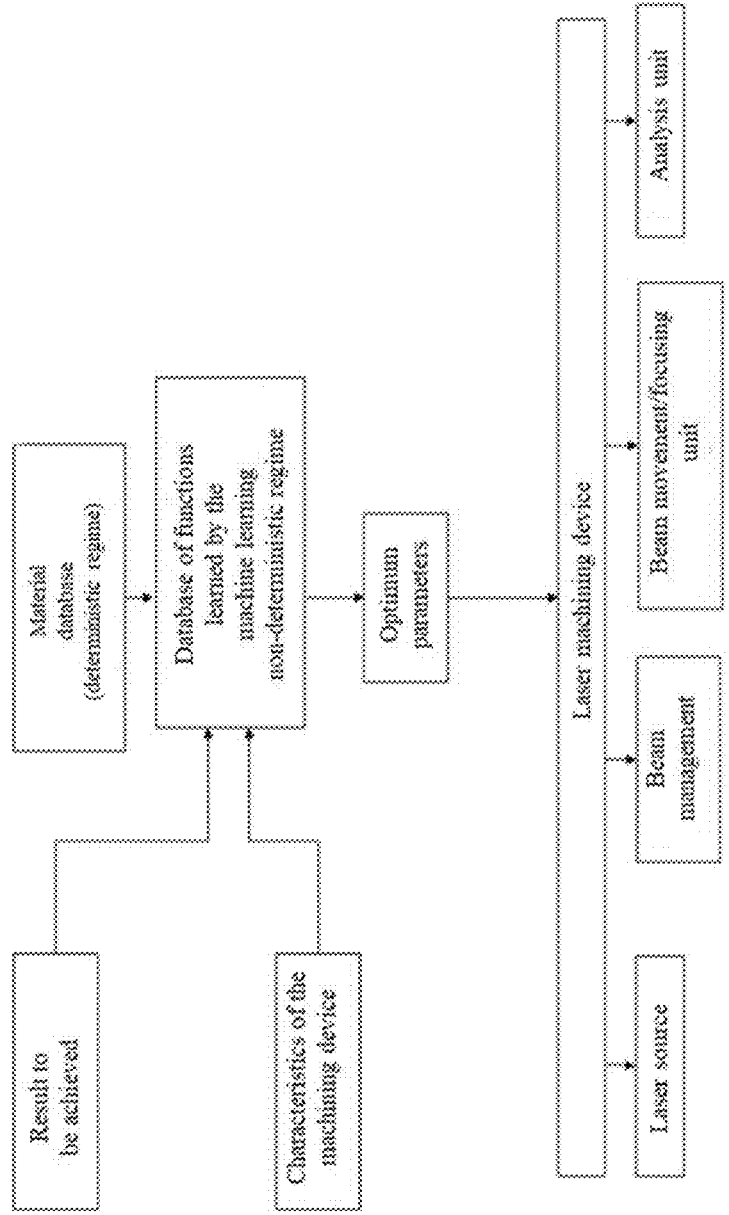

FIG. 31 shows an embodiment for machining a workpiece using the optimum parameters generated by the central unit or by the learning means on the basis of the learned functions corresponding to the material to be machined. This embodiment allows to obtain machining results very close to the desired target machining and very quickly. The FIG. 31 shows the prediction of the optimum machining parameters in non-deterministic regime, i.e. by learning the learning function from the learning database on the basis of the learning algorithm.

The present invention has been described in relation to specific embodiments, which have a purely illustrative value and should not be considered as limiting. In general, the present invention is not limited to the examples illustrated and/or described above. The use of the verbs "comprise", "include", "comsist", or any other variant, as well as their conjugations, can in no way exclude the presence of elements other than those mentioned. The use of the indefinite article "a", "an", or the definite article "the" to introduce an element does not exclude the presence of a plurality of such elements. Reference numbers in claims shall not limit their scope.

In summary, the invention may also be described as follows.

A method for determining laser machining parameters for the machining of a material with a laser machining system comprising inter alia the steps of:

a) providing said central unit with a learning machining function capable of learning on the basis of said plurality of machining data samples, said learning machining function comprising an algorithm capable of defining for said machining result sought and for said machining system the following laser machining parameters:
  a polarization,
  an $E_p$ pulse energy,
  a diameter at the focal point w,
  an order of the gaussian p,
  a pulse repetition rate PRR n,
  a wavelength;

b) making said learning machining function to learn so that said laser machining system can machine said material to be machined according to the machining result sought.

The invention claimed is:

1. A method for determining laser machining parameters for the machining of a material with a laser machining system and comprising the following steps:
  a) providing a learning database comprising a plurality of pairs of machining data samples comprising machining results obtained as a function of the laser machining parameters used;
  b) providing a central unit;
  c) defining at said central unit a machining result sought of a material to be machined;
  d) providing said central unit with a learning machining function capable of learning on the basis of said plurality of pairs of machining data samples, said learning machining function comprising an unsupervised learning algorithm, a supervised learning algorithm, a semi-supervised learning algorithm, or a reinforcement learning algorithm, wherein the learning machining function is capable of defining for said machining result sought and for said machining system the following laser machining parameters:
  information regarding a polarization of said machining laser beam,
  a pulse energy of said machining laser beam $E_p$,
  a diameter of said machining laser beam at the focal point w,
  an order of the Gaussian p of said machining laser beam between 1 and 20,
  a pulse repetition rate PRR of pulses n of the machining laser beam,
  a wavelength of the machining laser beam;
  e) making said learning machining function with said central unit to learn on the basis of said plurality of pairs of machining data samples, so that said laser machining system can machine said material to be machined according to the machining result sought, by providing it with the machining parameters determined by said learning machining function when learning it, wherein the method further comprises the following additional steps:
  f) providing a laser machining system comprising:
    said material to be machined;
    said laser machining device comprising:
      a laser source for emitting an ultra-short laser beam, less than 100 ps, onto said material to be machined;
      a control unit for controlling the emission of said laser beam from said laser source;
      a unit for analyzing the state of said material to be machined connected to said learning database;
    said central unit for controlling said control unit;
    said database;
  g) machining said material with said laser source configured with said laser machining parameters determined by said learning machining function in step e);
  h) acquiring machining results with said analysis unit after the step g) the machining result comprising the redeposition of material at the edges of the ablation and roughness;
  i) transmitting said machining results and said machining parameters used in machining in the step g) to said central unit, said central unit being configured to communicate a machining data pair comprising machining results obtained according to the laser machining parameters used;
  j) enriching said learning database with said machining data pair.

2. The method according to claim 1 wherein the plurality of samples of the learning database at least partly comprises information in relation to the material being machined, this information comprises at least one of the following information:
  a delta δ related to a penetration depth of the machining laser beam into the material,
  a threshold fluence $F_{th}$ related to a minimum energy density of the laser beam allowing machining,
  an incubation coefficient S, between 0 and 1, related to the dependence of the threshold fluence based on a number of pulses of the laser beam at the same point,
  a complex refractive index n+ik.

3. The method according to claim 1 wherein:
  the laser machining system is capable of emitting a laser machining beam moving in an direction x and wherein,
  said learning function of step d) is capable of further defining the following laser machining parameters:
  a distance of the focusing point of the laser machining beam from the surface of the material to be machined,
  a speed (v) of movement of the laser machining beam relative to said material to be machined,
  an angle of incidence of the machining laser beam with respect to said surface of the material to be machined,
  a number of lines to be machined,
  a distance between said lines previously defined,
  a number of passes of the machining laser beam on each line to be machined.

4. The method according to claim 1 wherein:
  the laser machining system is a system capable of emitting a laser machining beam in rotation about an axis of rotation, and wherein, said algorithm of said learning function of step d) is capable of further defining the following laser machining parameters:
a rotational speed ω of said laser beam about said axis of rotation,
a distance BFG from a surface of said material to be machined for which the rotating laser beam describes a fixed spot for all rotating laser machining beam positions,
a distance BFI from a surface of said material to be machined at which the rotating laser beam is focused,
an angle of incidence β of the rotating machining laser beam for all the positions of the rotating laser beam in relation to the normal to the surface of the material,
an activation time of the rotating machining laser beam.

5. The method according to claim 4 wherein the machining laser beam is a machining laser beam rotating about an axis of rotation and a point of rotation located at said distance BFG from said surface of said material to be machined.

6. The method according to claim 4 wherein the center of each pulse is located on a precession circle centered on said axis of rotation, the precession circle having a precession radius $r_p$ given by the following formula:

$$r_P = \left(\frac{BFG}{\cos\beta} - z\right)\tan\beta,$$

z being the distance to the material surface.

7. The method according to claim 2 wherein each pulse has an ablated crater radius $r_c$ given by the following formula:

$$r_c = w_0 \sqrt{\ln\left(\frac{F_0}{F_{th}}\right)},$$

$w_0$ being the radius of the laser beam at the focal point.

8. The method according to claim 1 wherein the machining result sought is a two-dimensionally defined machining result sought profile according to:
an axis y representing a direction substantially parallel to the surface of the material to be machined, and,
an axis z representing a direction substantially perpendicular to the surface of the material to be machined, the axis z corresponding to an ablation depth $z_n$ in relation to the surface of the material.

9. The method according to claim 2 wherein two successive pulses n of the rotating machining beam are separated by a distance dx and wherein each pulse produces an ablation depth $z_n$ given by the following formula:

$$z_n = -\delta\left[\ln\left(\frac{F_0}{F_{th}(n+NR/2)}\right) - 2\frac{n^2 dx^2}{w^2} - 2\left(\frac{(y+y_c)^2}{w^2}\right)^p\right],$$

where δ is the depth of penetration of the radiation into the material, $F_0$ is the maximum fluence, $F_{th}$ is the ablation threshold, NR is the total number of pulses during one revolution, w is the radius of the Gaussian beam and p is the Gaussian order, y and $y_c$ a dimension parallel to the surface of the material to be machined.

10. The method according to claim 9 wherein the delta δ is a constant parameter.

11. The method according to claim 1 further comprising:
said central unit determining a difference obtained between information in relation to the material to be machined according to said variation of laser machining parameters;
wherein the machine learning of the learning machining function is performed for a material to be machined according to a variation of the laser machining parameters from known laser machining parameters and when the difference enables an improvement of said learning machining function, in particular the variation of the machining parameters is indicated by a predefined test.

12. The method according to claim 1 wherein the algorithm of the learning function is capable of determining laser machining parameters for feeding the learning database so as to allow a learning of the learning machining function and wherein the method further comprises the following additional steps:
m) irradiating said material to be machined with said light beam with laser machining parameters defined by the learning function according to a range of predefined laser machining parameters;
n) acquiring by the optical detection unit a result generated by irradiating said material to be machined with said light beam;
o) transmitting said result to the central unit and accessing said result generated by irradiating said material to be machined with said light beam;
p) extracting from said result by the central unit a pair of machining data comprising machining results obtained as a function of the laser machining parameters used in the step m);
q) storing said pair of machining data in said learning database.

13. A laser machining device comprising a laser source for emitting an ultra-short laser beam, less than 100 ps, onto material to be machined, a control unit for controlling the emission of said laser beam from said laser source, and a central unit capable of performing steps comprising:
a) defining at said central unit a machining result sought of a material to be machined;
b) providing said central unit with a learning machining function capable of learning on the basis of a plurality of pairs of machining data samples, said learning machining function comprising an unsupervised learning algorithm, a supervised learning algorithm, a semi-supervised learning algorithm, or a reinforcement learning algorithm, wherein the learning machining function is capable of defining for said machining result sought the following laser machining parameters:
information regarding a polarization of a machining laser beam,
a pulse energy of said machining laser beam $E_p$,
a diameter of said machining laser beam at the focal point w,
an order of the Gaussian p of said machining laser beam between 1 and 20,
a pulse repetition rate PRR of pulses n of the machining laser beam,
a wavelength of the machining laser beam;
c) making said learning machining function with said central unit to learn on the basis of said plurality of pairs of machining data samples, so that said laser machining device can machine said material to be machined according to the machining result sought, by providing it with the machining parameters determined by said learning machining function, d) machining said material with said laser source configured with said laser machining parameters determined by said learning machining function in step c);

e) acquiring machining results with an analysis unit after the step d), the machining result comprising the redeposition of material at the edges of the ablation and roughness;

f) communicating a machining data pair comprising machining results obtained according to the laser machining parameters used;

g) enriching a learning database with said machining data pair.

14. The device according to claim 13 further comprising an optical unit for directing said laser beam towards said material to be machined.

15. The device according to claim 14 wherein said optical unit for directing said laser beam towards said material to be machined allows precession of said laser beam.

16. A non-transitory computer-readable medium on which a computer program is recorded, the computer program comprising instructions configured to cause a system to determine laser machining parameters for machining of a material with a laser machining system by performing the following steps:

a) providing a learning database comprising a plurality of pairs of machining data samples comprising machining results obtained as a function of the laser machining parameters used;

b) providing a central unit;

c) defining at said central unit a machining result sought of a material to be machined;

d) providing said central unit with a learning machining function capable of learning on the basis of said plurality of pairs of machining data samples, said learning machining function comprising an unsupervised learning algorithm, a supervised learning algorithm, a semi-supervised learning algorithm, or a reinforcement learning algorithm, wherein the learning machining function is capable of defining for said machining result sought and for said machining system the following laser machining parameters:

information regarding a polarization of said machining laser beam, a pulse energy of said machining laser beam $E_p$, a diameter of said machining laser beam at the focal point w, an order of the Gaussian p of said machining laser beam between 1 and 20, a pulse repetition rate PRR of pulses n of the machining laser beam, a wavelength of the machining laser beam;

e) making said learning machining function with said central unit to learn on the basis of said plurality of pairs of machining data samples, so that said laser machining system can machine said material to be machined according to the machining result sought, by providing it with the machining parameters determined by said learning machining function when learning it, f) providing a laser machining system comprising:
said material to be machined;
said laser machining device comprising:
a laser source for emitting an ultra-short laser beam, less than 100 ps, onto said material to be machined;
a control unit for controlling the emission of said laser beam from said laser source;
a unit for analyzing the state of said material to be machined connected to said learning database;
said central unit for controlling said control unit;
said database;

g) machining said material with said laser source configured with said laser machining parameters determined by said learning machining function in step e);

h) acquiring machining results with said analysis unit after the step g) the machining result comprising the redeposition of material at the edges of the ablation and roughness;

i) transmitting said machining results and said machining parameters used in machining in the step g) to said central unit, said central unit being configured to communicate a machining data pair comprising machining results obtained according to the laser machining parameters used;

j) enriching said learning database with said machining data pair.

* * * * *